(12) United States Patent
Endo et al.

(10) Patent No.: US 10,573,621 B2
(45) Date of Patent: Feb. 25, 2020

(54) IMAGING SYSTEM AND MANUFACTURING APPARATUS

(71) Applicant: Semiconductor Energy Laboratory Co., Ltd., Atsugi-shi, Kanagawa-ken (JP)

(72) Inventors: Akio Endo, Atsugi (JP); Yusuke Yoshitani, Isehara (JP); Jun Koyama, Sagamihara (JP); Naoto Kusumoto, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 240 days.

(21) Appl. No.: 15/434,489

(22) Filed: Feb. 16, 2017

(65) Prior Publication Data
US 2017/0250156 A1 Aug. 31, 2017

(30) Foreign Application Priority Data
Feb. 25, 2016 (JP) .................. 2016-034259

(51) Int. Cl.
*H01L 23/00* (2006.01)
*B23K 20/02* (2006.01)
(Continued)

(52) U.S. Cl.
CPC .......... *H01L 24/75* (2013.01); *B23K 20/023* (2013.01); *B23K 20/26* (2013.01); *H01L 27/1469* (2013.01); *H01L 27/14616* (2013.01); *H01L 27/14634* (2013.01); *H01L 27/14678* (2013.01); *H04N 5/2252* (2013.01); *H04N 5/2256* (2013.01); *H04N 5/378* (2013.01);
(Continued)

(58) Field of Classification Search
None
See application file for complete search history.

(56) References Cited

U.S. PATENT DOCUMENTS 6,243,440 B1 6/2001 Oikawa et al.
7,674,650 B2 3/2010 Akimoto et al.
(Continued)

FOREIGN PATENT DOCUMENTS

JP 11-311673 A 11/1999
JP 2007-096055 A 4/2007
(Continued)

*Primary Examiner* — Long Pham
(74) *Attorney, Agent, or Firm* — Robinson Intellectual Property Law Office; Eric J. Robinson

(57) ABSTRACT

An imaging system using ultraviolet light or a manufacturing apparatus including the imaging system is provided. An imaging system includes an imaging element and a light source, which operates the imaging element with light that is emitted from the light source and reflected or transmitted by an object. A pixel included in the imaging element includes a photoelectric conversion element and a charge holding part. The light source has a function of emitting ultraviolet light to an object. The photoelectric conversion element is irradiated with the ultraviolet light reflected or transmitted by the object. The photoelectric conversion element has a function of changing the potential of the charge holding part when irradiated with the ultraviolet light and retaining the potential when not irradiated with the ultraviolet light.

13 Claims, 38 Drawing Sheets

(51) Int. Cl.
    *B23K 20/26*     (2006.01)
    *H01L 27/146*     (2006.01)
    *H04N 5/225*     (2006.01)
    *H04N 5/378*     (2011.01)
    *H01L 27/12*     (2006.01)
    *H01L 29/786*     (2006.01)

(52) U.S. Cl.
    CPC ...... *H01L 27/1225* (2013.01); *H01L 29/7869* (2013.01); *H01L 2224/75301* (2013.01); *H01L 2224/75702* (2013.01); *H01L 2224/75753* (2013.01)

(56) References Cited

U.S. PATENT DOCUMENTS

| | | | |
|---|---|---|---|
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 8,378,391 B2 | 2/2013 | Koyama et al. | |
| 8,466,463 B2 | 6/2013 | Akimoto et al. | |
| 8,629,069 B2 | 1/2014 | Akimoto et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 8,916,869 B2 | 12/2014 | Koyama et al. | |
| 9,099,562 B2 | 8/2015 | Akimoto et al. | |
| 9,341,722 B2 | 5/2016 | Yamazaki et al. | |
| 9,331,112 B2 | 8/2016 | Koyama et al. | |
| 2005/0191100 A1* | 9/2005 | Ooshima ............ | H04N 1/00681 399/370 |
| 2008/0308805 A1 | 12/2008 | Akimoto et al. | |
| 2011/0104851 A1 | 5/2011 | Akimoto et al. | |
| 2011/0121290 A1 | 5/2011 | Akimoto et al. | |
| 2012/0154337 A1 | 6/2012 | Kurokawa et al. | |
| 2015/0340513 A1 | 11/2015 | Akimoto et al. | |
| 2016/0233252 A1 | 8/2016 | Koyama et al. | |

FOREIGN PATENT DOCUMENTS

| | | |
|---|---|---|
| JP | 2007-123861 A | 5/2007 |
| JP | 2011-119711 A | 6/2011 |
| JP | 2012-256020 A | 12/2012 |

\* cited by examiner

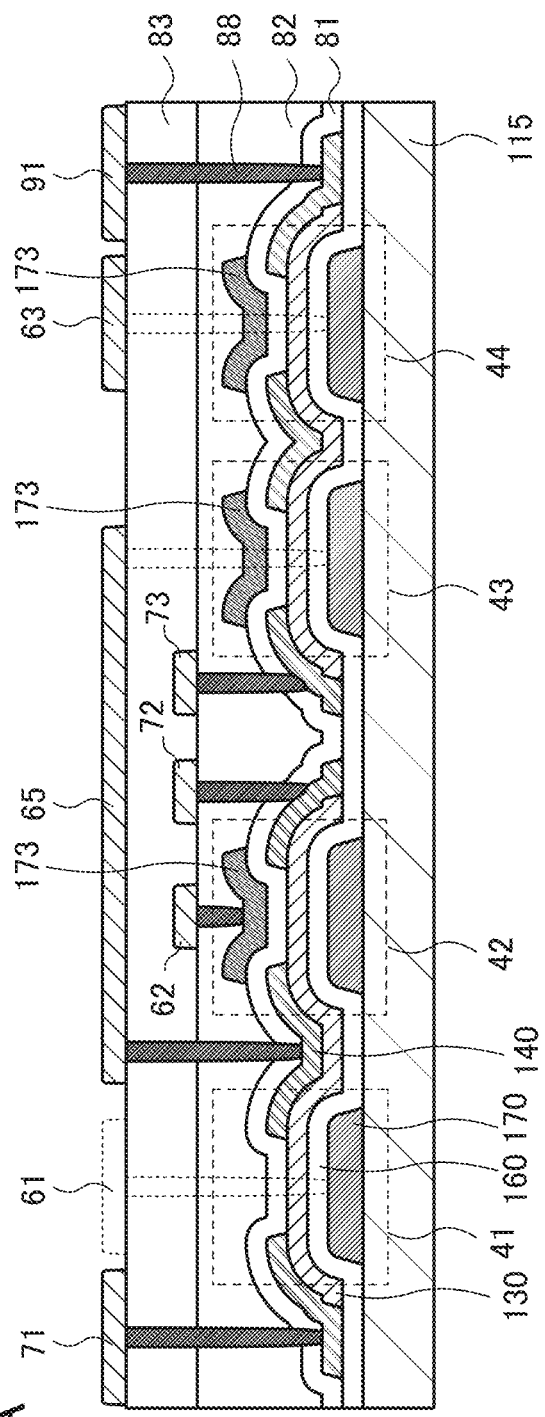
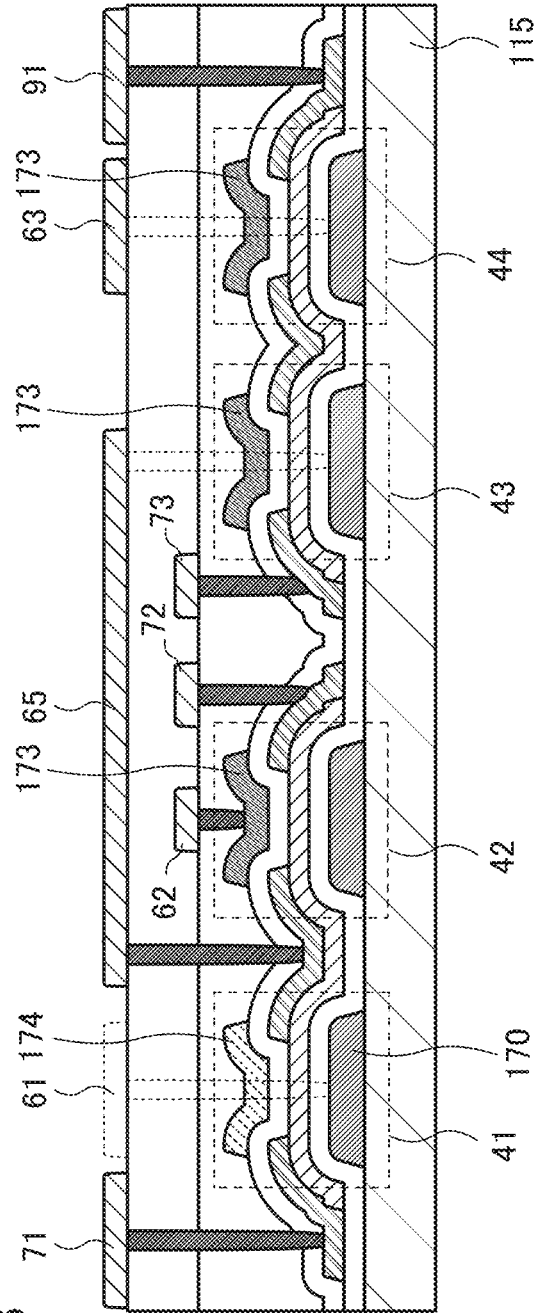
FIG. 12A
FIG. 12B

FIG. 16A
FIG. 16B
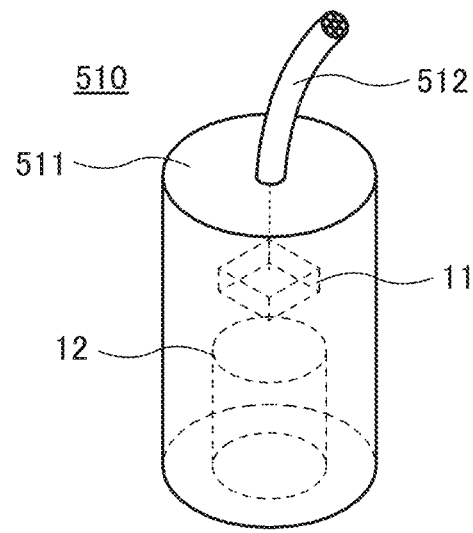
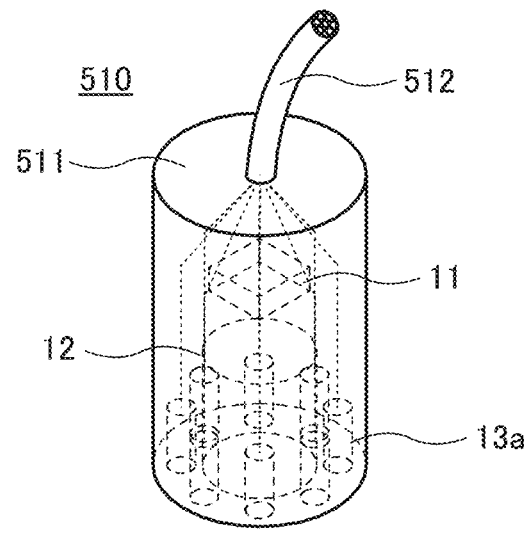
FIG. 16C
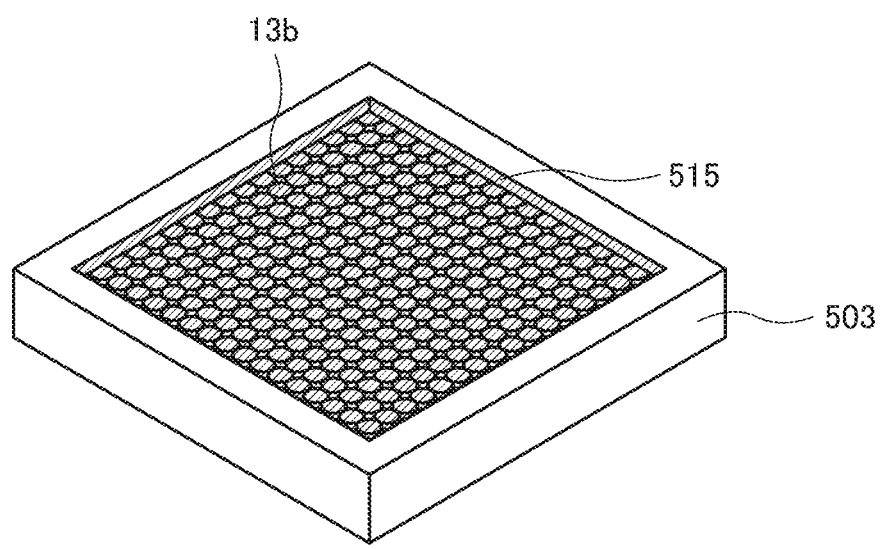

FIG. 34A
FIG. 34B
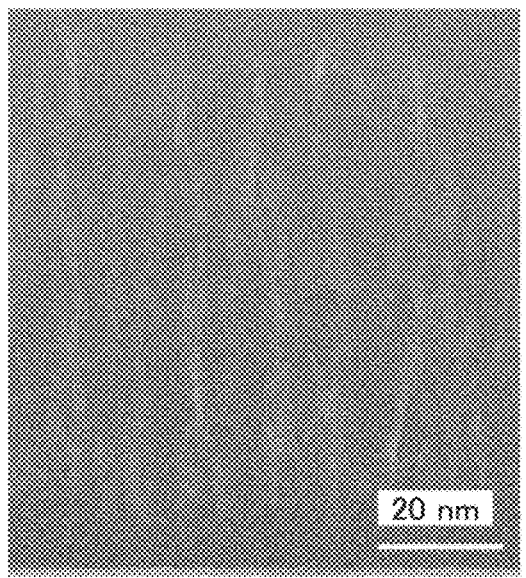
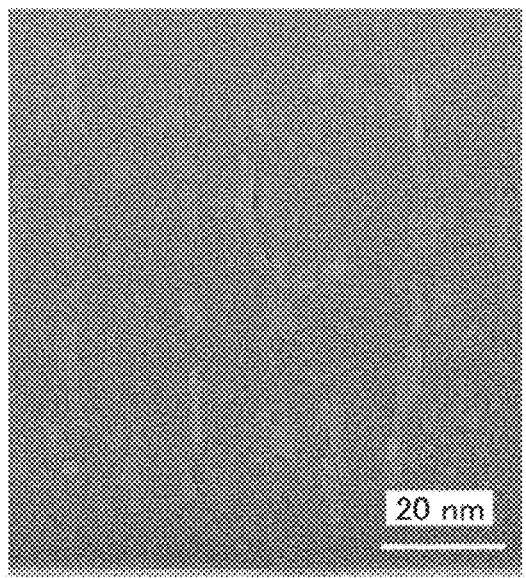

IMAGING SYSTEM AND MANUFACTURING APPARATUS

BACKGROUND OF THE INVENTION

1. Field of the Invention

One embodiment of the present invention relates to an imaging system.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a manufacturing apparatus, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, an electronic device, or a manufacturing apparatus includes a semiconductor device.

2. Description of the Related Art

An oxide semiconductor has attracted attention as a semiconductor material applicable to the transistor. For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor including an oxide semiconductor is used in part of a pixel circuit.

Patent Document 4 discloses that a transistor including an oxide semiconductor has extremely low off-state current characteristics even at high temperatures.

REFERENCE

Patent Document 1: Japanese Published Patent Application No. 2007-123861
Patent Document 2: Japanese Published Patent Application No. 2007-096055
Patent Document 3: Japanese Published Patent Application No. 2011-119711
Patent Document 4: Japanese Published Patent Application No. 2012-256020

SUMMARY OF THE INVENTION

An imaging device is provided in various manufacturing apparatuses and required to operate under severe environments such as high temperatures depending on the purpose. The electric characteristics of a transistor including silicon are easily changed depending on the temperature. Thus, when an imaging device including such a transistor is used at high temperatures, it is necessary to provide a cooling mechanism in the imaging device or a certain distance between a high-temperature region and the imaging device.

In order to solve this problem, an imaging method which is stable even at high temperatures and an inexpensive system capable of executing the imaging method are desired.

An object of one embodiment of the present invention is to provide an imaging system which operates stably at high temperatures. Another object is to provide an imaging system capable of detecting ultraviolet light. Another object is to provide an imaging system which controls its operation with ultraviolet light. Another object is to provide an imaging system with high reliability. Another object is to provide a novel imaging system or the like.

Another object is to provide a manufacturing apparatus capable of observing a local high-temperature region easily. Another object is to provide a manufacturing apparatus with high throughput. Another object is to provide a manufacturing apparatus which can control alignment easily. Another object is to provide a novel manufacturing apparatus or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging system using ultraviolet light or a manufacturing apparatus including the imaging system.

One embodiment of the present invention is an imaging system including an imaging element and a light source. The imaging element includes a pixel including a photoelectric conversion element and a charge holding part. The light source has a function of emitting ultraviolet light to an object. The photoelectric conversion element is irradiated with the ultraviolet light reflected or transmitted by the object. The photoelectric conversion element has a function of changing a potential of the charge holding part when irradiated with the ultraviolet light and a function of retaining the potential when not irradiated with the ultraviolet light.

The pixel can include a first transistor, a second transistor, a third transistor, and a fourth transistor. The first transistor can function as a photoelectric conversion element. One of a source and a drain of the first transistor can be electrically connected to one of a source and a drain of the second transistor and a gate of the third transistor. One of a source and a drain of the third transistor can be electrically connected to one of a source and a drain of the fourth transistor.

The first to fourth transistors each include an oxide semiconductor. The oxide semiconductor preferably includes In, Zn, and M (M is Al, Ga, Y, or Sn).

Another embodiment of the present invention is a manufacturing apparatus including the above imaging system, a stage movable in the X-axis direction, the Y-axis direction, and the θ-axis direction, and a thermocompression head movable in the Z-axis direction.

The imaging element and the light source may be stored in a housing and the housing may be fixed to the thermocompression head.

Alternatively, the imaging element may be stored in a housing, the light source may be stored in a stage, and the housing may be fixed to the thermocompression head.

One embodiment of the present invention can provide an imaging system which operates stably at high temperatures. An imaging system capable of detecting ultraviolet light can be provided. An imaging system which controls its operation with ultraviolet light can be provided. An imaging system with high reliability can be provided. A novel imaging system or the like can be provided.

A manufacturing apparatus capable of observing a local high-temperature region easily can be provided. A manufacturing apparatus with high throughput can be provided. A manufacturing apparatus which can control alignment easily can be provided. A novel manufacturing apparatus or the like can be provided.

Note that one embodiment of the present invention is not limited to these effects. For example, depending on circumstances or conditions, one embodiment of the present invention might have another effect. Furthermore, depending on circumstances or conditions, one embodiment of the present invention might not have any of the above effects.

BRIEF DESCRIPTION OF THE DRAWINGS

In the accompanying drawings:

FIGS. 12A and 12B are cross-sectional views each illustrating a structure of an imaging device;

FIGS. 16A to 16C illustrate cameras and a light source;

FIGS. 34A and 34B are cross-sectional TEM images of an a-like OS;

DETAILED DESCRIPTION OF THE INVENTION

Figure 1:
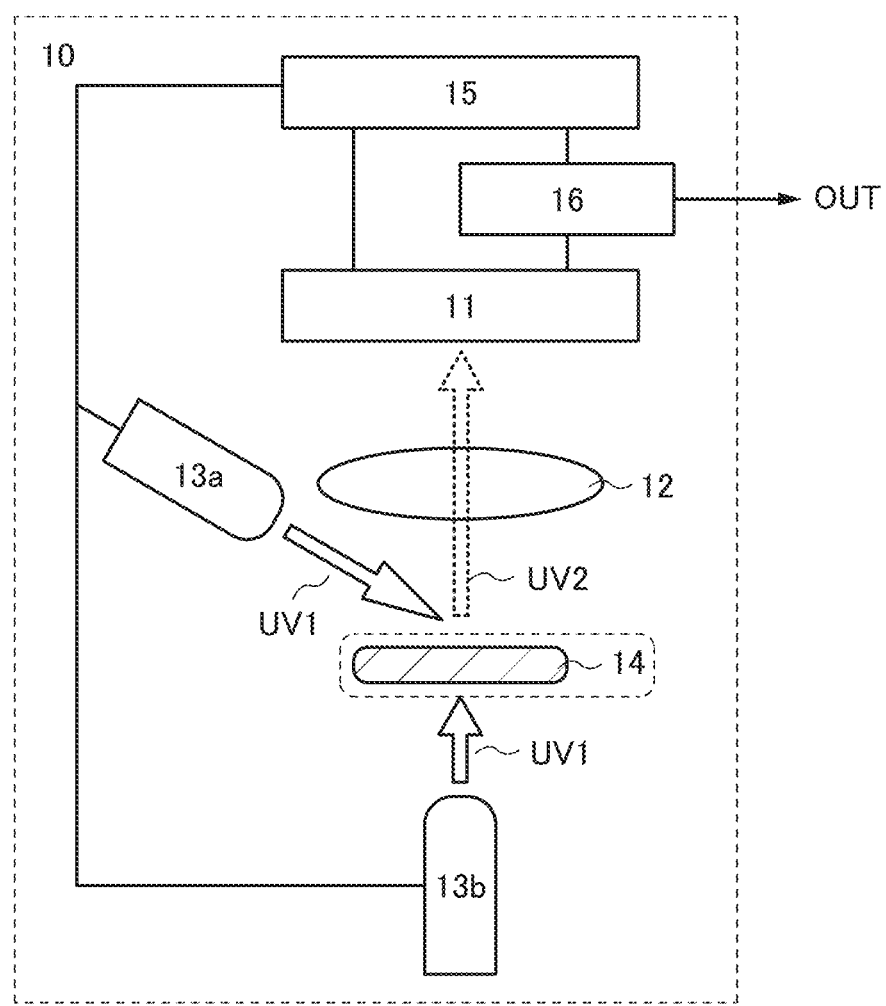
FIG. 1 is a block diagram illustrating an imaging system.

Embodiments will be described in detail with reference to the drawings. Note that the present invention is not limited to the following description. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

Examples of the case where X and Y are electrically connected include the case where one or more elements that allow an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

Examples of the case where X and Y are functionally connected include the case where one or more circuits that allow functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up converter, or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expression include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X through at least a first connection path on which Z1 is provided, the first connection path does not include a second connection path, the second connection path includes a connection path on which the transistor is provided, a drain (or a second terminal or the like) of the transistor is electrically connected to Y through at least a third connection path on which Z2 is provided, and the third connection path does not include the second connection path". Another examples of the expression include "a source (or a first terminal or the like) of a transistor is electrically connected to X through at least a first connection path on which Z1 is provided, the first connection path does not include a second connection path, the second connection path is a path between the source (or the first terminal or the like) and a drain (or a second terminal or the like) of the transistor, the drain (or the second terminal or the like) of the transistor is electrically connected to Y through at least a third connection path on which Z2 is provided, the third connection path does not include a fourth connection path, and the fourth connection path is a path between the drain (or a second terminal or the like) and the source (or the first terminal or the like) of the transistor. When the connection order in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in general, a potential (a voltage) is relative and is determined depending on the amount relative to a reference potential. Therefore, even when the expression "ground", "GND", or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Embodiment 1

In this embodiment, an imaging system that is one embodiment of the present invention will be described with reference to drawings.

One embodiment of the present invention is an imaging system including an imaging element and a light source, which operates the imaging element with light that is emitted from the light source and reflected or transmitted by an object.

The imaging element includes a photoelectric conversion element having sensitivity to ultraviolet light. A transistor using an oxide semiconductor in its active layer (hereinafter referred to as an OS transistor) can be used as a transistor included in the photoelectric conversion element and a pixel of the imaging element. The electrical characteristics of an OS transistor are thermally stable, so that imaging at high temperatures is easy.

When an OS transistor is used as a photoelectric conversion element, an additional photoelectric conversion element such as a photodiode is unnecessary; therefore, manufacturing cost of the imaging element can be reduced.

In addition, since a photoelectric conversion element using an OS transistor can control electric conduction by ultraviolet light irradiation, switching transistors in a pixel circuit can be eliminated. Thus, the pixel size can be easily reduced and the pixel density can be increased. Alternatively, the size (or number) of OS transistors used as photoelectric conversion elements can be increased so that the light sensitivity may be improved.

The transistor including an oxide semiconductor in a semiconductor layer has a low off-state current and therefore facilitates construction of a memory for retaining data in the pixel of an imaging element.

FIG. 1 is a schematic view illustrating a structure of an imaging system 10 of one embodiment of the present invention. The imaging system 10 includes an imaging element 11, an optical system 12, a light source 13a, a light source 13b, a circuit 15 which performs control of the imaging system 10 and the like, and a circuit 16 which converts analog data output from the imaging element 11 into digital data. Whether an object 14 is included as a component of the imaging system 10 may be determined arbitrarily.

The imaging system 10 may include one or both of the light sources 13a and 13b.

The light source 13a is provided so as to emit light to a top surface of the object 14.

The light source 13b is provided so as to emit light to a bottom surface of the object 14. The light source 13b can be used when the object 14 transmits light emitted from the light source.

The light sources 13a and 13b preferably emit light with a wavelength shorter than 450 nm, further preferably shorter than 400 nm, still further preferably shorter than 380 nm and longer than or equal to 200 nm. That is, light emitted from the light sources 13a and 13b is preferably ultraviolet light. Note that, in FIG. 1, ultraviolet light emitted from the light source 13a or the light source 13b to the object is UV1.

Specifically, a UV lamp, a black light, an LED, a laser, or the like can be used as the light sources 13a and 13b. Note that the light sources 13a and 13b need to be turned on and off repeatedly at high speed in order to operate the imaging element, so that an LED which is highly reactive and inexpensive is preferably used.

The optical system 12 has one or a plurality of lenses and has a function of forming an image of the object on a light-receiving portion of the imaging element 11. Since light with a short wavelength such as ultraviolet light is used, as described above, a material having high light transmittance of light with a short wavelength is preferably used as a lens. For example, quartz or fluorite (calcium fluoride) is preferably used as the material. Note that, in FIG. 1, ultraviolet light reflected or transmitted by the object and enters the optical system 12 and the imaging element 11 is UV2.

The imaging element 11 can include a pixel, a circuit for driving the pixel, or the like.

The circuit 15 controls the imaging element 11 and the light sources 13a and 13b. When the circuit 15 controls the timing of light emission from the light sources 13a and 13b, the imaging element 11 can perform an operation for acquiring image data.

The circuit 16 can include an A/D converter or the like and a circuit included in the A/D converter is preferably formed using a transistor including silicon in a channel formation region (hereinafter referred to as a Si transistor). Note that the circuit 16 is preferably provided apart from the imaging element 11 when an operation at high temperatures is expected.

Figure 2A:
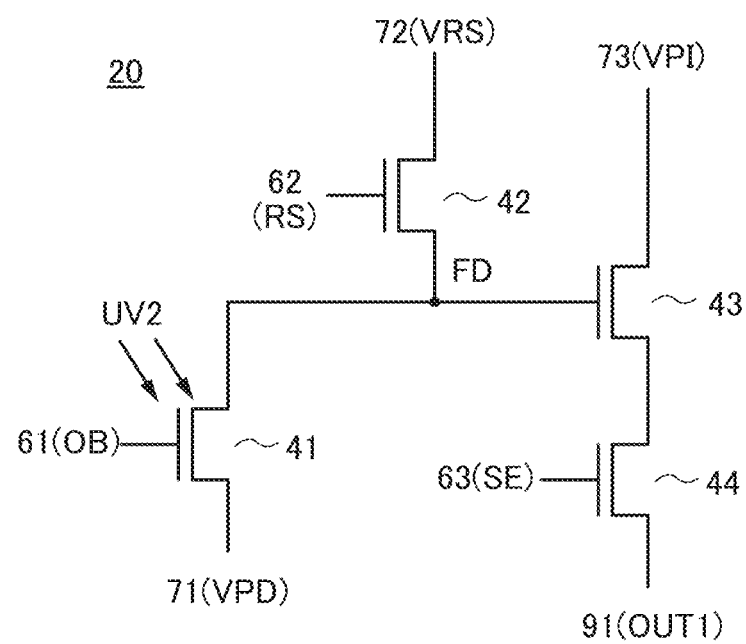
FIGS. 2A and 2B are a circuit diagram illustrating a pixel and a timing chart showing the operation of the pixel.

FIG. 2A is an example of a circuit diagram of a pixel 20 included in the imaging element 11. Note that an example in which transistors are n-channel transistors is illustrated in FIG. 2A or the like; however, one embodiment of the present invention is not limited to this, and some transistors may be replaced with p-channel transistors.

The pixel 20 includes transistors 41 to 44. One of a source and a drain of the transistor 41 is electrically connected to one of a source and a drain of a transistor 42. One of the source and the drain of the transistor 41 is electrically connected to a gate of a transistor 43. One of a source and a drain of the transistor 43 is electrically connected to one of a source and a drain of a transistor 44.

Figure 3A:
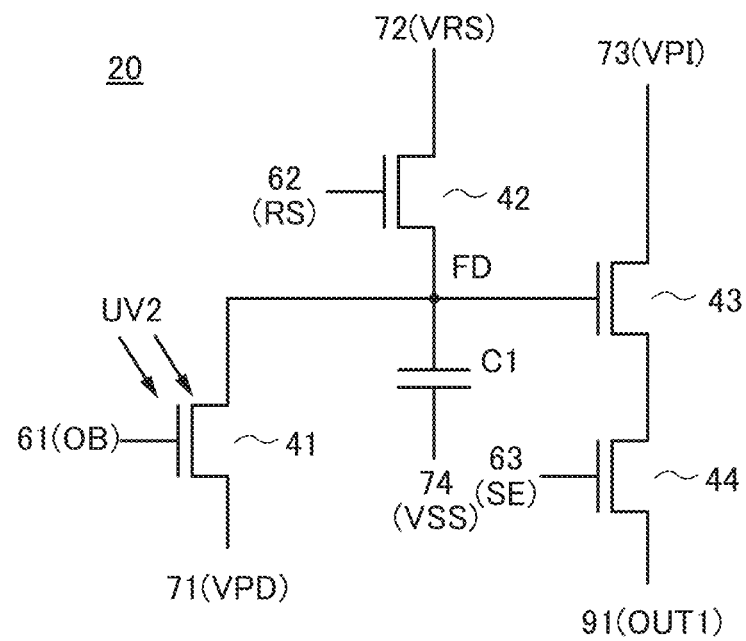
FIGS. 3A and 3B are circuit diagrams each illustrating a pixel.

Here, a node FD to which one of the source and the drain of the transistor 41, one of the source and the drain of the transistor 42, and the gate of the transistor 43 are connected is a charge holding part. Note that, as illustrated in FIG. 3A, a capacitor C1 may be connected between the node FD and a wiring 74 (e.g., VSS).

In FIG. 2A, the other of the source and the drain of the transistor 41 is electrically connected to a wiring 71 (VPD). The other of the source and the drain of the transistor 42 is electrically connected to a wiring 72 (VRS). The other of the source and the drain of the transistor 43 is electrically connected to a wiring 73 (VPI). The other of the source and the drain of the transistor 44 is electrically connected to a wiring 91 (OUT1).

Note that connection between a transistor and a wiring in FIG. 2A is an example. Transistors might be electrically connected to different wirings, or a plurality of transistors might be electrically connected to the same wiring.

The wiring 71 (VPD), the wiring 72 (VRS), and the wiring 73 (VPI) can function as power supply lines. For example, the wiring 71 (VPD) can function as a low potential power supply line. The wiring 72 (VRS) and the wiring 73 (VPI) can function as high potential power supply lines. Alternatively, the wiring 71 (VPD) may function as a high potential power supply line and the wiring 72 (VRS) may function as a low potential power supply line.

A gate of the transistor 41 is electrically connected to a wiring 61 (OB). A gate of the transistor 42 is electrically connected to a wiring 62 (RS). A gate of the transistor 44 is electrically connected to a wiring 63 (SE).

Figure 3B:
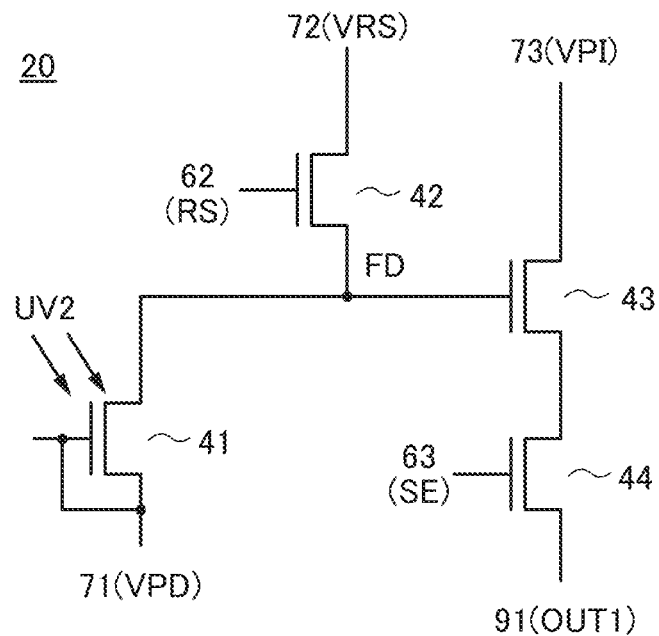

The wiring 61 (OB), the wiring 62 (RS), and the wiring 63 (SE) can function as signal lines for controlling the conduction states of the transistors to which the respective wirings are connected. Note that the wiring 61 (OB) supplies a fixed potential at which the transistor 41 is always off. In addition, when the wiring 71 (VPD) is used as a low potential power supply line, the transistor 41 may be diode-connected, that is, the gate of the transistor 41 and the wiring 71 (VPD) may be electrically connected to each other and the wiring 61 (OB) may be omitted as illustrated in FIG. 3B. Note that turning on a transistor means that the resistance between a source and a drain is lowered and the transistor is brought into an on state.

The transistor 41 can function as a photoelectric conversion element. The transistor 42 can have a function of resetting the potential of the node FD. The transistor 43 can have a function of outputting a signal corresponding to the potential of the node FD. The transistor 44 can have a function of selecting the pixel 20.

Note that the above structure of the pixel 20 is just an example, and some of the circuits, some of the transistors, some of the capacitors, some of the wirings, or the like are not included in some cases. Alternatively, a circuit, a transistor, a capacitor, a wiring, or the like that is not included in the above structure might be included. Alternatively, connection of some wirings might be different from the above connection.

In one embodiment of the present invention, an OS transistor is used as a photoelectric conversion element. The OS transistor is thermally stable and a variation in the electrical characteristics thereof is small even at high temperatures. In contrast, a variation in the electrical characteristics of a PN photodiode or the like using silicon is large at high temperatures. In particular, a dark current increases largely; therefore, a PN photodiode or the like using silicon is not suitable for imaging at high temperatures.

Although an OS transistor has an extremely low off-state current (several yoctoamperes per micrometer (channel width): 85° C.), the off-state current changes largely when the OS transistor is irradiated with light with a short wavelength such as ultraviolet light. Note that when the transistors 42 to 44 are also OS transistors, they are preferably shielded from light for suppressing variations in the electric characteristics due to light irradiation.

Figure 38A:
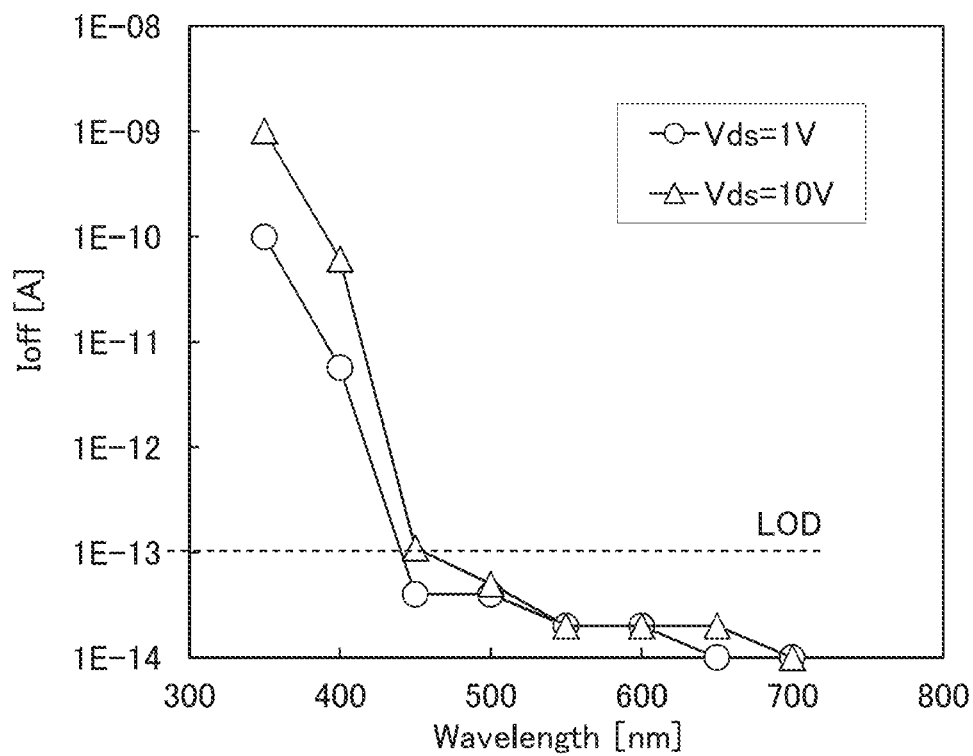
FIGS. 38A and 38B each show off-state current characteristics of transistors when the transistors are irradiated with ultraviolet light.

FIG. 38A is a diagram showing the change in the off-state current (drain current when $V_{gs}$ is −5 V, $V_{ds}$ is 1 V and 10 V) when a channel formation region of a bottom-gate transistor using In—Ga—Zn oxide (L/W=3 μm/50 μm) is irradiated with light under conditions where the light intensity is fixed and the wavelength of the light is changed. Note that the lower measurement limit of a current measurement apparatus is 1E-13 A, and it can be said that an actual current when the bottom-gate transistor using In—Ga—Zn oxide is irradiated with light with a wavelength longer than 450 nm is further small.

Figure 38B:
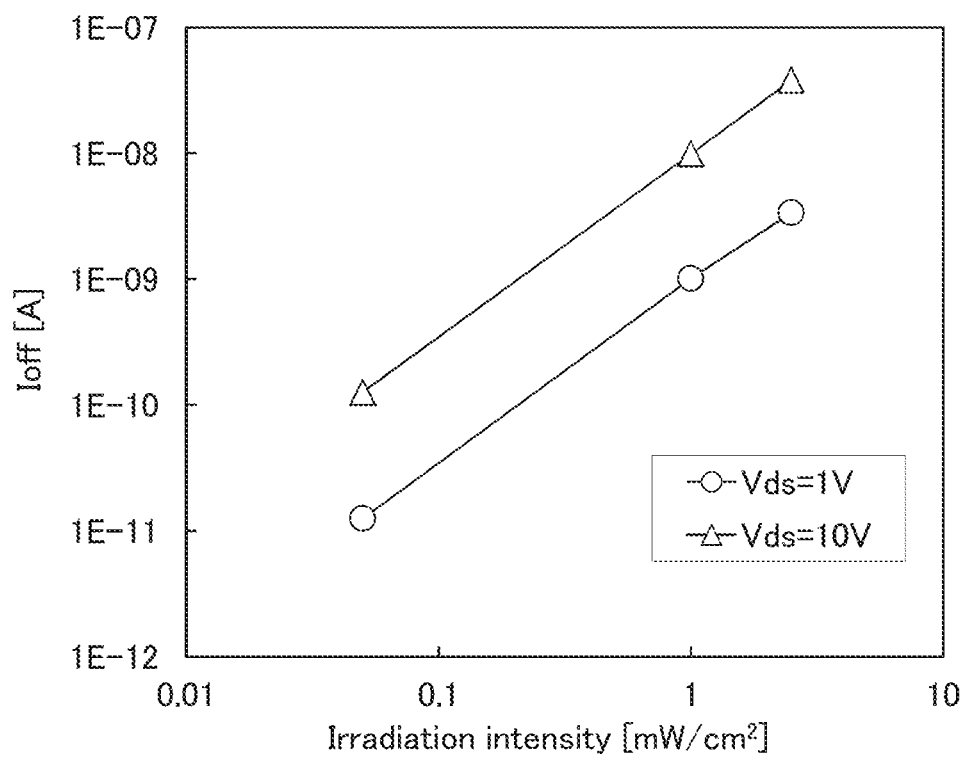

Moreover, FIG. 38B is a diagram showing the change in the off-state current (drain current when $V_{gs}$ is −5 V, $V_{ds}$ is 1 V and 10 V) when a channel formation region of a bottom-gate transistor using In—Ga—Zn oxide (L/W=3 μm/10000 μm) is irradiated with light with a wavelength of 350 nm with varied intensity.

According to FIGS. 38A and 38B, when light irradiation with a wavelength of shorter than 450 nm is performed, the shorter the wavelength is, the larger the off-state current is. Furthermore, when light irradiation with a wavelength of 350 nm is performed, the higher the irradiation intensity of light is, the larger the off-state current is. This shows that the off-state current of an OS transistor has sensitivity to light with a short wavelength such as ultraviolet light. Therefore, an OS transistor can function as a photoelectric conversion element which responds to light with an appropriate wavelength such as ultraviolet light.

In addition, according to FIG. 38A, the OS transistor also serves as a high-functional optical switch because the off-state current of an OS transistor is extremely low when not irradiated with light such as ultraviolet light. In the state where a potential at which the transistor is off is supplied to the gate thereof, the transistor is off when not irradiated with light and the transistor is on when irradiated with light depending on the light intensity.

Although the operation that changes the conduction state by light irradiation is similar to the operation in a photodiode using silicon or the like, the photodiode has a relatively large dark current. Thus, switches such as transistors need to be connected in series for retaining the potential of the node FD. In one embodiment of the present invention, an OS transistor can be used as an element doubling as a photoelectric conversion element and a switch.

Figure 2B:
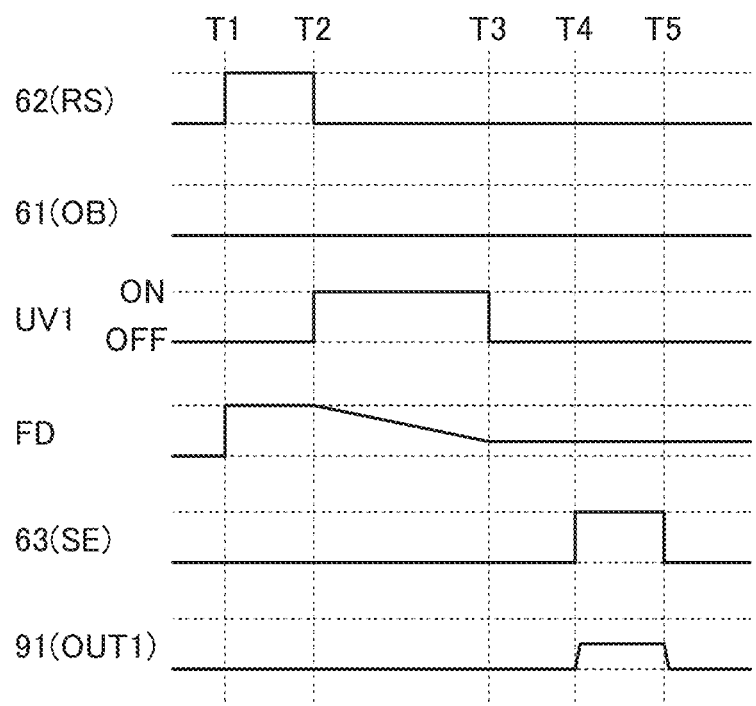

Next, an example of the operating method of the pixel 20 in FIG. 2A will be described with reference to a timing chart of FIG. 2B. Note that, as illustrated in FIG. 1, ultraviolet light emitted from the light source 13a or the light source 13b to an object is the UV1. In addition, ultraviolet light which is reflected or transmitted by the object and enters the optical system 12 and the imaging element 11 is the UV2. Moreover, the wiring 71 (VPD) has a low potential (e.g., VSS). The wiring 72 (VRS) and the wiring 73 (VPI) each have a high potential (e.g., VDD).

Note that the wiring 61 (OB) preferably has a potential that is lower than a source potential (potential of the wiring 71 (VPD)) by approximately 1 V to 2 V in order to make the transistor 41 always off. In the following description, "H" and "L" refer to a high potential and a low potential, respectively.

At Time T1, when the potential of the wiring 62 is "H", the transistor 42 is turned on and the potential of the node FD is "H" (reset operation).

At Time T2, the potential of the wiring 62 is "L" and UV1 irradiation is started, which makes the transistor 41 irradiated with the UV2, so that the off-state current of the transistor 41 increases depending on the irradiation intensity of the UV2. That is, the transistor 41 is turned on and the potential of the node FD starts to decrease (accumulation operation).

At Time T3, UV1 irradiation is stopped, which decreases the off-state current of the transistor 41 instantly, so that the potential of the node FD is retained (retaining operation).

In the period from Time T4 to Time T5, when the potential of the wiring 63 is "H", the transistor 44 is on and image data is output to the wiring 91 (OUT1) depending on the potential of the node FD.

In this manner, imaging operation in the pixel 20 can be performed when part of the switching operation is controlled by light irradiation.

Figure 4A:
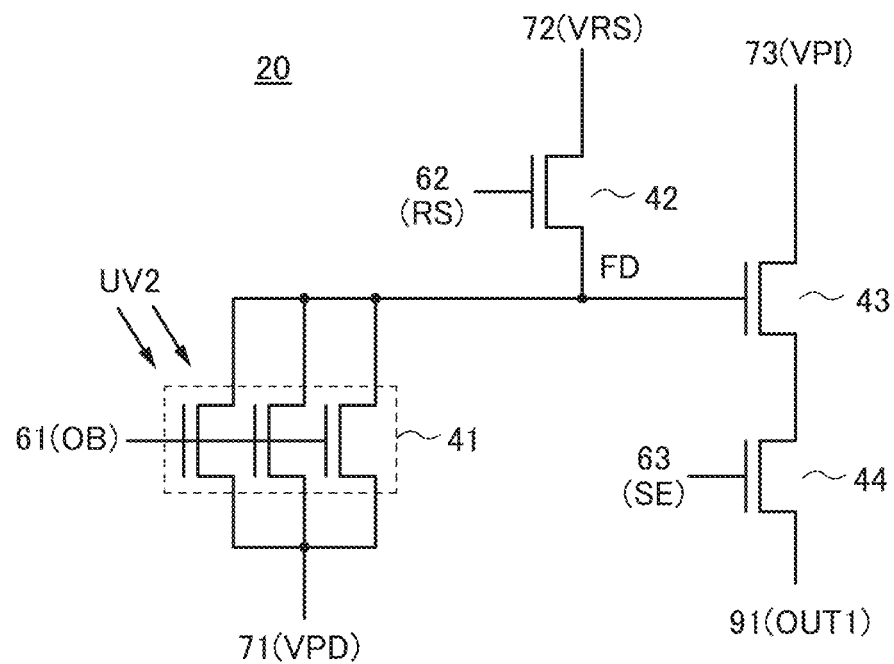
FIGS. 4A and 4B are circuit diagrams each illustrating a pixel.

Note that the channel width of the transistor 41 is preferably larger than that of the transistors 42 to 44. Alternatively, a plurality of transistors may be connected in parallel to form the transistor 41 as illustrated in FIG. 4A. With such a structure, a current value can be increased when light irradiation is performed. Although the transistor 41 is formed of three transistors as an example in FIG. 4A, the number of transistors may be two or four or more.

Figure 4B:
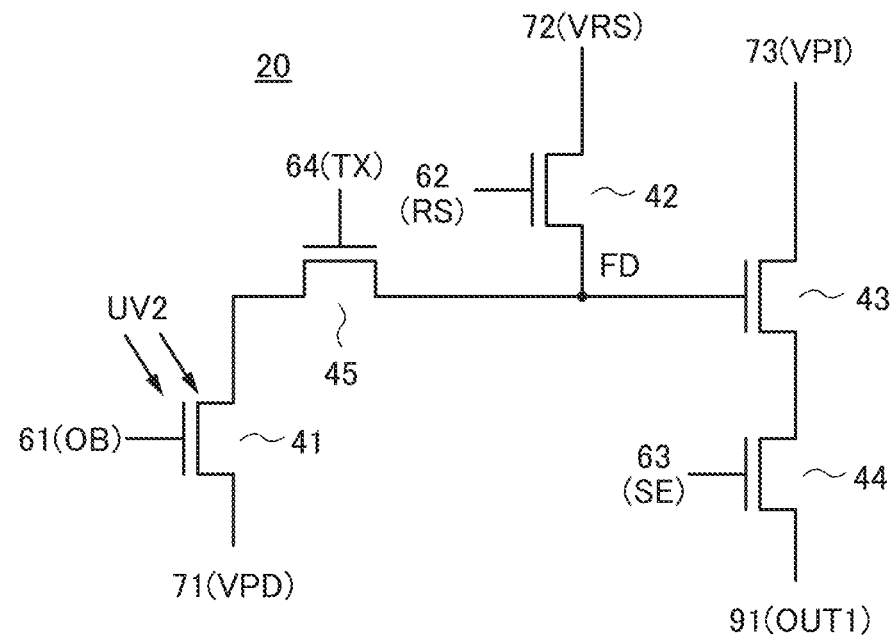

Alternatively, the pixel 20 may include a transistor 45 as illustrated in FIG. 4B. In this case, switching operation for controlling the potential of the node FD is performed by not light irradiation but control of the transistor 45 with the potential of a wiring 64 (TX). Since switching operation is not performed by light irradiation, one or both of the light sources 13a and 13b may be always on.

Figure 5A:
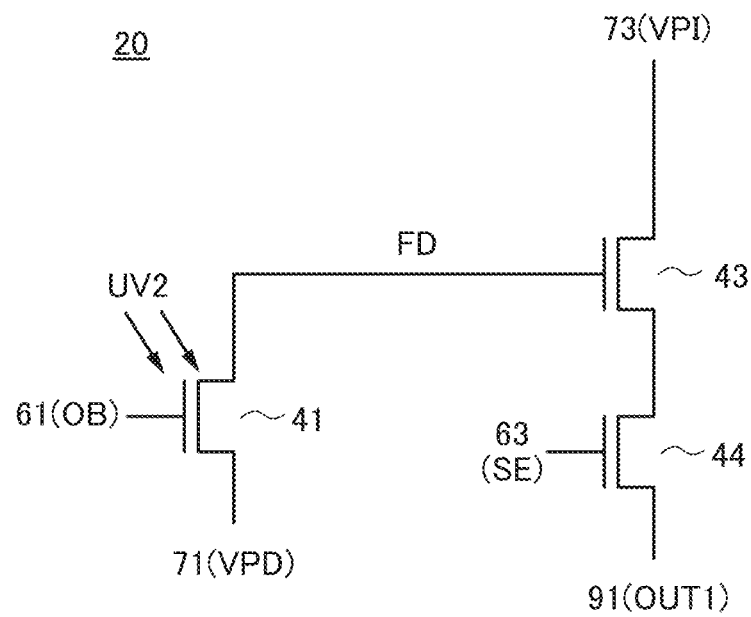
FIGS. 5A and 5B are a circuit diagram illustrating a pixel and a timing chart showing the operation of the pixel.
Figure 5B:
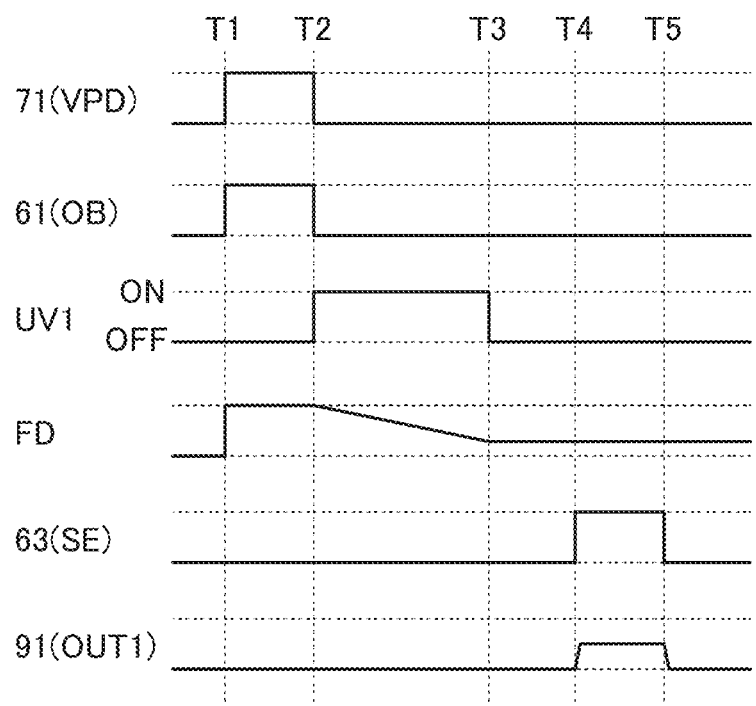

Furthermore, the transistor 42 may be omitted from the pixel 20 as illustrated in FIG. 5A. In this case, a structure in which the potential of the wiring 71 (VPD) and the potential of the wiring 61 (OB) are changeable is used. In FIG. 5B, a timing chart showing the operation of the pixel 20 with such a structure is shown. At Time T1, the potential of the wiring 71 (VPD) and the potential of the wiring 61 (OB) are "H" so that reset operation is performed. Then, at Time T2, the potential of the wiring 71 (VPD) and the potential of the wiring 61 (OB) are "L" and UV1 irradiation is started so that accumulation operation is performed. The description of the timing chart shown in FIG. 2B can be referred to for the following operation. With such a structure, a pixel can be formed of three transistors, two power supply lines, and two signal lines.

Figure 6A:
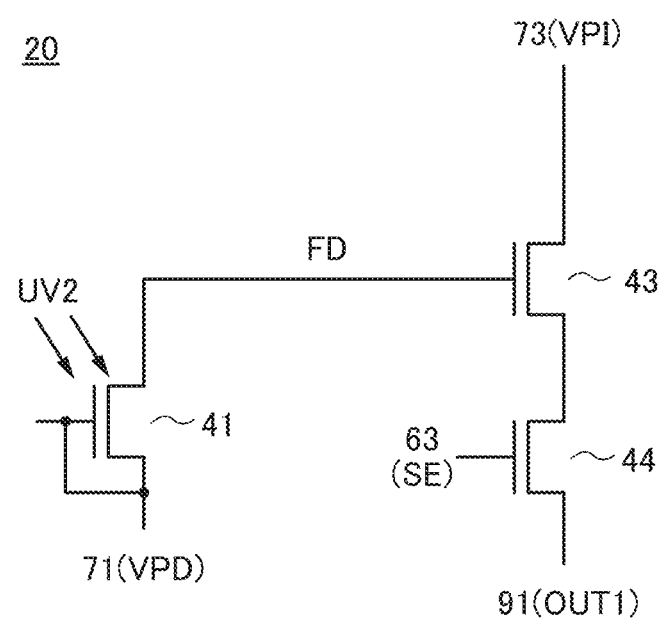
FIGS. 6A and 6B are a circuit diagram illustrating a pixel and a timing chart showing the operation of the pixel.
Figure 6B:
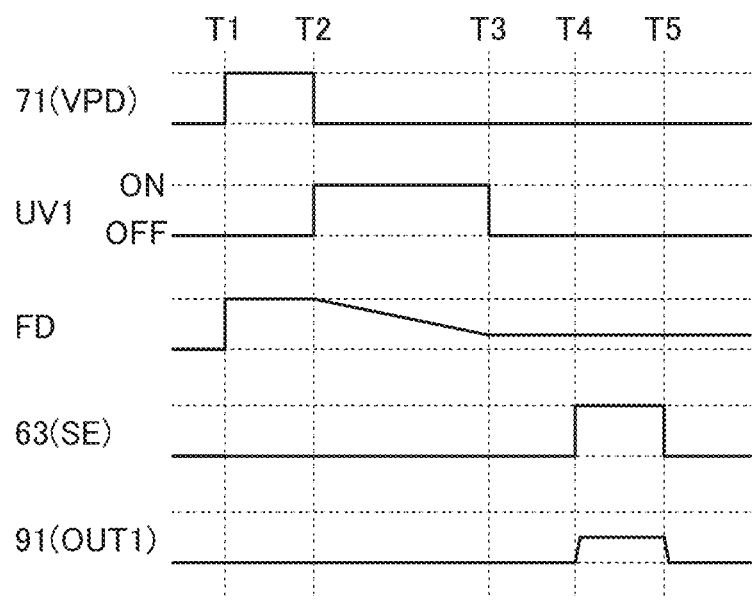

Alternatively, the wiring 61 (OB) can be further omitted from the pixel 20 of the structure in FIG. 5A by making the transistor 41 diode-connected as illustrated in FIG. 6A. In this case, the wiring 71 (VPD) is electrically connected to the gate of the transistor 41 so that control of the wiring 61 (OB) is unnecessary as shown in the timing chart of FIG. 6B. The description of the timing chart shown in FIG. 5B can be referred to for the other operation. With such a structure, a pixel can be formed of three transistors, two power supply lines, and one signal line.

Figure 7A:
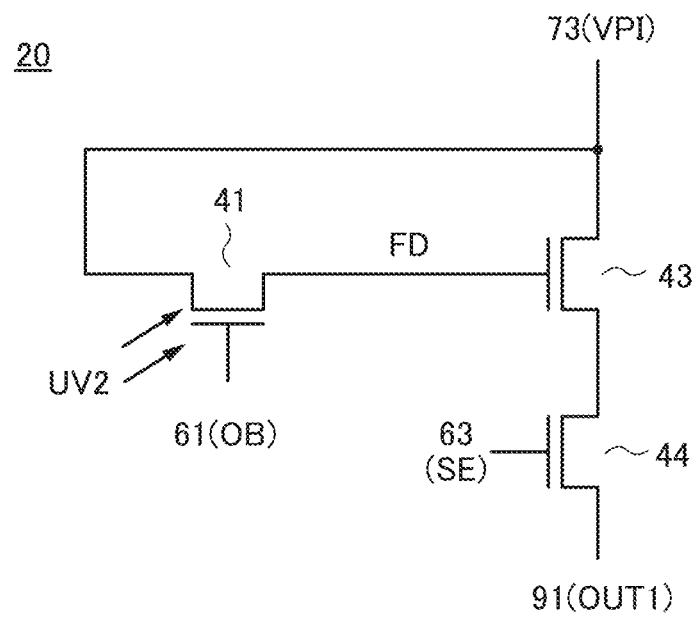
FIGS. 7A and 7B are a circuit diagram illustrating a pixel and a timing chart showing the operation of the pixel.
Figure 7B:
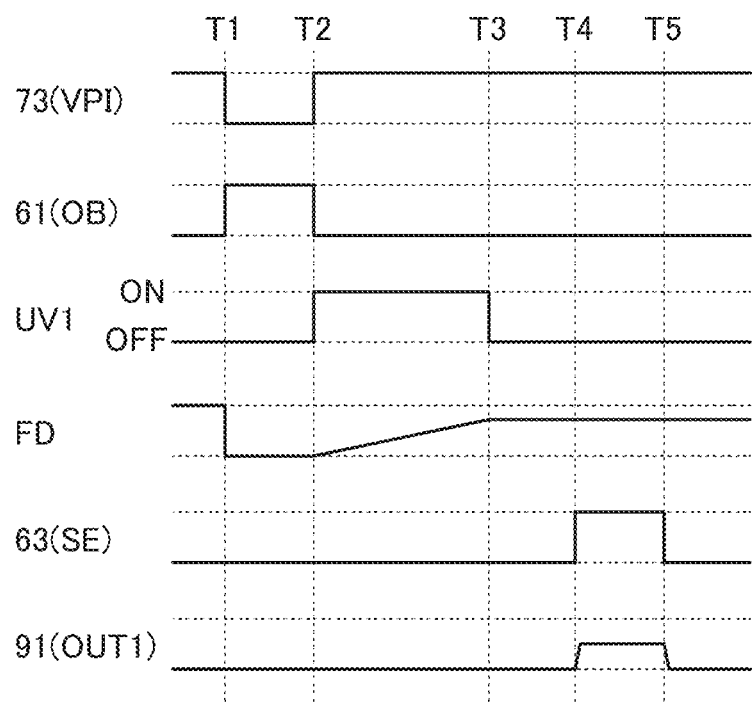

Alternatively, the wiring 71 (VPD) may be omitted from the pixel 20 and the other of the source and the drain of the transistor 41 may be electrically connected to the wiring 73 (VPI) as illustrated in FIG. 7A. In this case, at Time T1, the potential of the wiring 73 (VPI) is "L" and the potential of the wiring 61 (OB) is "H" as shown in a timing chart of FIG. 7B so that the potential of the node FD is reset to "L". Then, at Time T2, the potential of the wiring 73 (VPI) is "H", the potential of the wiring 61 (OB) is "L", and UV1 irradiation is started so that accumulation operation is performed. The description of the timing chart shown in FIG. 2B can be referred to for the following operation. With such a structure, a pixel can be formed of three transistors, one power supply line, and two signal lines.

With the structures of the pixel 20 in FIG. 5A, FIG. 6A, and FIG. 7A, the number of transistors or wirings can be decreased, whereby the pixel density can be easily increased. In addition, the operation of the pixel can be easily controlled.

Figure 8A:
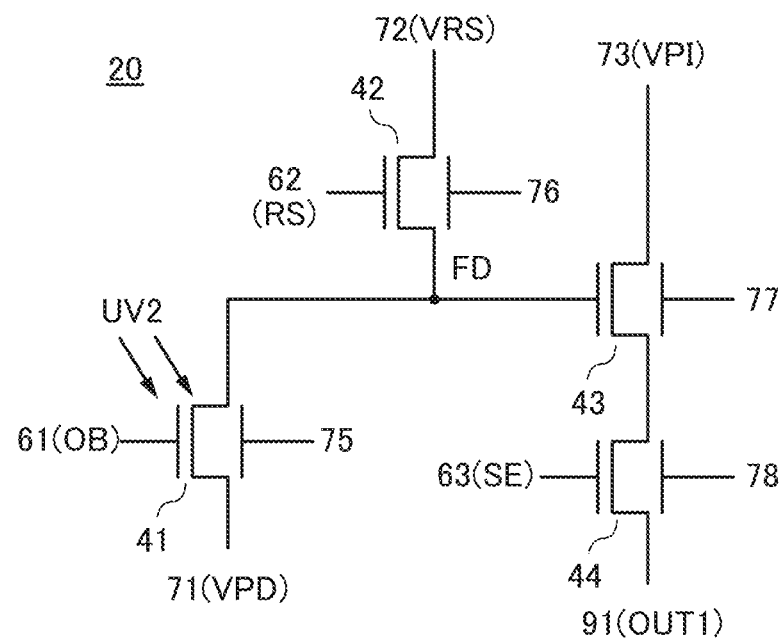
FIGS. 8A and 8B are circuit diagrams each illustrating a pixel.

The transistors 41 to 44 in the pixel 20 may each have a back gate as illustrated in FIG. 8A. FIG. 8A illustrates a structure in which constant potentials are applied to the back gates, which enables control of the threshold voltages. Note that a wiring 77 and a wiring 78 can be electrically connected to each other.

Figure 8B:
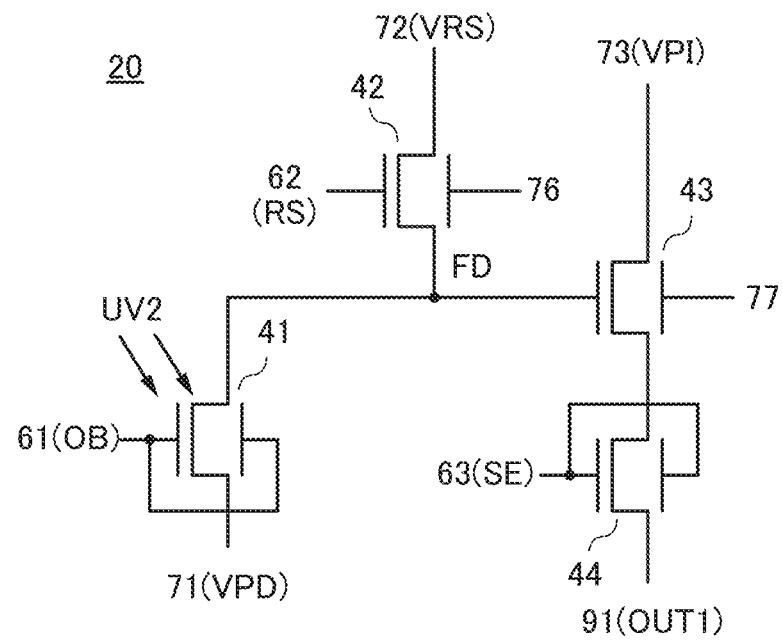

A wiring 75, a wiring 76, the wiring 77, and the wiring 78 connected to the respective back gates can be separately supplied with different potentials. Alternatively, a front gate and a back gate in each of the transistors 41 and 44 may be electrically connected to each other as illustrated in FIG. 8B.

In n-channel transistors, the threshold voltage is shifted in a positive direction when a potential that is lower than a source potential is applied to a back gate. In contrast, the threshold voltage is shifted in a negative direction when a potential that is higher than a source potential is applied to the back gate. Therefore, in the case where on/off of each transistor is controlled by a predetermined gate voltage, the off-state current can be reduced by applying a potential that is lower than the source potential to the back gate. The on-state current can be increased by applying a potential that is higher than the source potential to the back gate.

The node FD is desired to have high potential retention capability in the pixel circuits in FIG. 2A or the like, so that transistors with a low off-state current are preferably used for the transistors 41 and 42. The off-state current can be reduced when potentials lower than source potentials are applied to the back gates of the transistors 41 and 42. Therefore, the node FD can have high potential retention capability.

Moreover, the transistor 43 which outputs a signal and the transistor 44 which is a path of the signal are preferably transistors with a high on-state current. The on-state current can be increased when potentials that are higher than source potentials are applied to the back gates of the transistors 43 and 44. Therefore, a reading potential output to the wiring 91 (OUT1) can be defined immediately, that is, the transistors 43 and 44 can be operated at high frequency.

A plurality of potentials such as a signal potential and a potential applied to the back gate are used inside an imaging device besides power supply potentials. Supply of a plurality of potentials from the outside of an imaging device increases the number of terminals; thus, an imaging device preferably has a power supply circuit generating a plurality of potentials inside the imaging device.

Figure 9:
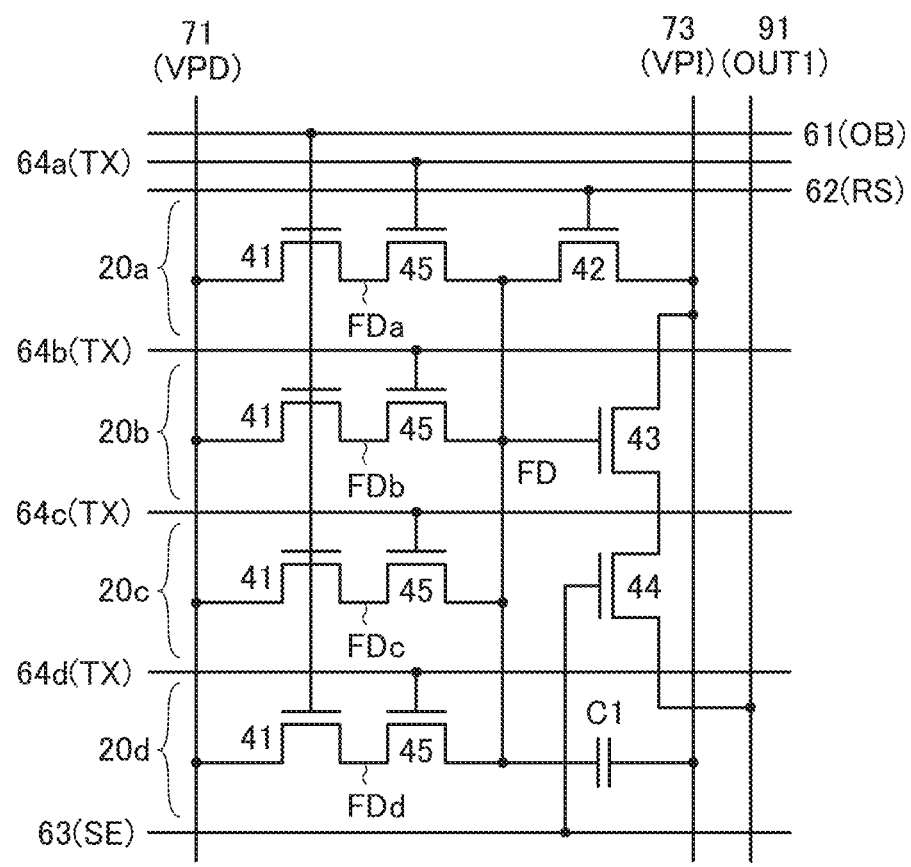
FIG. 9 is a circuit diagram illustrating pixels.

In a pixel circuit of one embodiment of the present invention, transistors may be shared among a plurality of pixels as illustrated in FIG. 9.

FIG. 9 illustrates pixels among which the transistors are shared. Pixels 20a to 20d include the transistors 41 and the transistors 45 individually and share the transistors 42 to 44 and the capacitor C1. The operation of each of the transistors 45 included in the pixels 20a to 20d is controlled by wirings 64a to 64d.

In the pixel circuit illustrated in FIG. 9, the plurality of pixels (the pixels 20a to 20d) aligned in the direction in which the wiring 91 (OUT1) extends (hereinafter, referred to as a vertical direction) share the transistors; however, a plurality of pixels aligned in the direction in which the wiring 63 (SE) extends (hereinafter, referred to as a horizontal direction) may share transistors. Alternatively, a plurality of pixels aligned in the horizontal and vertical directions may share transistors.

Alternatively, the number of pixels which share transistors is not limited to four, and may be two, three, or five or more.

The pixels in FIG. 9 among which the transistors are shared can be operated by either a rolling shutter system or a global shutter system. When a rolling shutter system is used, the imaging operation and the reading operation may be performed sequentially pixel by pixel.

Figure 10:
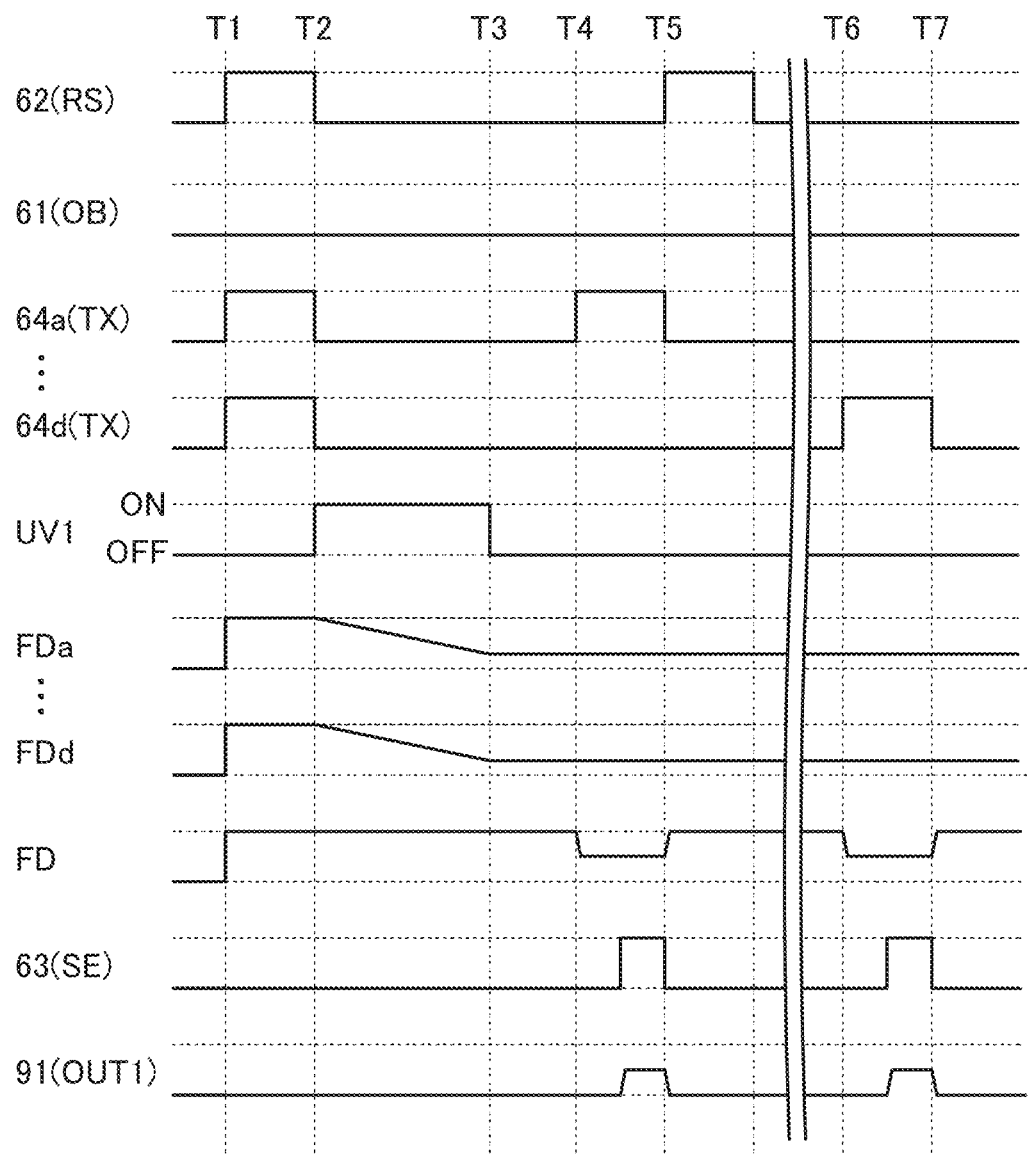
FIG. 10 is a timing chart showing the operation of a pixel.

An operation example of a global shutter system will be described with reference to a timing chart of FIG. 10. Note that in the pixels in FIG. 9 among which the transistors are shared, wirings connecting the transistors 41 and 45 included in the pixels 20a to 20d are referred to as nodes FDa to FDd. In addition, the wiring 71 (VPD) has a low potential and the wiring 73 (VPI) has a high potential. The wiring 61 (OB) has a potential at which the transistor 41 is always off.

At Time T1, the potential of the wiring 62 and the potentials of the wirings 64a to 64d are "H", which makes the transistor 42 and the transistors 45 on and the potential of the node FD and the potentials of the nodes FDa to FDd are "H" (reset operation).

At Time T2, the potential of the wiring 62 and the potentials of the wirings 64a to 64d are "L" and UV1 irradiation is started, which makes the transistors 41 irradiated with the UV2 and the off-state current of the transistors 41 increases depending on the irradiation intensity of the UV2. That is, the transistors 41 are turned on and the potentials of the nodes FDa to FDd starts to decrease (accumulation operation).

At Time T3, UV1 irradiation is stopped, which decreases the off-state current of the transistors 41 instantly and the potentials of the nodes FDa to FDd are retained (retaining operation).

At Time T4, the potential of the wiring 64a is "H", which makes the transistor 45 of the pixel 20a on and the potential of the node FD decreases. Then, when the potential of the wiring 63 is "H", the transistor 44 is turned on and image data is output to the wiring 91 (OUT1) depending on the potential of the node FD.

At Time T5, the potential of the wiring 64a is "L" and the potential of the wiring 62 is "H" so that the potential of the node FD is reset. Then, the reading operation of the pixel 20b in the next row is performed. In FIG. 10, the operation of the pixel 20d is shown in Time T6 and Time T7.

As described above, the signals of all of the pixels can be read by retaining the signals at the nodes FDa to FDd and transferring those signals to the node FD sequentially. When OS transistors with a low off-state current are used as the transistors 41, 42, and 45, the potentials of the nodes FDa to FDd and the node FD can be retained for a long time.

Figure 11A:
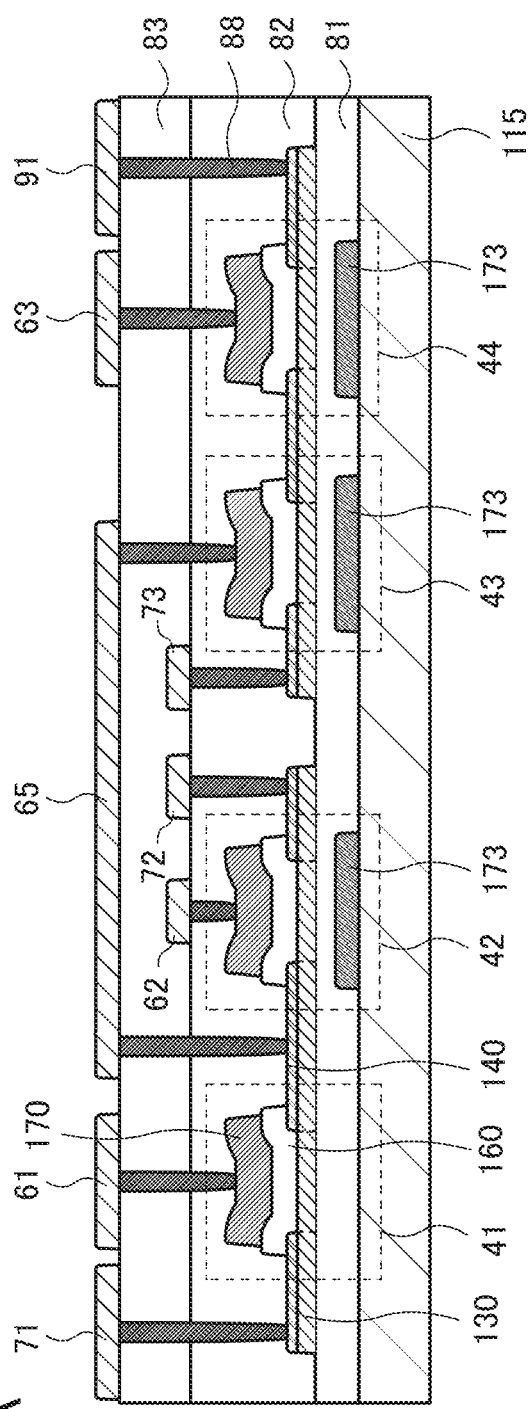
FIGS. 11A and 11B are cross-sectional views each illustrating a structure of an imaging device.
Figure 11B:
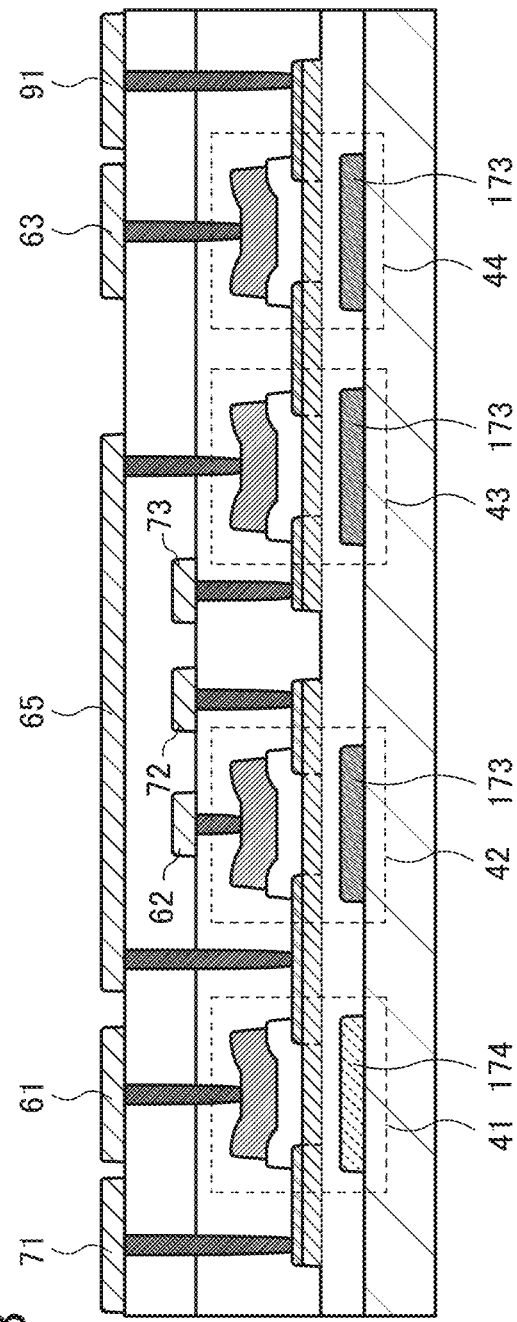

FIGS. 11A and 11B are cross-sectional views of the transistors 41 to 44 in the channel length direction, illustrating specific structural examples of the pixel 20 in FIG. 2A.

Although the wirings, the electrodes, the metal layers, and contact plugs (conductors 88) are illustrated as independent components in the cross-sectional views in this embodiment, some of them are provided as one component in some cases when they are electrically connected to each other. In addition, a structure in which the components such as wirings, electrodes, and metal layers are connected to each other through the conductors 88 is only an example, and the components may be directly connected to each other not through the conductor 88.

Insulating layers 81 to 83 and the like that function as protective films, interlayer insulating films, or planarization films are provided over a substrate and components such as transistors. For example, an inorganic insulating film such as a silicon oxide film or a silicon oxynitride film can be used as each of the insulating layers 81 to 83. Alternatively, an organic insulating film such as an acrylic resin film or a polyimide resin film may be used. Top surfaces of the insulating layers 81 to 83 and the like may be planarized by chemical mechanical polishing (CMP) or the like as necessary.

In some cases, one or more of the wirings, the transistors, or the like illustrated in the drawing are not provided or a wiring, a transistor, or the like that is not illustrated in the drawing is included in each layer.

As described above, the transistor 41 is an OS transistor. Moreover, the transistors 42 to 44 are preferably also OS transistors. Since the OS transistor has extremely low off-state current characteristics, a period during which charge can be retained in the node FD can be extremely long owing to the low off-state current characteristics of the transistors 41 and 42. Therefore, a global shutter system in which charge accumulation operation is performed in all the pixels at the same time can be used without a complicated circuit structure and operation method.

In addition, the OS transistor has lower temperature dependence of change in electrical characteristics than the Si transistor, and thus can be used at an extremely wide range of temperatures. Therefore, a semiconductor device that includes OS transistors is suitable for use in automobiles, aircrafts, spacecrafts, manufacturing apparatuses which operate at high temperatures and the like.

In FIG. 11A, the transistors 41 to 44 are top-gate OS transistors. For example, OS transistors are provided over the insulating layer 81 formed over a substrate 115 and include an oxide semiconductor layer 130, a conductive layer 140 which functions as a source electrode or a drain electrode, an insulating layer 160 which functions as a gate insulating layer, and a conductive layer 170 which functions as a gate electrode. Note that the insulating layer 81 can also serve as a gate insulating layer. In addition, a wiring 65 electrically connected to one of the source and the drain of the transistor 41, one of the source and the drain of the transistor 42, and the gate of the transistor 43 functions as part of the charge holding part.

In FIG. 11A, a conductive layer 173 which functions as a back gate electrode is provided for the transistors 42 to 44 and the conductive layer 173 is not provided for the transistor 41 as an example. When the transistor 41 is a top-gate transistor, a back gate electrode is preferably not provided because light enters from the substrate 115 side. In addition, the conductive layer 173 of the transistors 42 to 44 is preferably formed using a light-blocking material such as a metal layer in order to suppress the change in the electric characteristics of the transistors due to light irradiation.

However, for the transistor 41, a conductive layer 174 which functions as a back gate electrode can be formed of a light-transmitting conductive layer or the like as illustrated in FIG. 11B.

In FIG. 12A, the transistors 41 to 44 are bottom-gate OS transistors. In FIG. 12A, the conductive layer 173 which functions as a back gate electrode is provided for the transistors 42 to 44 and the conductive layer 173 is not provided for the transistor 41 as an example. When the transistor 41 is a bottom-gate transistor, a back gate electrode is preferably not provided because light enters from the insulating layer 83 side. In addition, the conductive layer 173 of the transistors 42 to 44 is preferably formed using a light-blocking material such as a metal layer in order to suppress the change in the electric characteristics of the transistors due to light irradiation.

However, when a light-transmitting conductive layer or the like is used as illustrated in FIG. 12B, the conductive layer 174 which functions as a back gate electrode can be provided for the transistor 41. Note that, in FIG. 12B, the wiring 61 and part of the conductors 88 are indicated by dashed lines, which means that the position of the wiring 61 and part of the conductors 88 is different from that of other components in a depth direction. For example, the wiring 61 and the conductor 88 connected to the wiring 61 are electrically connected to the conductive layer 170 in a different position from that shown in the cross-sectional view of FIG. 12A.

Figure 13A:
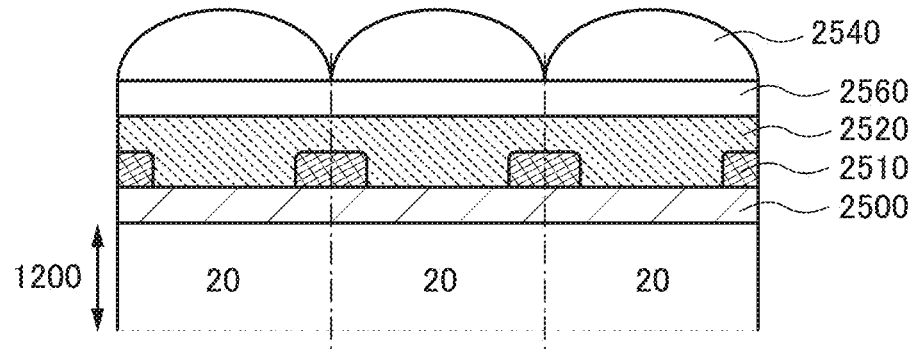
FIGS. 13A to 13C are cross-sectional views each illustrating a structure of an imaging device.

FIG. 13A is a cross-sectional view of an example of a mode in which a microlens array or the like is provided over the pixels 20. The cross-sectional view illustrates part of a region including pixel circuits for three pixels. An insulating layer 2500 is formed over a layer 1200 where the pixel 20 is formed. As the insulating layer 2500, a silicon oxide film or the like with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of blocking stray light entering from the oblique direction. The light-blocking layer 2510 can be formed of a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A microlens array 2540 can be provided over the organic resin layer 2520 with an insulating layer 2560 having a light-transmitting property provided therebetween. Note that the insulating layer 2560 can be omitted.

Figure 13B:
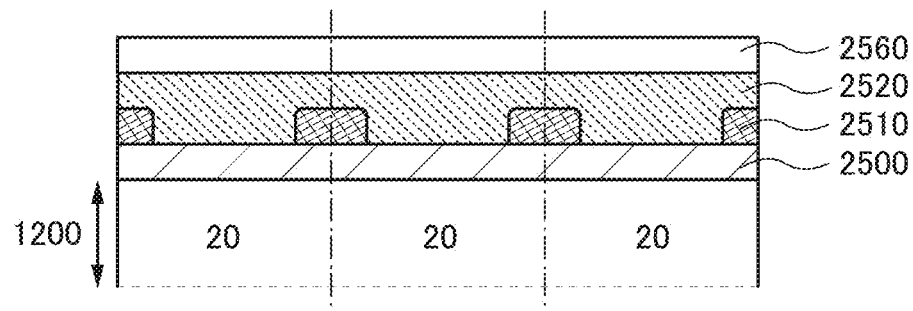

Alternatively, as illustrated in FIG. 13B, a structure that is not provided with the microlens array 2540 may be employed.

Figure 13C:
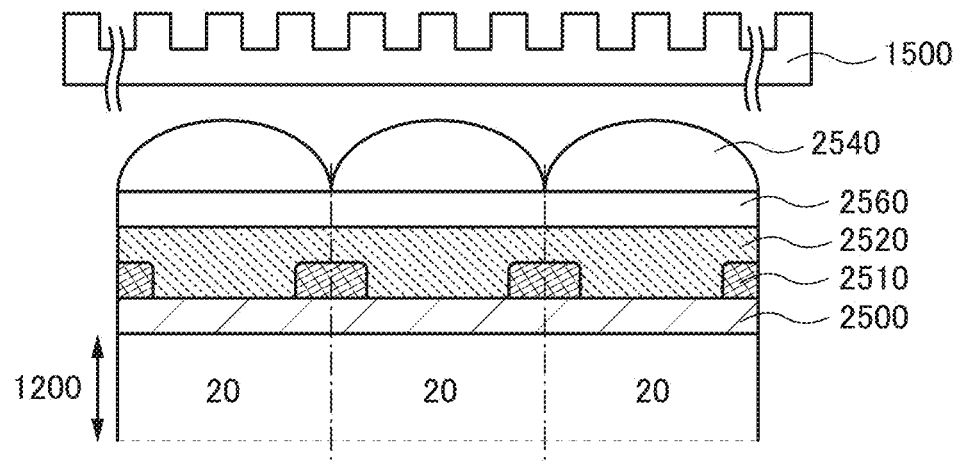

Alternatively, as illustrated in FIG. 13C, a diffraction grating 1500 may be provided above the microlens array 2540. An image of an object through the diffraction grating 1500 (a diffraction pattern) can be scanned into a pixel, and an input image (an object image) can be formed from a captured image in the pixel by arithmetic processing. In addition, the use of the diffraction grating 1500 instead of a lens can reduce the cost of electronic devices or the like including the imaging device.

The diffraction grating 1500 can be formed using a light-transmitting material. An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

Figure 14A:
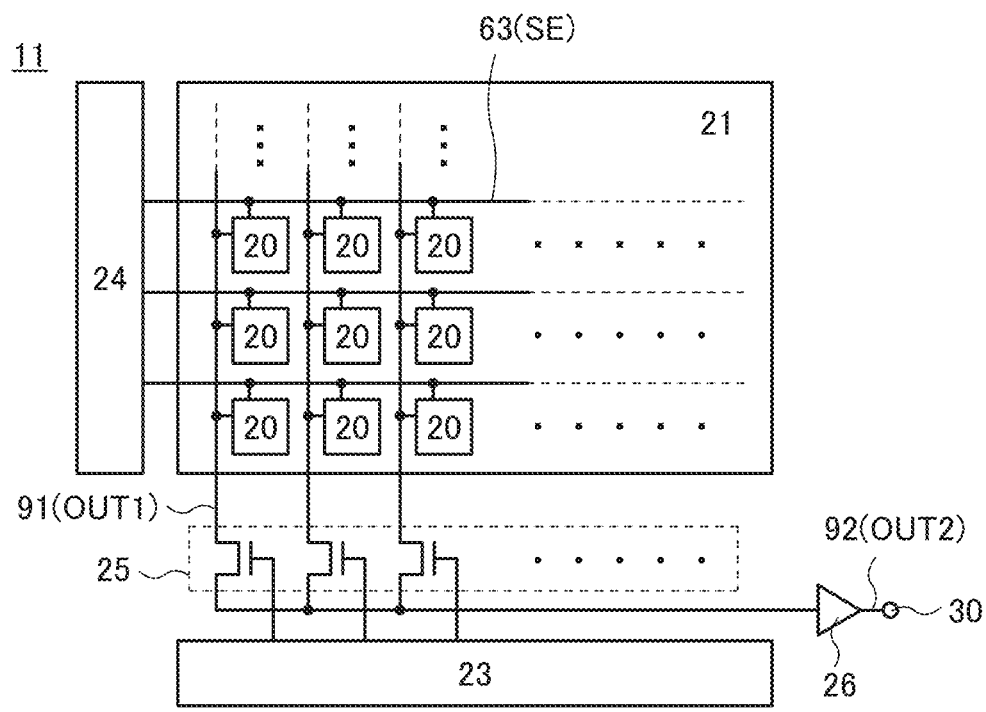
FIGS. 14A and 14B are a block diagram illustrating an imaging device and a block diagram of an A/D converter circuit.

FIG. 14A is a block diagram of the imaging element 11 of one embodiment of the present invention. The imaging element 11 can include a pixel array 21, a multiplexer driver 23, a selection transistor driver 24, multiplexer transistors 25, a buffer amplifier 26, and an output terminal 30.

The pixel array 21 includes the pixels 20 arranged in a matrix and a variety of wirings. In FIG. 14A, the wirings 63 (SE) and the wirings 91 (OUT1) are illustrated and other wirings are not illustrated.

Operation will be described below. First, pixels in the first row are driven by the method described above. While the transistor 44 is on, an image signal is output to each of the wirings 91 (OUT1). Meanwhile, the multiplexer transistors 25 are made to operate sequentially column by column and the image signal is extracted from the output terminal 30 through the buffer amplifier 26 and a wiring 92 (OUT2).

In a similar manner, pixels in the second row are driven and an image signal of the pixels in the second row is extracted from the output terminal 30. By driving pixels up to the n-th row sequentially, an image of one screen can be extracted.

The multiplexer driver 23 and the selection transistor driver 24 can be formed of a shift register circuit which can include only OS transistors. In addition, the multiplexer transistors 25 can be OS transistors. Moreover, also the buffer amplifier 26 can include only OS transistors by being formed of a source follower circuit. In this manner, the use of an OS transistor allows stable operation of the imaging element 11 under a variety of environments.

Figure 14B:
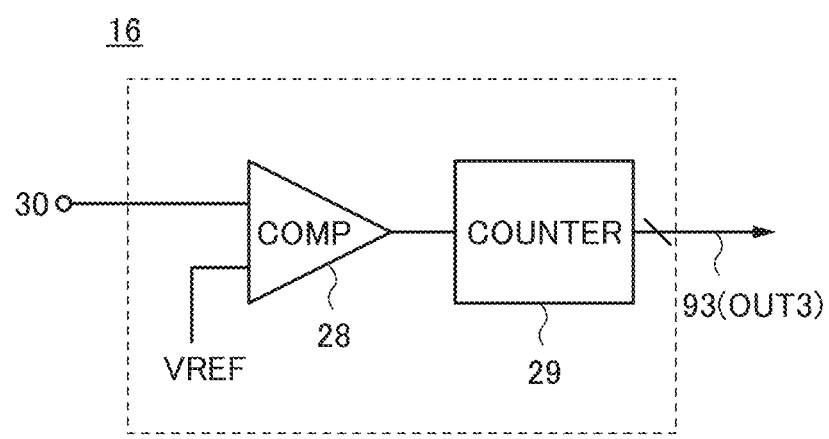

FIG. 14B is a block diagram of an example of the circuit 16 which can be electrically connected to the output terminal 30. The circuit 16 can include a comparator 28, a counter circuit 29, or the like and can serve as an A/D converter.

In the circuit 16, a signal potential that is input from the output terminal 30 to the comparator 28 and a reference potential (VREF) that is swept to be increased or decreased are compared. Then, in accordance with the output of the comparator 28, the counter circuit 29 operates to output a digital signal to a wiring 93 (OUT3).

Here, the circuit 16 is preferably formed using a Si transistor which can form a CMOS circuit for high speed operation and low power consumption.

Although the electric characteristics of a Si transistor are easily changed, particularly, at high temperatures, the influence of the temperature can be eliminated when the circuit 16 which converts data is provided not inside the imaging element 11 but outside the imaging element 11 as one embodiment of the present invention. Thus, imaging operation can be performed stably even at high temperatures.

In this embodiment, one embodiment of the present invention has been described. Other embodiments of the present invention are described in other embodiments. Note that one embodiment of the present invention is not limited to these. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor of one embodiment of the present invention may include various semiconductors. Depending on circumstances or conditions, various transistors or a channel formation region, a source region, a drain region, or the like of a transistor of one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor of one embodiment of the present invention does not necessarily include an oxide semiconductor.

This embodiment can be implemented in appropriate combinations with any of the configurations described in the other embodiments.

Embodiment 2

In this embodiment, a manufacturing apparatus including an imaging system of one embodiment of the present invention will be described.

A thermocompression bonding apparatus is used for bonding stacked plates. For example, a thermocompression bonding apparatus having an alignment function is used for attaching a flexible printed circuit (FPC) to a flat substrate with an anisotropic conductive film (ACF) or the like therebetween.

Alignment is performed by observing markers of a substrate and an FPC in an image and adjusting a positional relation between both of the markers automatically or manually.

Since the operation of an imaging element in a conventional apparatus is unstable at high temperatures, it is necessary to provide cameras in regions not influenced by heat of a thermocompression head. For this reason, a stage on which an object to be processed is provided needs to be moved in an alignment step and a thermocompression step; thus, improvement of throughput is prevented.

Moreover, in the case of imaging a high-temperature region, e.g., in the case of observing a pressure bonding step, a camera with cooling mechanism is needed, so that an imaging system becomes expensive.

In this embodiment, a thermocompression apparatus including an imaging system capable of performing stable imaging even at high temperatures will be described. As the imaging system, the imaging system described in Embodiment 1 can be used.

Figure 15A:
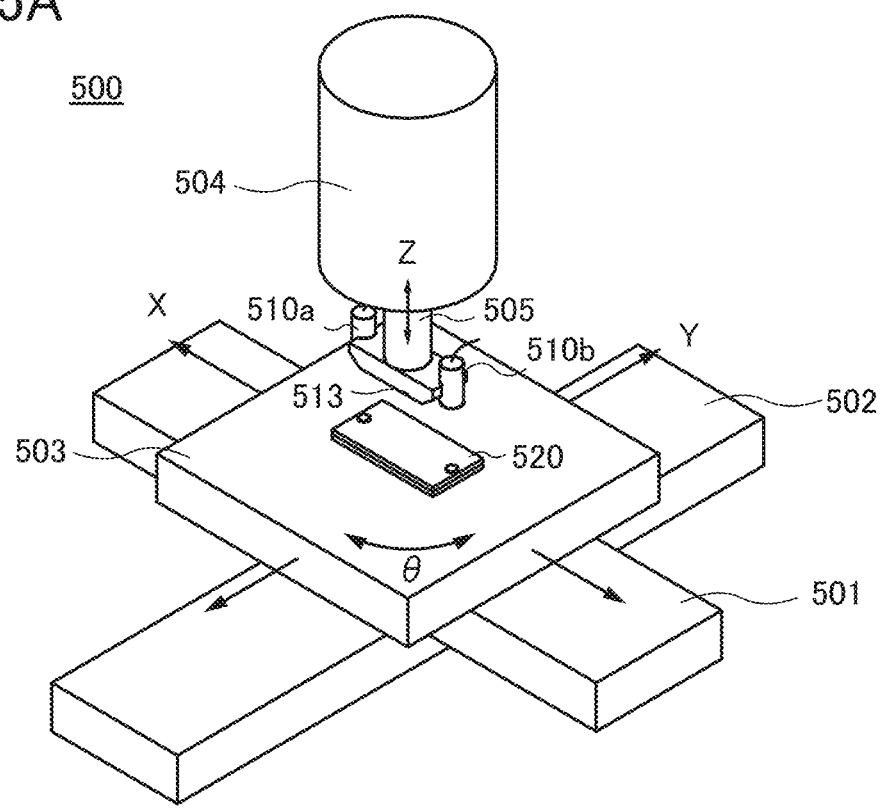
FIGS. 15A and 15B each illustrate a thermocompression bonding apparatus.

FIG. 15A illustrates a thermocompression apparatus 500 of one embodiment of the present invention. The thermocompression apparatus 500 includes an X-axis slide mechanism 501, a Y-axis slide mechanism 502, a stage 503, a cylinder 504, a cylinder rod 505, a thermocompression head 513, and cameras 510 (a camera 510a and a camera 510b). Note that a power cable and a signal cable which are connected to some components and a jig or the like for fixing components are omitted for simplification of the drawing.

As the X-axis slide mechanism 501 and the Y-axis slide mechanism 502, for example, a linear motion mechanism utilizing a ball screw or the like can be used.

The stage 503 is fixed to a guide portion of the X-axis slide mechanism 501 and the X-axis slide mechanism 501 is fixed to a guide portion of the Y-axis slide mechanism 502. Therefore, the stage 503 can be moved in the X direction and the Y direction freely. In addition, the stage 503 can be rotated around a center portion of a bottom surface thereof as an axis. That is, the stage 503 can also be moved in the θ direction.

The cylinder 504 has a function of moving up and down the cylinder rod 505 in the Z-axis direction with oil pressure, air pressure, or electrical conduction mechanism. The thermocompression head 513 is provided at an end portion of the cylinder rod 505 and an object to be processed 520 provided on the stage 503 is applied with pressure and heated by the thermocompression head 513 to be processed.

The camera 510 may include a housing 511, the imaging element 11, the optical system 12, and a cable 512 as illustrated in FIG. 16A. The cable 512 includes a plurality of signal lines, a plurality of power supply lines, or the like. The imaging element 11 and the circuit 15, the circuit 16, and the like in FIG. 1 are electrically connected to each other through the cable 512. That is, the camera 510 is a component of the imaging system 10.

Alternatively, the light sources 13a may be provided for the camera 510 as illustrated in FIG. 16B. The light sources 13a may be LEDs which emit ultraviolet light, for example. The light sources 13a and the circuit 15 are electrically connected to each other through the cable 512.

Alternatively, the light sources 13b may be provided in the stage 503 as illustrated in FIG. 16C. A quartz window 515 is provided on a top surface of the stage 503. The light sources 13b may be LEDs which emit ultraviolet light, for example, and the light emitted from the light sources 13b can be emitted to the object to be processed 520 through the quartz window 515.

Figure 15B:
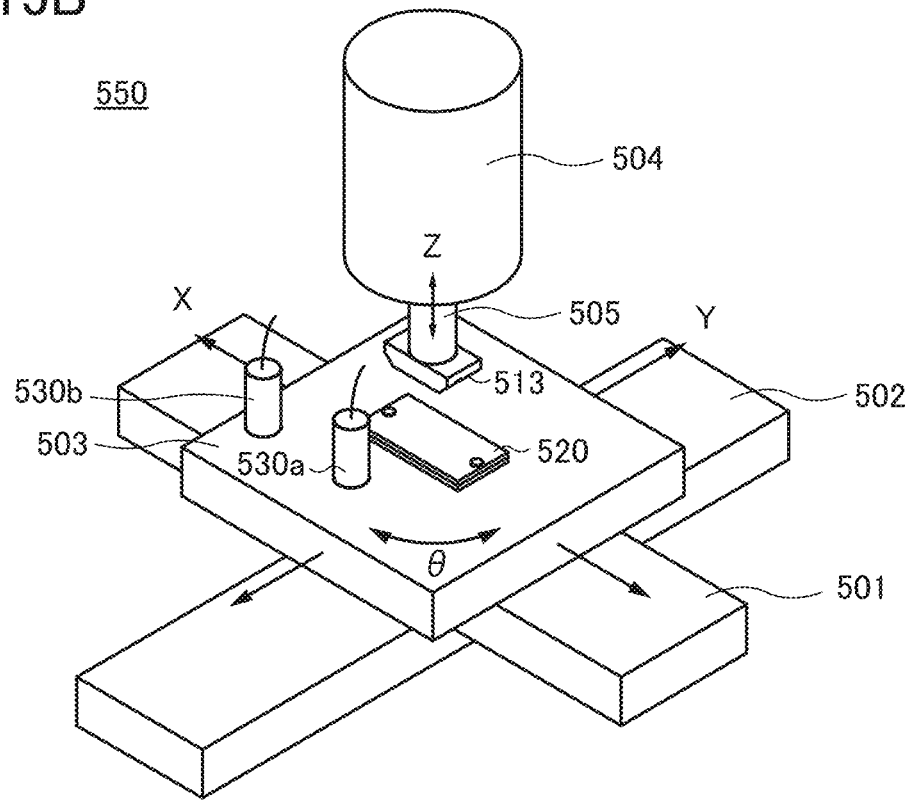

Here, a conventional thermocompression apparatus and the operation thereof will be described. FIG. 15B illustrates a conventional thermocompression apparatus 550. Cameras of the thermocompression apparatus 550 and the position thereof are different from those of the thermocompression apparatus 500 illustrated in FIG. 15A.

Since the operation of cameras 530 (cameras 530a and 530b) of the thermocompression apparatus 550 is unstable at high temperatures, the cameras are provided in regions not influenced by heat of the thermocompression head 513.

Figure 17A:
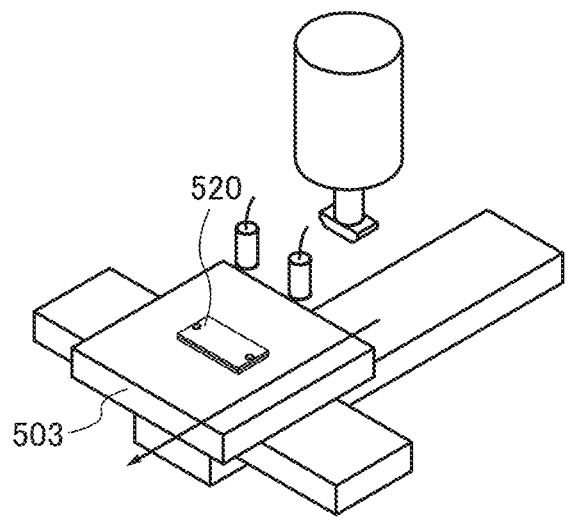
FIGS. 17A to 17D illustrate operation of a thermocompression bonding apparatus.

In the use of the thermocompression apparatus 550, first, the stage 503 is moved to an initial position and the object to be processed 520 is provided (see FIG. 17A).

Next, the stage 503 is moved to a position where markers 521 of the object to be processed 520 can be captured by the cameras 530a and 530b. Note that when this position is set as the initial position, the operation in FIG. 17A can be omitted.

Figure 17B:
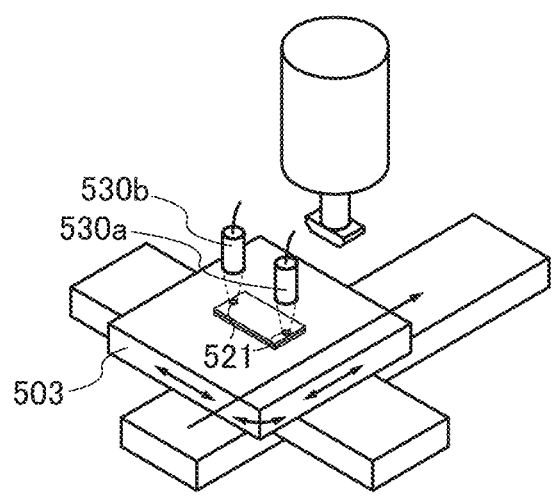

Next, an alignment operation is performed to adjust a positional relation between the markers 521 and the cameras 530a and 530b by moving the stage 503 in the X direction, the Y direction, and the θ direction slightly (see FIG. 17B). This alignment operation determines a position of a region X (not shown) in a top surface of the object to be processed 520 which is a region with which the thermocompression head 513 is in contact.

Figure 17C:
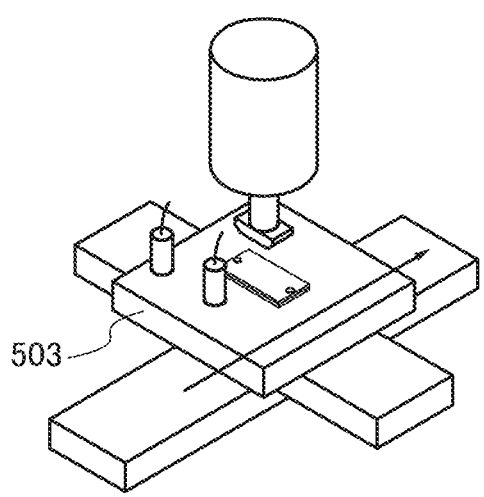

Then, the stage 503 is moved so that the position of the region X is directly under the thermocompression head 513 (see FIG. 17C).

Next, the thermocompression head 513 is lowered to the region X in order to process the object to be processed 520

Figure 17D:
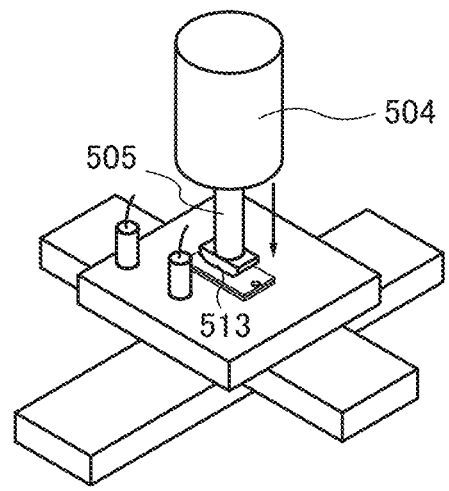

(see FIG. 17D). The above is a series of operations of the thermocompression apparatus 550.

Next, the operation of the thermocompression apparatus 500 of one embodiment of the present invention will be described.

Figure 18A:
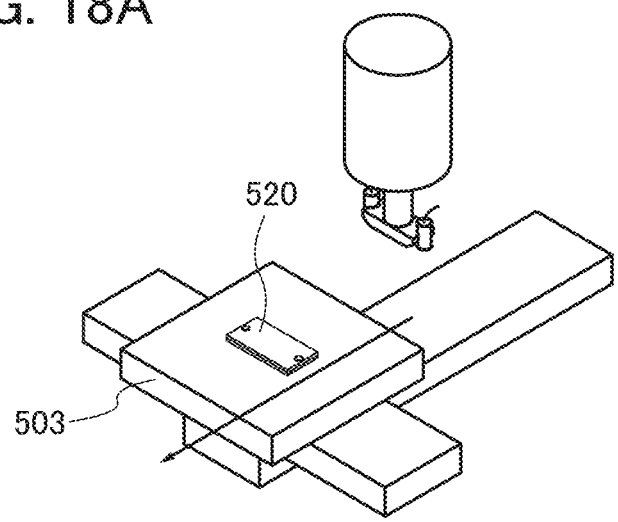
FIGS. 18A to 18C illustrate operation of a thermocompression bonding apparatus.

First, the stage 503 is moved to an initial position and the object to be processed 520 is provided (see FIG. 18A).

Next, the stage 503 is moved to a position where the markers 521 of the object to be processed 520 can be captured by the cameras 510a and 510b. Note that when this position is set as the initial position, the operation in FIG. 18A can be omitted.

Figure 18B:
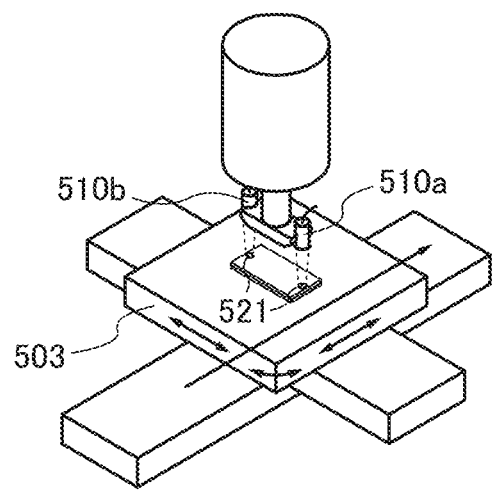

Next, an alignment operation is performed to adjust a positional relation between the markers 521 and the cameras 510a and 510b by moving the stage 503 in the X direction, the Y direction, and the θ direction slightly (see FIG. 18B). This alignment operation determines a position of a region X in a top surface of the object to be processed 520 which is a region with which the thermocompression head 513 is in contact.

Figure 18C:
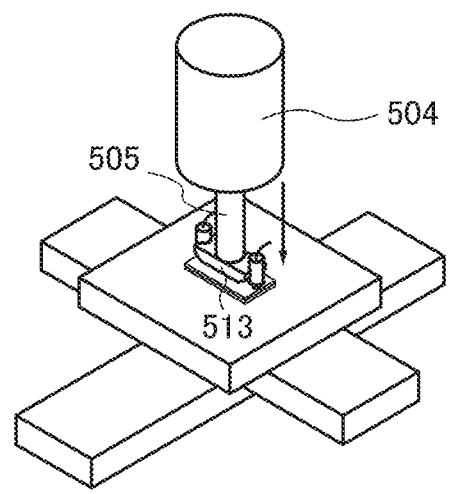

Next, the thermocompression head 513 is lowered to the region X in order to process the object to be processed 520 (see FIG. 18C). The above is a series of operations of the thermocompression apparatus 500.

In the thermocompression apparatus 500, since the cameras 510a and 510b can be provided for the thermocompression head 513 or in the vicinity thereof, at least the operation in FIG. 17C of the thermocompression apparatus 550 can be omitted. Therefore, the throughput can be improved.

Figure 19A:
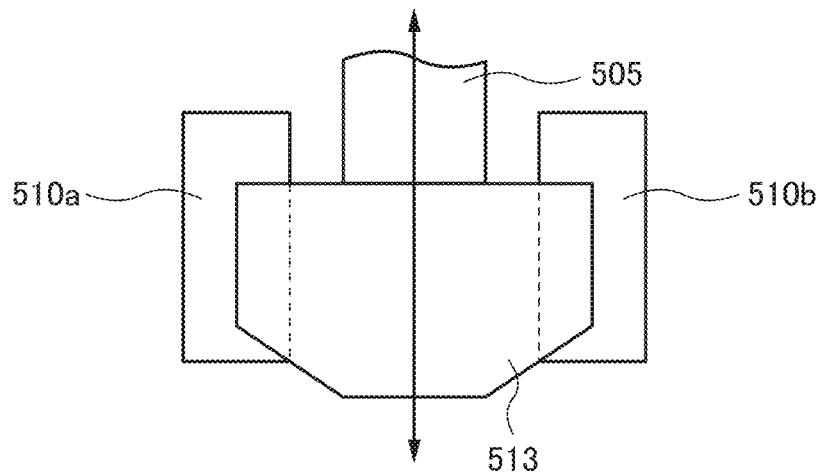
FIGS. 19A to 19C each illustrate the position of cameras.
Figure 19B:
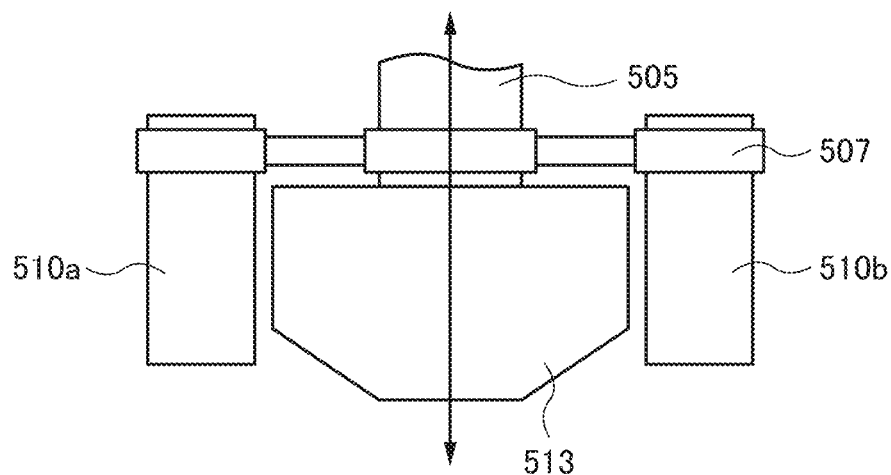

Note that, although in FIG. 15A or the like, the cameras 510a and 510b are fixed to the thermocompression head 513 as illustrated in FIG. 19A, the cameras 510a and 510b may be fixed to the cylinder rod 505 with a fixing jig 507 as illustrated in FIG. 19B. With such a structure, the thermocompression head 513 can be easily exchanged.

Figure 19C:
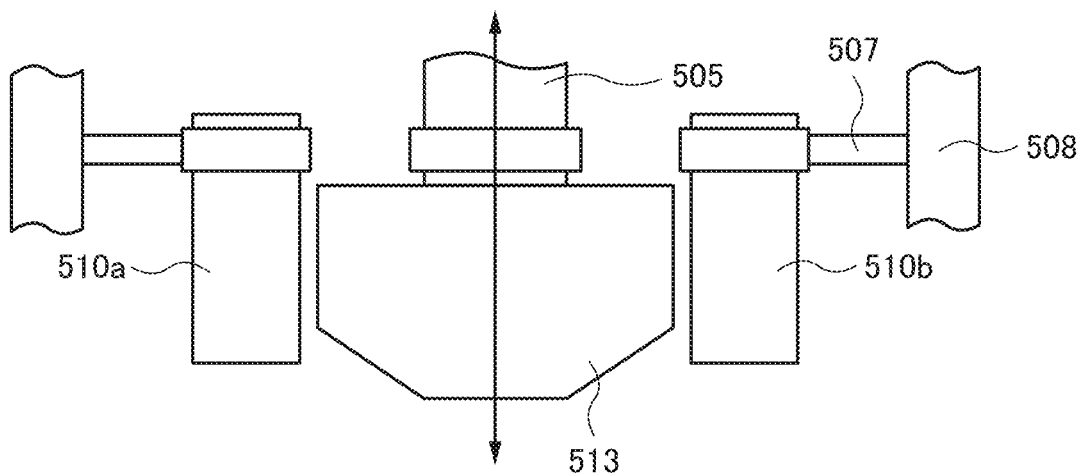

Alternatively, each of the cameras 510a and 510b may be fixed to a fixed support 508 with the fixing jig 507 as illustrated in FIG. 19C. With such a structure, the cameras 510a and 510b are fixed not to move up and down, so that the object to be processed 520 can be observed all the time. For example, the position deviation which may occur when the thermocompression head 513 applies pressure to the object to be processed 520 can be observed.

Note that this embodiment can be combined with any of the other embodiments in this specification as appropriate.

Embodiment 3

In this embodiment, an OS transistor that can be used in one embodiment of the present invention will be described with reference to drawings. In the drawings in this embodiment, some components are enlarged, reduced in size, or omitted for easy understanding.

Figure 20A:
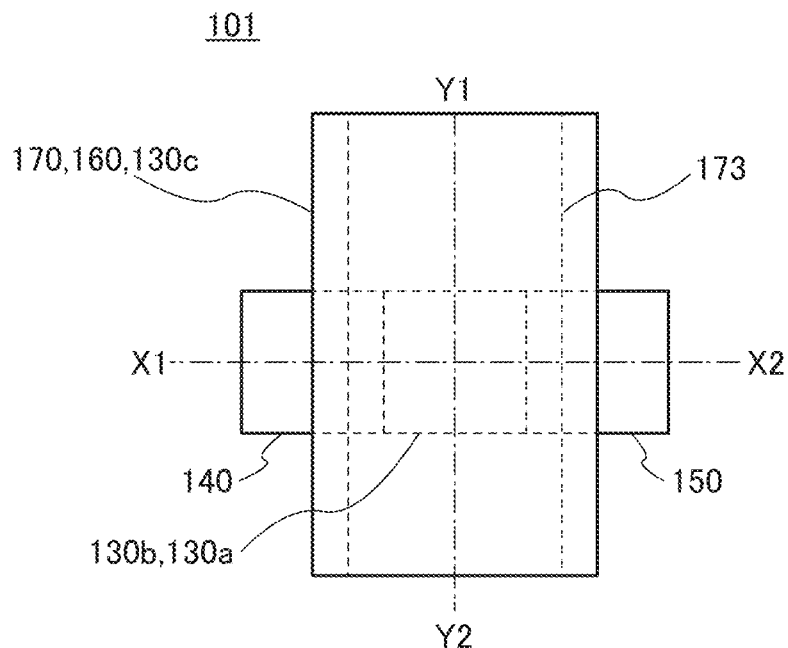
FIGS. 20A to 20C are a top view and cross-sectional views illustrating a transistor.
Figure 20B:
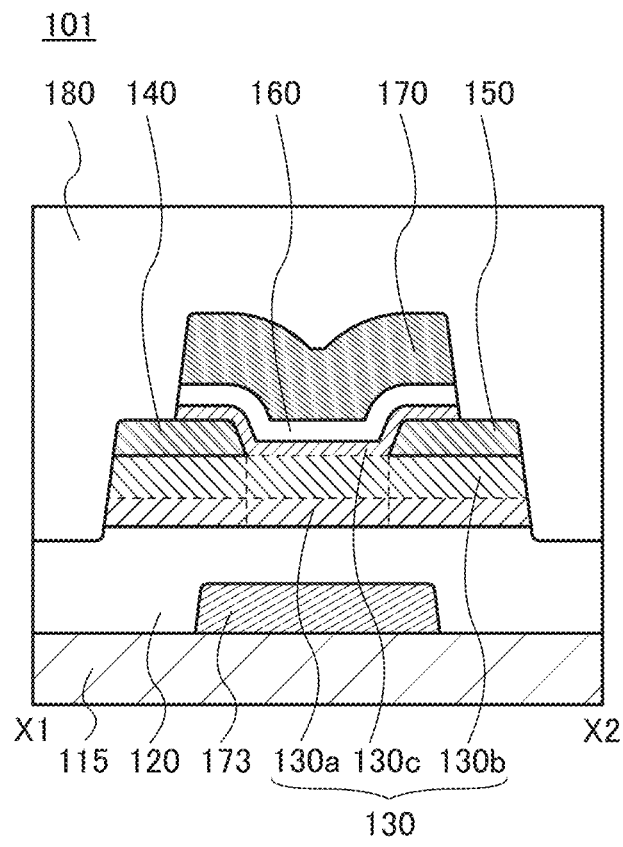
Figure 20C:
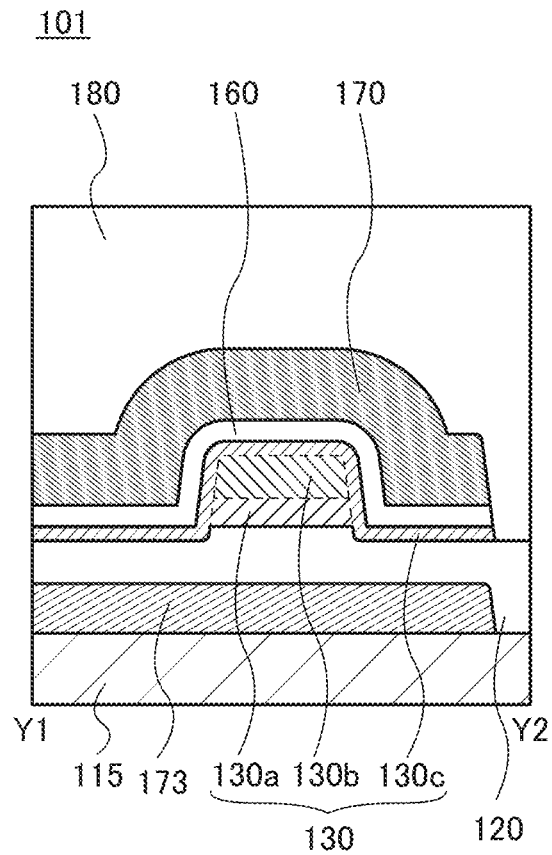

FIGS. 20A, 20B, and 20C are a top view and cross-sectional views illustrating a transistor 101 of one embodiment of the present invention. FIG. 20A is the top view and FIG. 20B illustrates a cross section in the direction of a dashed-dotted line X1-X2 in FIG. 20A. FIG. 20C illustrates a cross section in the direction of a dashed-dotted line Y1-Y2 in FIG. 20A.

Note that, in the drawings described in this embodiment, the direction of the dashed-dotted line X1-X2 may be called a channel length direction, and the direction of the dashed-dotted line Y1-Y2 may be called a channel width direction.

The transistor 101 includes an insulating layer 120 in contact with the substrate 115, the conductive layer 173 in contact with the insulating layer 120, the oxide semiconductor layer 130 in contact with the insulating layer 120, the conductive layer 140 and a conductive layer 150 electrically connected to the oxide semiconductor layer 130, the insulating layer 160 in contact with the oxide semiconductor layer 130 and the conductive layers 140 and 150, and the conductive layer 170 in contact with the insulating layer 160.

Alternatively, over the transistor 101, an insulating layer 180 in contact with the oxide semiconductor layer 130, the conductive layers 140 and 150, the insulating layer 160, and the conductive layer 170 may be provided as necessary.

The oxide semiconductor layer 130 can have a three-layer structure of oxide semiconductor layers 130a, 130b, and 130c as an example.

The conductive layers 140 and 150, the insulating layer 160, and the conductive layer 170 can function as a source electrode layer or a drain electrode layer, a gate insulating film, and a gate electrode layer, respectively.

When the conductive layer 173 is used as a second gate electrode layer (back gate), the on-state current can be increased or the threshold voltage can be controlled. Note that the conductive layer 173 can also serve as a light-blocking layer.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is supplied to the conductive layer 173.

Regions of the oxide semiconductor layer 130 which are in contact with the conductive layers 140 and 150 can serve as a source region or a drain region.

Since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions with low resistance whose conductivity type is n-type.

Note that functions of a "source" and a "drain" of a transistor are sometimes replaced with each other when a transistor of opposite polarity is used or when the direction of current flow is changed in circuit operation, for example. Therefore, the terms "source" and "drain" can be interchanged with each other. In addition, the term "electrode layer" can be changed into the term "wiring".

The conductive layers 140 and 150 are in contact with the top surface of the oxide semiconductor layer 130 and are not in contact with side surfaces of the oxide semiconductor layer 130. With such a structure, oxygen vacancy in the oxide semiconductor layer 130 is easily filled with oxygen contained in the insulating layer 120.

Figure 21A:
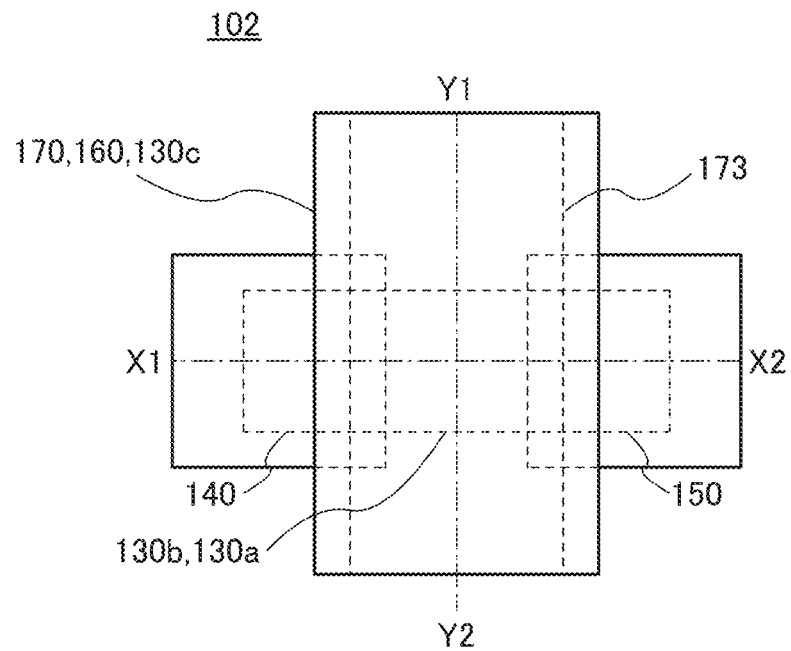
FIGS. 21A to 21C are a top view and cross-sectional views illustrating a transistor.
Figure 21B:
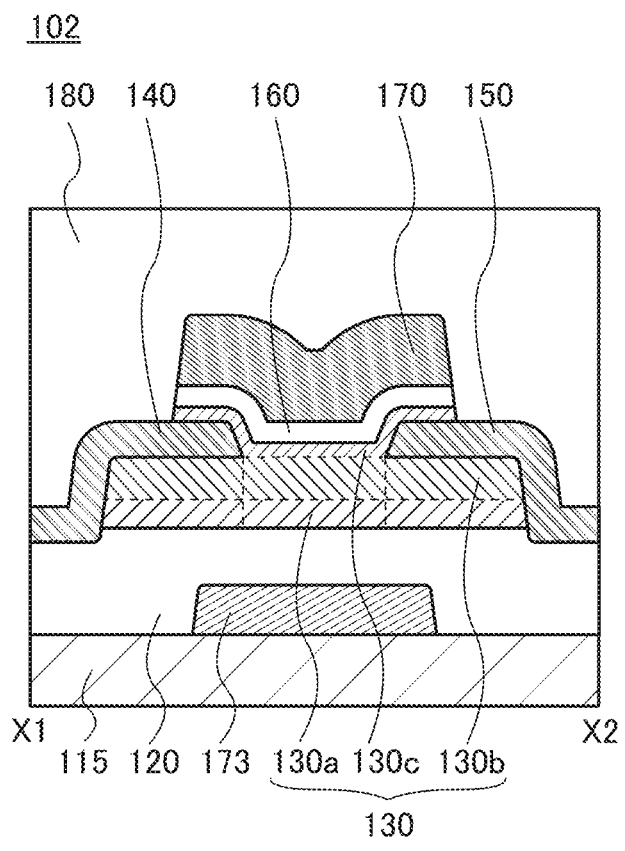
Figure 21C:
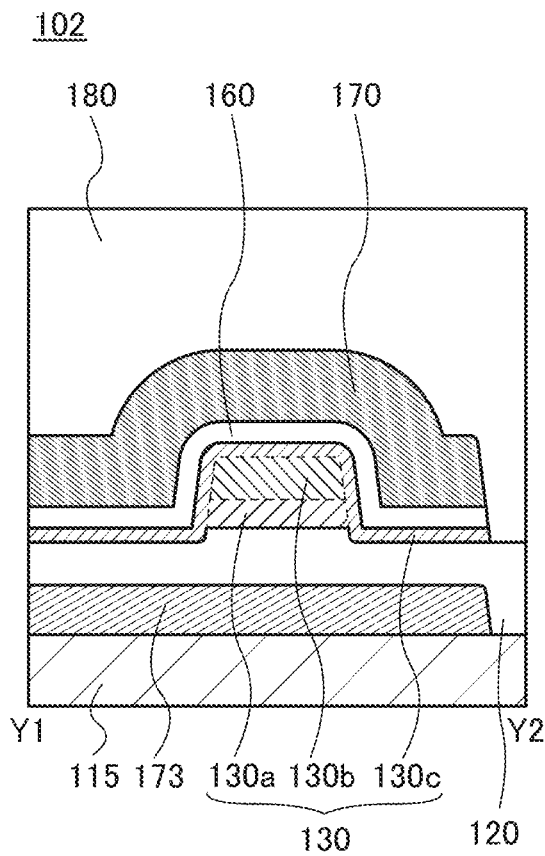

The transistor of one embodiment of the present invention may have a structure illustrated in FIGS. 21A, 21B, and 21C. FIG. 21A is the top view of a transistor 102 and FIG. 21B illustrates a cross section in the direction of a dashed-dotted line X1-X2 in FIG. 21A. FIG. 21C illustrates a cross section in the direction of a dashed-dotted line Y1-Y2 in FIG. 21A.

The transistor 102 has the same structure as the transistor 101 except that the conductive layers 140 and 150 are in contact with the insulating layer 120 and the side surfaces of the oxide semiconductor layer 130.

Alternatively, the transistor of one embodiment of the present invention may have a structure illustrated in FIGS.

Figure 22A:
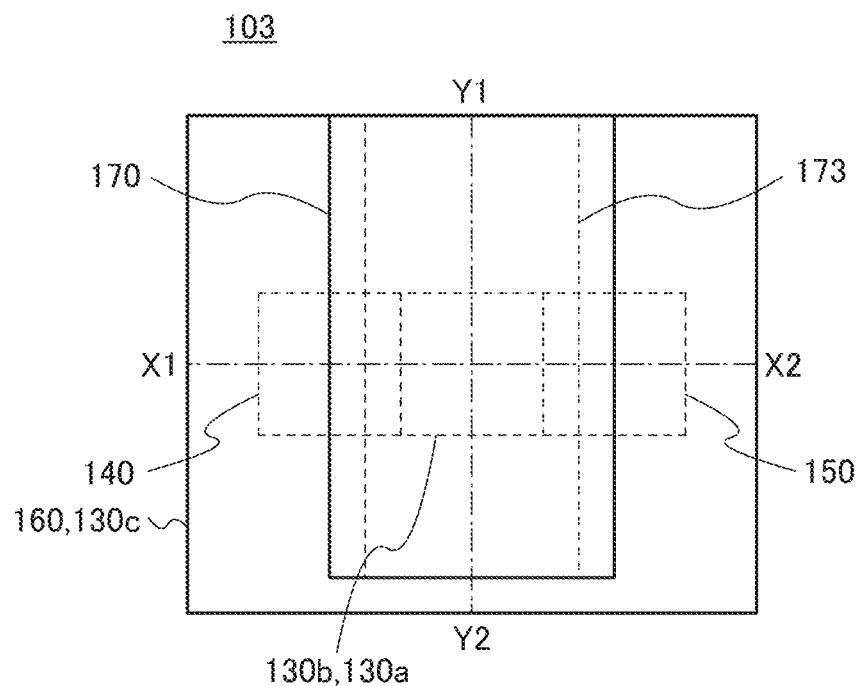
FIGS. 22A to 22C are a top view and cross-sectional views illustrating a transistor.
Figure 22B:
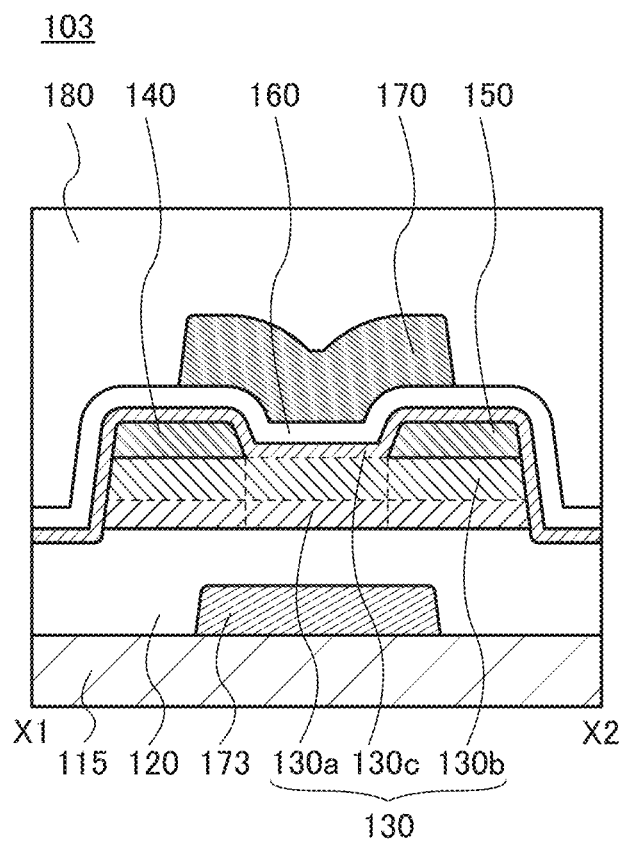
Figure 22C:
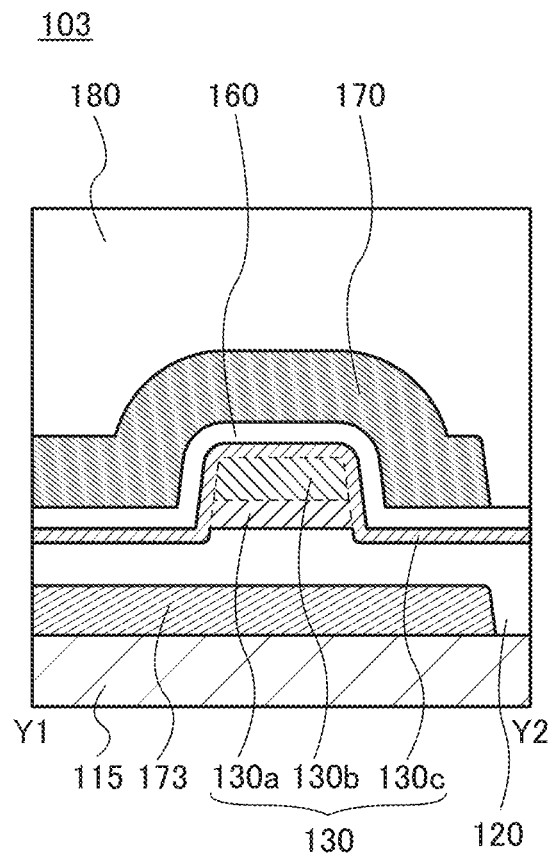

22A, 22B, and 22C. FIG. 22A is the top view of a transistor 103 and FIG. 22B illustrates a cross section in the direction of a dashed-dotted line X1-X2 in FIG. 22A. FIG. 22C illustrates a cross section in the direction of a dashed-dotted line Y1-Y2 in FIG. 22A.

The transistor 103 has the same structure as the transistor 101 except that the oxide semiconductor layers 130a and 130b, the conductive layer 140, and the conductive layer 150 are covered with the oxide semiconductor layer 130c and the insulating layer 160.

When the oxide semiconductor layers 130a and 130b are covered with the oxide semiconductor layer 130c, the oxide semiconductor layers 130a and 130b and the insulating layer 120 can be compensated with oxygen more effectively. In addition, the oxide semiconductor layer 130c prevents the conductive layers 140 and 150 from being oxidized by the insulating layer 180.

Figure 23A:
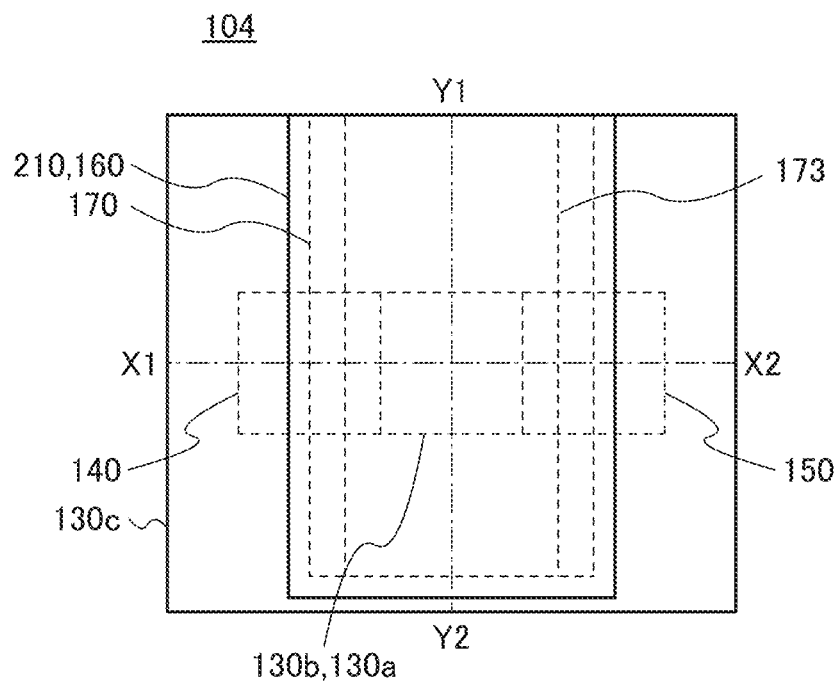
FIGS. 23A to 23C are a top view and cross-sectional views illustrating a transistor.
Figure 23B:
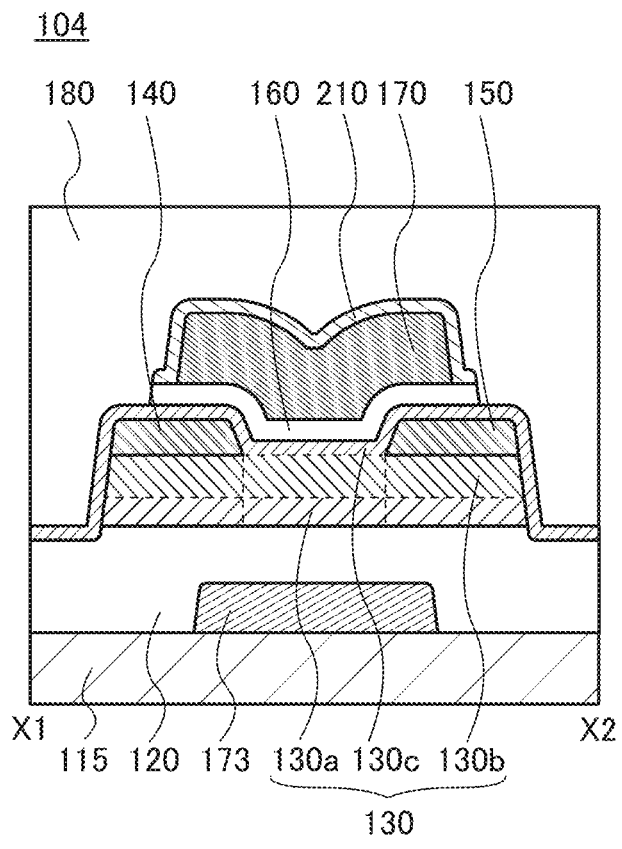
Figure 23C:
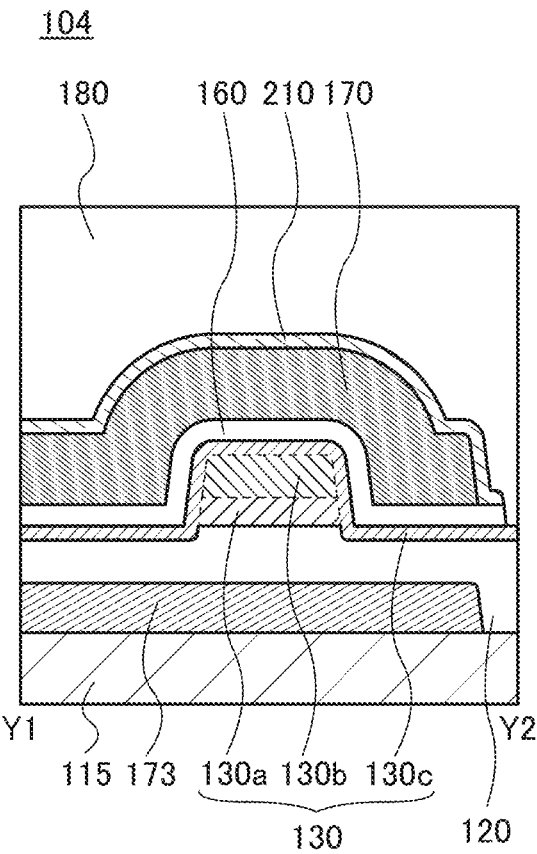

Alternatively, the transistor of one embodiment of the present invention may have a structure illustrated in FIGS. 23A, 23B, and 23C. FIG. 23A is the top view of a transistor 104 and FIG. 23B illustrates a cross section in the direction of a dashed-dotted line X1-X2 in FIG. 23A. FIG. 23C illustrates a cross section in the direction of a dashed-dotted line Y1-Y2 in FIG. 23A.

The transistor 104 has the same structure as the transistor 101 except that the oxide semiconductor layers 130a and 130b, the conductive layer 140, and the conductive layer 150 are covered with the oxide semiconductor layer 130c and the conductive layer 170 is covered with an insulating film 210.

A material with a property of blocking oxygen can be used for the insulating film 210. For example, metal oxide such as aluminum oxide can be used. The insulating film 210 prevents the conductive layer 170 from being oxidized by the insulating layer 180.

The transistors 101 to 104 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with high on-state current can be easily formed.

Figure 24A:
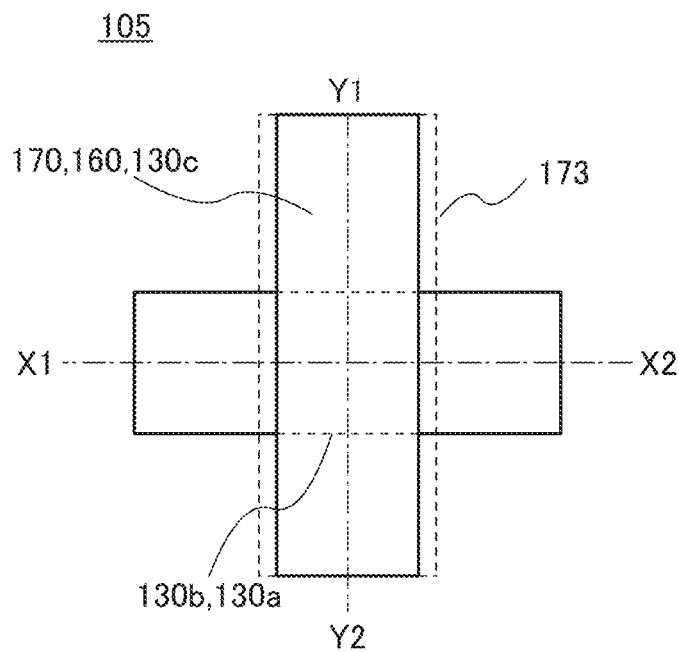
FIGS. 24A to 24C are a top view and cross-sectional views illustrating a transistor.
Figure 24B:
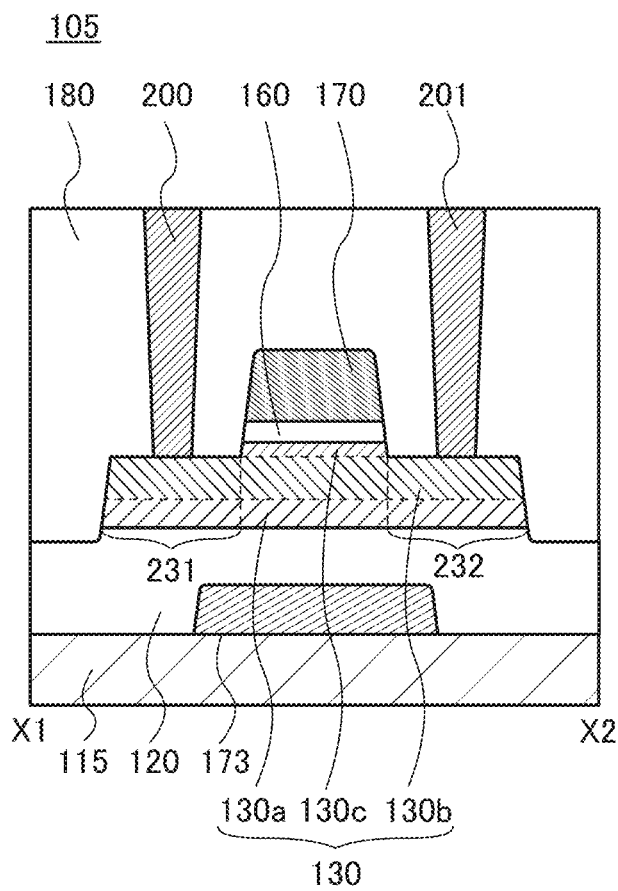
Figure 24C:
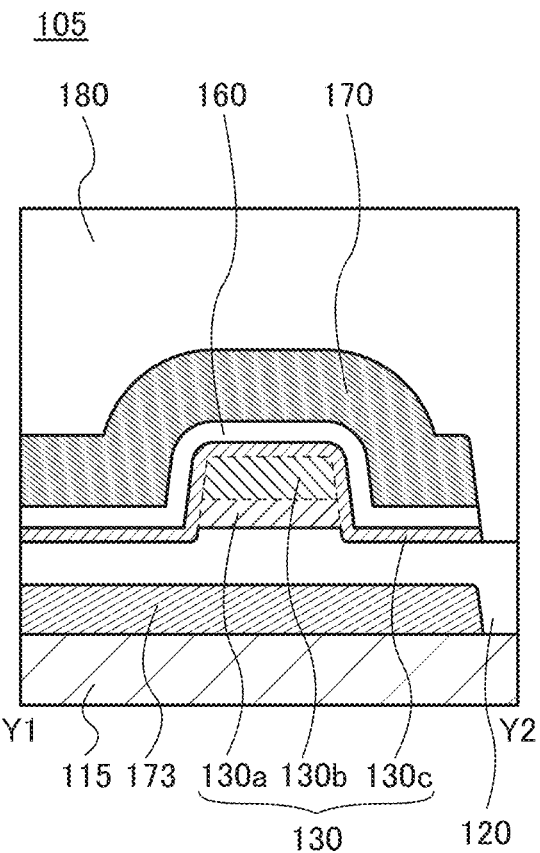

Alternatively, the transistor of one embodiment of the present invention may have a structure illustrated in FIGS. 24A, 24B, and 24C. FIG. 24A is the top view of a transistor 105 and FIG. 24B illustrates a cross section in the direction of a dashed-dotted line X1-X2 in FIG. 24A. FIG. 24C illustrates a cross section in the direction of a dashed-dotted line Y1-Y2 in FIG. 24A.

A transistor 105 includes the insulating layer 120 in contact with the substrate 115, the conductive layer 173 in contact with the insulating layer 120, the oxide semiconductor layer 130 in contact with the insulating layer 120, the insulating layer 160 in contact with the oxide semiconductor layer 130, and the conductive layer 170 in contact with the insulating layer 160.

In the insulating layer 180 serving as an interlayer insulating film, a conductor 200 in contact with a region 231 of the oxide semiconductor layer 130 and a conductor 201 in contact with a region 232 of the oxide semiconductor layer 130 are provided. The conductors 200 and 201 can serve as part of a source electrode layer or part of a drain electrode layer.

An impurity for forming oxygen vacancies to increase conductivity is preferably added to the regions 231 and 232 of the transistor 105. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor.

The transistor 105 has a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 25A:
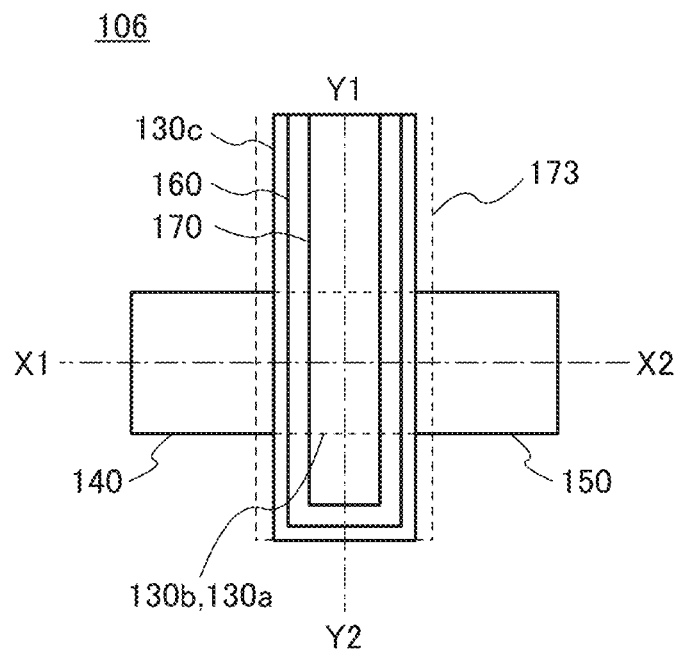
FIGS. 25A to 25C are a top view and cross-sectional views illustrating a transistor.
Figure 25B:
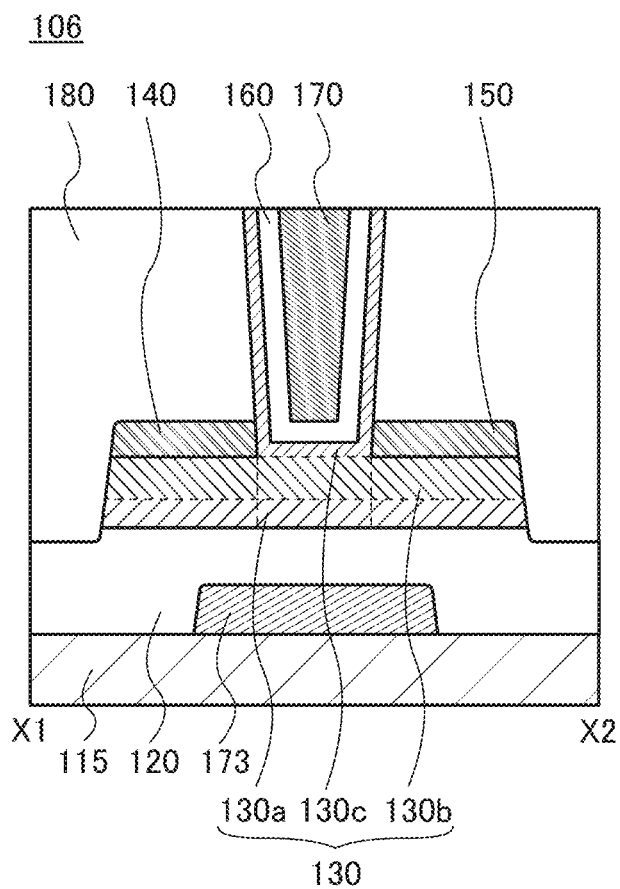
Figure 25C:
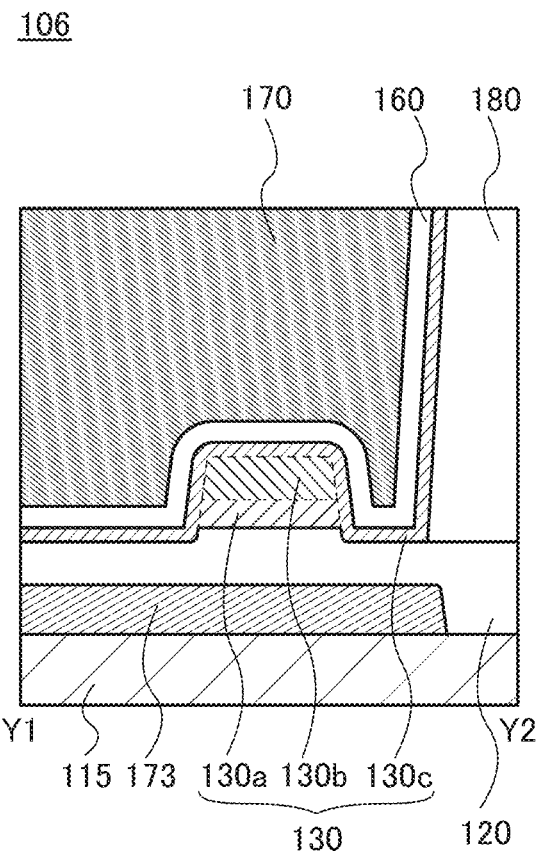

Alternatively, the transistor of one embodiment of the present invention may have a structure illustrated in FIGS. 25A, 25B, and 25C. FIG. 25A is the top view of a transistor 106 and FIG. 25B illustrates a cross section in the direction of a dashed-dotted line X1-X2 in FIG. 25A. FIG. 25C illustrates a cross section in the direction of a dashed-dotted line Y1-Y2 in FIG. 25A The transistor 106 includes the substrate 115, the insulating layer 120 over the substrate 115, the conductive layer 173 in contact with the insulating layer 120, the oxide semiconductor layer 130 (the oxide semiconductor layers 130a to 130c) over the insulating layer 120, the conductive layers 140 and 150 that are in contact with the oxide semiconductor layer 130 and are apart from each other, the insulating layer 160 in contact with the oxide semiconductor layer 130c, and the conductive layer 170 in contact with the insulating layer 160.

Note that the oxide semiconductor layer 130c, the insulating layer 160, and the conductive layer 170 are provided in an opening that is provided in an insulating layer 180 over the transistor 106 and reaches the oxide semiconductor layers 130a and 130b and the insulating layer 120.

Figure 26A:
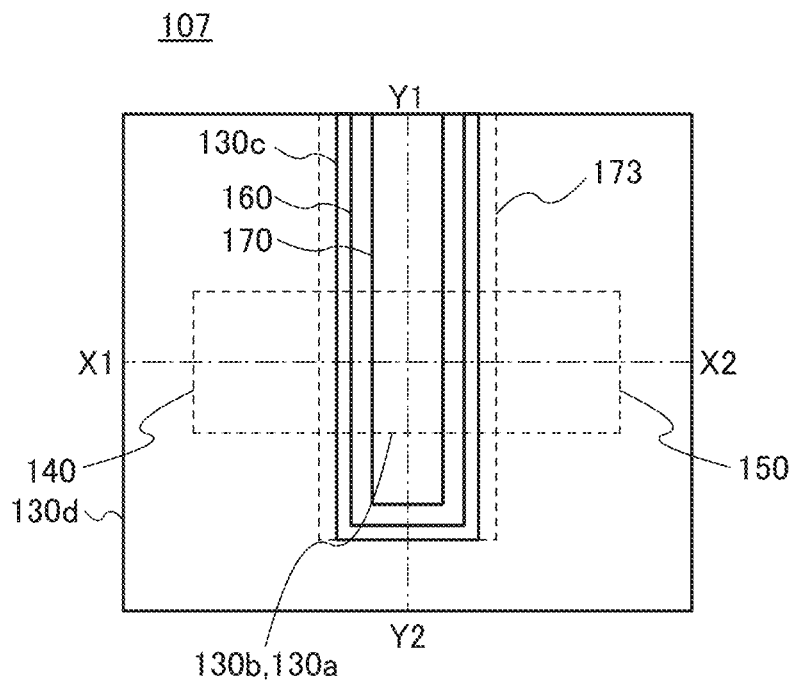
FIGS. 26A to 26C are a top view and cross-sectional views illustrating a transistor.
Figure 26B:
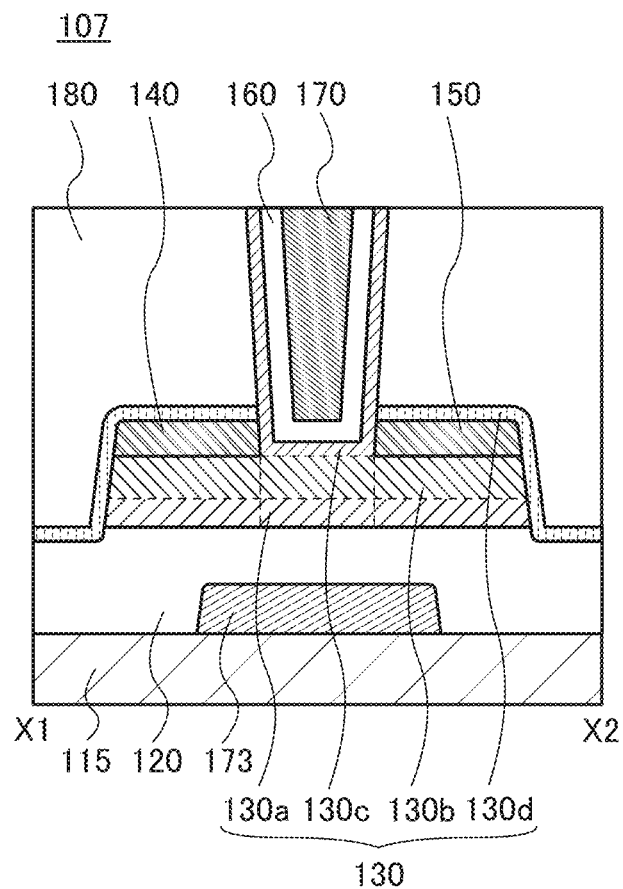
Figure 26C:
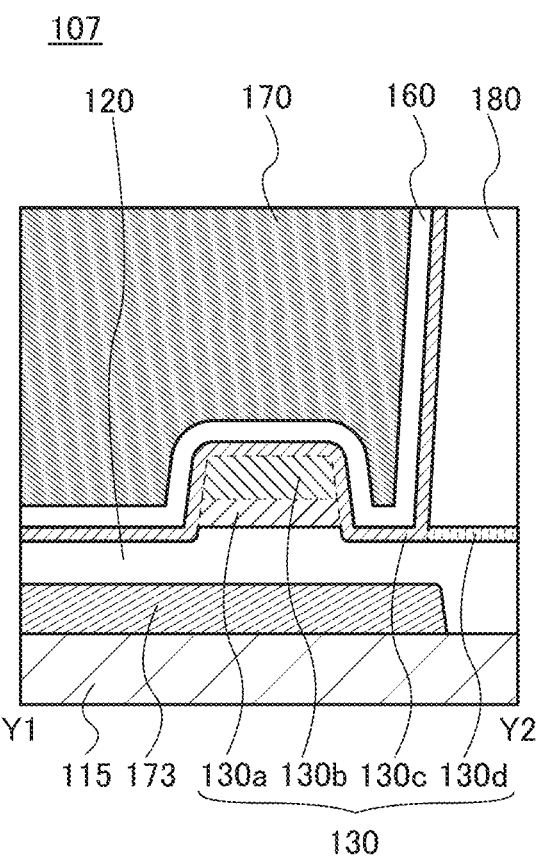

Alternatively, the transistor of one embodiment of the present invention may have a structure illustrated in FIGS. 26A, 26B, and 26C. FIG. 26A is the top view of a transistor 107 and FIG. 26B illustrates a cross section in the direction of a dashed-dotted line X1-X2 in FIG. 26A. FIG. 26C illustrates a cross section in the direction of a dashed-dotted line Y1-Y2 in FIG. 26A.

The transistor 107 has the same structure as the transistor 106 except that the oxide semiconductor layers 130a and 130b, the conductive layer 140, and the conductive layer 150 are covered with the oxide semiconductor layer 130c or 130d. The oxide semiconductor layer 130d can be formed using the same material as the oxide semiconductor layer 130c.

When the oxide semiconductor layers 130a and 130b are covered with the oxide semiconductor layer 130c or 130d, the oxide semiconductor layers 130a and 130b and the insulating layer 120 can be compensated with oxygen more effectively. In addition, the oxide semiconductor layer 130d prevents the conductive layers 140 and 150 from being oxidized by the insulating layer 180.

The transistors 106 and 107 each have a smaller region in which a conductor serving as a source electrode or a drain electrode overlaps with a conductor serving as a gate electrode; thus, the parasitic capacitance in the transistors 106 and 107 can be reduced. Therefore, the transistors 106 and 107 are each preferable as a component of a circuit for which high-speed operation is needed.

Figure 27A:
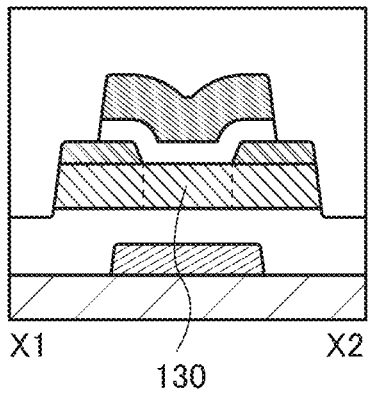
FIGS. 27A to 27H are top views and cross-sectional views illustrating transistors.
Figure 27B:
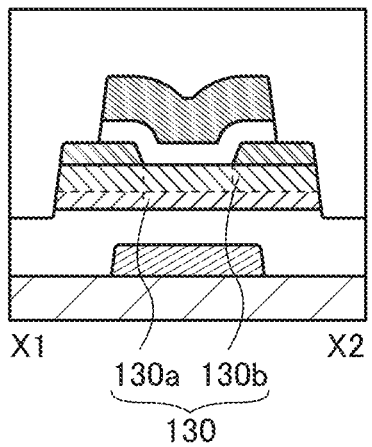

Alternatively, the oxide semiconductor layer 130 of the transistor of one embodiment of the present invention may be formed as a single layer as illustrated in FIG. 27A or two layers as illustrated in FIG. 27B.

Figure 27C:
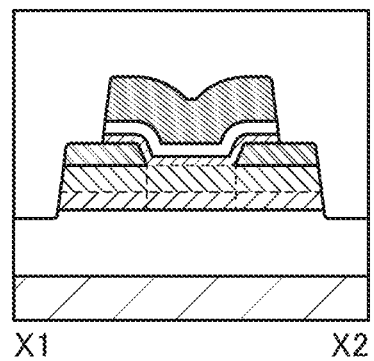

Alternatively, the transistor of one embodiment of the present invention may not include the conductive layer 173 as illustrated in FIG. 27C.

Figure 27D:
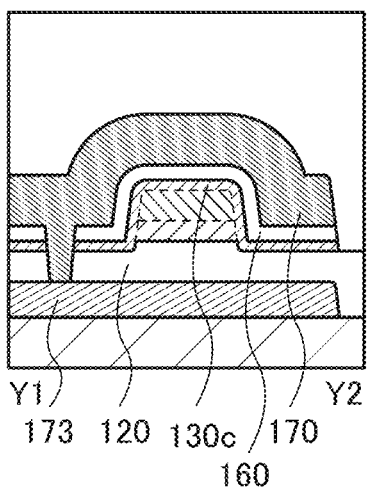

In order to electrically connect the conductive layer 170 and the conductive layer 173 to each other in a transistor of one embodiment of the present invention, an opening reaching to the conductive layer 173 may be provided in the insulating layer 120, the oxide semiconductor layer 130c, and the insulating layer 160 and the conductive layer 170 may be formed so as to cover the opening as illustrated in FIG. 27D.

Figure 27E:
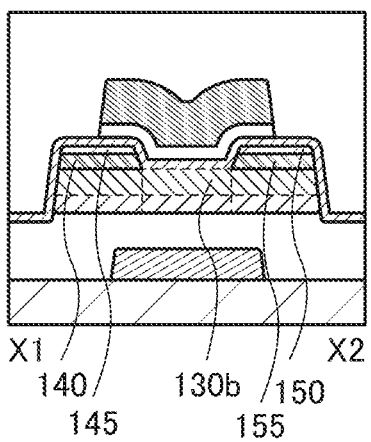

Alternatively, as illustrated in FIG. 27E, a transistor of one embodiment of the present invention may include an insulating layer 145 and an insulating layer 155 which are in contact with the conductive layer 140 and the conductive layer 150, respectively. Oxidation of the conductive layers 140 and 150 can be suppressed by the insulating layers 145 and 155.

A material with a property of blocking oxygen can be used for the insulating layers 145 and 155. For example, metal oxide such as aluminum oxide can be used.

Figure 27F:
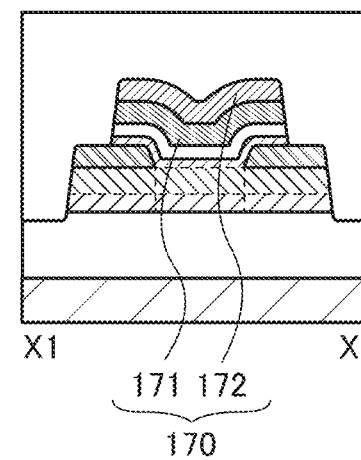

The conductive layer 170 of the transistor of one embodiment of the present invention may be a stacked layer of a conductive layer 171 and a conductive layer 172 as illustrated in FIG. 27F.

Figure 27G:
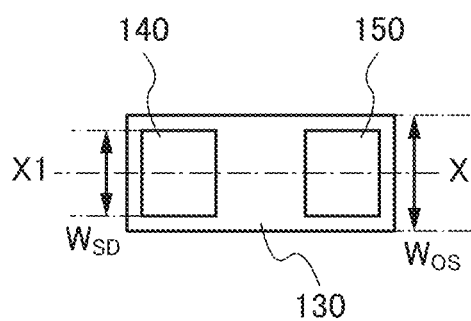
Figure 27H:
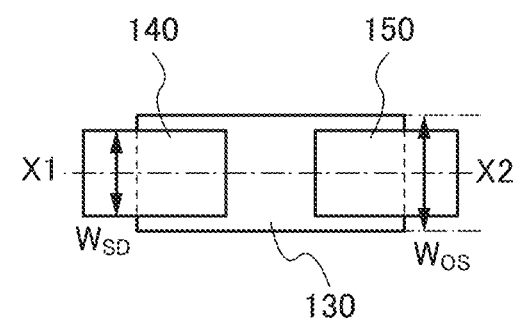

Alternatively, in the transistor of one embodiment of the present invention in which the conductive layers 140 and 150 are provided over the oxide semiconductor layer 130, the widths of the conductive layers 140 and 150 ($W_{SD}$) may be shorter than that of the oxide semiconductor layer 130 ($W_{OS}$) as illustrated in top views in FIGS. 27G and 27H where only the oxide semiconductor layer 130, the conductive layers 140 and 150 are illustrated. When $W_{OS}$ is greater than or equal to $W_{SD}$ ($W_{SD}$ is less than or equal to $W_{OS}$) is satisfied, a gate electric field is easily applied to the entire channel formation region, so that electrical characteristics of the transistor can be improved.

Note that although the examples illustrated in FIGS. 27A to 27F are variations of the transistor 101, the structures of these examples can be applied to the other transistors described in this embodiment.

In any of the structures of the transistor of one embodiment of the present invention, the conductive layer 170 and the conductive layer 173, which are gate electrode layers, electrically surround the oxide semiconductor layer 130 in the channel width direction through the insulating layer. Such a structure capable of increasing the on-state current is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 allows current to flow in the oxide semiconductor layer 130b. Since current flows to the oxide semiconductor layer 130b, the current is hardly influenced by interface scattering, leading to high on-state current.

A semiconductor device including a transistor with any of the above structures can have favorable electrical characteristics.

The structure described in this embodiment can be used in appropriate combination with the structure described in any of the other embodiments.

Embodiment 4

In this embodiment, components of the transistors described in Embodiment 3 will be described in detail.

As the substrate 115, a glass substrate, a quartz substrate, a semiconductor substrate, a ceramic substrate, a metal substrate with an insulated surface, or the like can be used. Alternatively, a silicon substrate provided with a transistor, a photodiode, or the like can be used, and an insulating layer, a wiring, a conductor functioning as a contact plug, and the like can be provided over the silicon substrate. Note that when p-channel transistors are formed using the silicon substrate, a silicon substrate with n⁻-type conductivity is preferably used. Alternatively, an SOI substrate including an n⁻-type or an i-type silicon layer may be used. In the case where a p-channel transistor is formed on the silicon substrate, it is preferable to use a silicon substrate in which a plane where the transistor is formed is a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm³ in TDS analysis. In the TDS analysis, the film surface temperature is higher than or equal to 100° C. and lower than or equal to 700° C., preferably higher than or equal to 100° C. and lower than or equal to 500° C. In the case where the substrate 115 is provided with another device, the insulating layer 120 also has a function of an interlayer insulating film. In that case, the insulating layer 120 is preferably subjected to planarization treatment such as CMP treatment so as to have a flat surface.

For the conductive layer 173 functioning as a back gate electrode layer, for example, a conductive film formed using Al, Ti, Cr, Co, Ni, Cu, Y, Zr, Mo, Ru, Ag, Mn, Nd, Sc, Ta, or W can be used. An alloy or a conductive nitride of any of these materials may also be used. A stack including a plurality of materials selected from these materials, alloys of these materials, and conductive nitrides of these materials may also be used.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

The oxide semiconductor layer 130 of the transistor can have a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which a layer corresponding to the oxide semiconductor layer 130a and a layer corresponding to the oxide semiconductor layer 130b are stacked in this order from the insulating layer 120 side is used. In such a case, the oxide semiconductor layers 130a and 130b can be replaced with each other.

For the oxide semiconductor layer 130b, for example, an oxide semiconductor whose electron affinity (an energy difference between a vacuum level and the conduction band minimum) is higher than those of the oxide semiconductor layers 130a and 130c is used.

In such a structure, when a voltage is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layer 130a and the oxide semiconductor layer 130c can be regarded as having a region serving as an insulator or a semi-insulator.

An oxide semiconductor that can be used for each of the oxide semiconductor layers 130a, 130b, and 130c preferably contains at least In or Zn. Moreover, both In and Zn are preferably contained. In order to reduce variations in electrical characteristics of the transistor including the oxide semiconductor, the oxide semiconductor preferably contains a stabilizer such as Al, Ga, Y, or Sn in addition to In and Zn.

For example, the semiconductor layers 130a and 130c can be formed using an In—Ga—Zn oxide whose atomic ratio of In to Ga and Zn is 1:3:2, 1:3:3, 1:3:4, 1:3:6, 1:4:5, 1:6:4, 1:9:6, or neighborhood thereof. In addition, the oxide semiconductor layer 130b can be formed using an In—Ga—Zn oxide whose atomic ratio of In to Ga and Zn is 1:1:1, 2:1:3, 5:5:6, 3:1:2, 3:1:4, 5:1:6, 4:2:3, or neighborhood thereof.

The oxide semiconductor layers 130a to 130c may include crystal parts. For example, a transistor including an oxide semiconductor layer having a c-axis aligned crystal can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys or conductive nitrides of any of these metal materials can be used. Note that using tantalum nitride which is conductive nitride can prevent oxidation. It is also possible to use a stack of any of the above materials and Cu or an alloy such as Cu—Mn, which has low resistance.

The above materials are capable of extracting oxygen from an oxide semiconductor film. Therefore, in a region of the oxide semiconductor film that is in contact with any of the above materials, oxygen is released from the oxide semiconductor film and an oxygen vacancy is formed. Hydrogen slightly contained in the layer and the oxygen vacancy are bonded to each other, whereby the region is markedly changed to an n-type region. Accordingly, the n-type regions can serve as a source or a drain region of the transistor.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide becomes high in some cases.

By using the above oxide insulating film for the insulating layer 120 and the insulating layer 160, a shift in the threshold voltage of the transistor can be reduced, which leads to reduce a variation in the electrical characteristics of the transistor.

For the conductive layer 170 functioning as a back gate electrode layer, for example, a conductive film formed using Al, Ti, Cr, Co, Ni, Cu, Y, Zr, Mo, Ru, Ag, Mn, Nd, Sc, Ta, or W can be used. An alloy or a conductive nitride of any of these materials may also be used. A stack including a plurality of materials selected from these materials, alloys of these materials, and conductive nitrides of these materials may also be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. For example, titanium nitride is used for the conductive layer 171 and tungsten is used for the conductive layer 172 to form the conductive layer 170.

As the conductive layer 170, an oxide conductive layer of an In—Ga—Zn oxide, zinc oxide, indium oxide, tin oxide, indium tin oxide, or the like may be used. When the oxide conductive layer is provided so as to be in contact with the insulating layer 160, oxygen can be supplied to the oxide semiconductor layer 130 from the oxide conductive layer.

The insulating layer 180 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer may be a stack including any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

In addition, a film with a property of blocking impurities is preferably provided over the transistor or the insulating layer 180. The blocking film can be formed of a silicon nitride film, an aluminum nitride film, an aluminum oxide film, or the like.

A nitride insulating film has a function of blocking moisture and the like and can improve the reliability of the transistor. Moreover, the aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120.

High integration of a semiconductor device requires miniaturization of a transistor. However, miniaturization of a transistor tends to cause deterioration of electrical characteristics of the transistor. For example, a decrease in channel width causes a reduction in on-state current.

In the transistor of one embodiment of the present invention, the oxide semiconductor layer 130b where a channel is formed can be covered with the oxide semiconductor layer 130c. Since the channel formation layer and the gate insulating film are not in contact with each other in this structure, scattering of carriers at the interface between the channel formation layer and the gate insulating film can be reduced and the on-state current of the transistor can be increased.

In the transistor of one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and effective channel width is increased, leading to a further increase in the on-state current.

Although the variety of films such as the metal films, the semiconductor films, and the inorganic insulating films that are described in this embodiment typically can be formed by sputtering or plasma CVD, such films may be formed by another method such as thermal CVD. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of the gas introduction is controlled and repeated plural times until a desired thickness is obtained, whereby a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

In addition, a facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), or water) in a deposited oxide semiconductor layer can be lowered.

The structure described in this embodiment can be used in appropriate combination with the structure described in any of the other embodiments.

Embodiment 5

In this embodiment, the material of an oxide semiconductor that can be used for one embodiment of the present invention will be described.

An oxide semiconductor preferably contains at least indium or zinc. In particular, indium and zinc are preferably contained. In addition, aluminum, gallium, yttrium, tin, or the like is preferably contained as an element M. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained as an element M.

Here, the case where an oxide semiconductor contains indium, an element M, and zinc will be considered.

First, preferred ranges of the atomic ratio of indium, the element M, and zinc contained in an oxide semiconductor according to the present invention will be described with reference to FIGS. 28A, 28B, and 28C. Note that the proportion of oxygen atoms is not shown. The terms of the atomic ratio of indium, the element M, and zinc contained in the oxide semiconductor are denoted by [In], [M], and [Zn], respectively.

Figure 28A:
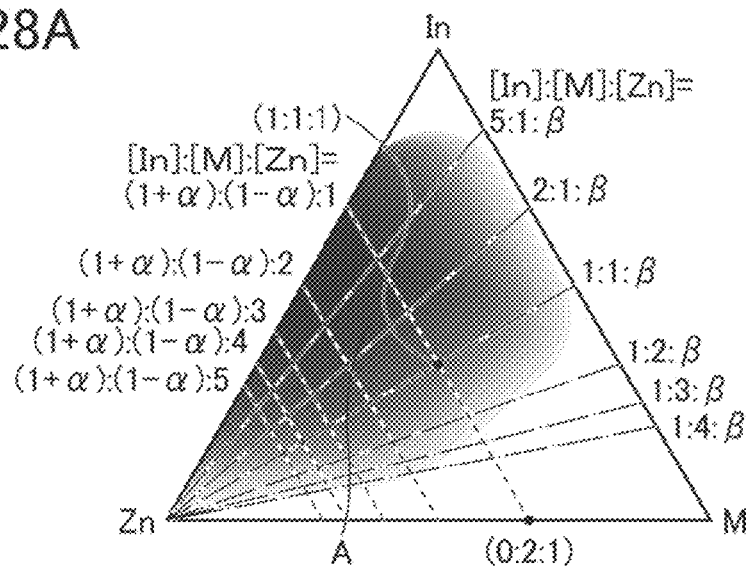
FIGS. 28A to 28C each show the range of the atomic ratio of an oxide semiconductor.
Figure 28B:
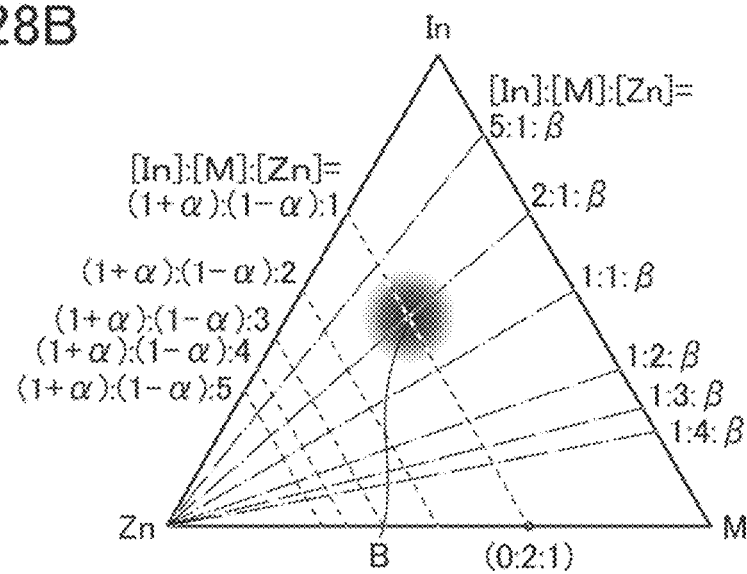
Figure 28C:
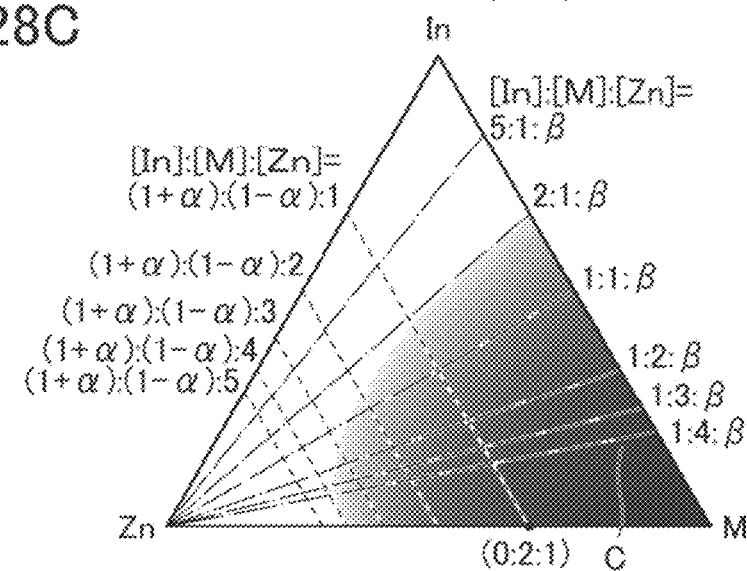

In FIGS. 28A to 28C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:

[M]:[Zn] is 1:4:$\beta$, a line where the atomic ratio [In]:[M]:[Zn] is 2:1:$\beta$, and a line where the atomic ratio [In]:[M]:[Zn] is 5:1:$\beta$.

The oxide semiconductor illustrated in FIGS. 28A, 28B, and 28C with an atomic ratio of [In]:[M]:[Zn]=0:2:1 or an atomic ratio which is in the neighborhood is likely to have a spinel crystal structure.

FIGS. 28A and 28B show examples of the preferred ranges of the atomic ratio of indium, the element M, and zinc contained in an oxide semiconductor of one embodiment of the present invention.

Figure 29:
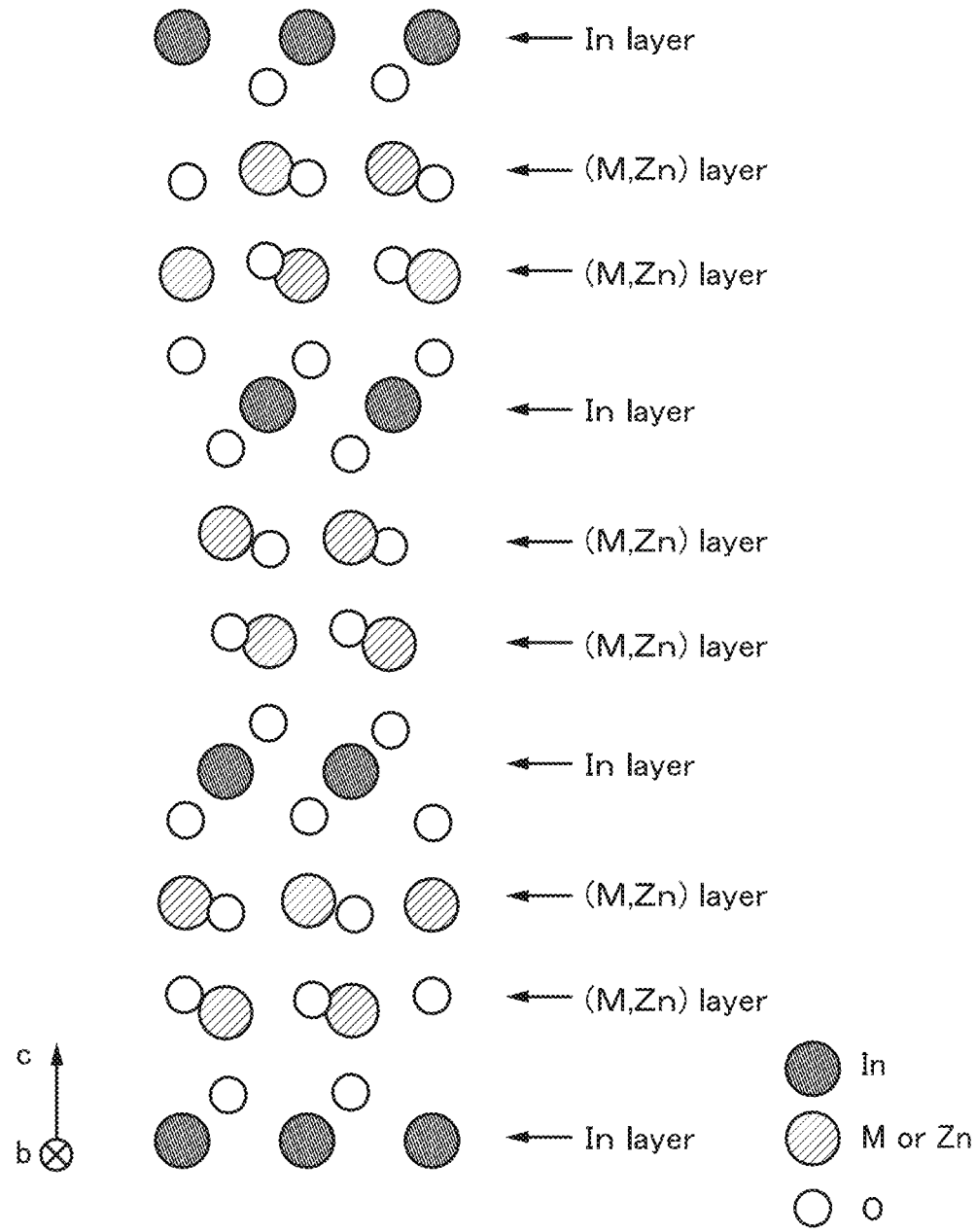
FIG. 29 illustrates a crystal structure of $InMZnO_4$.

FIG. 29 shows an example of the crystal structure of InMZnO$_4$ whose atomic ratio [In]:[M]:[Zn] is 1:1:1. Note that FIG. 29 illustrates the crystal structure of InMZnO$_4$ observed from a direction parallel to a b-axis. Note that a metal element in a layer that contains M, Zn, and oxygen (hereinafter, referred to as an "(M,Zn) layer") in FIG. 29 represents the element M or zinc. In that case, the proportion of the element M is the same as the proportion of zinc. The element M and zinc can be replaced with each other, and their arrangement is random.

InMZnO$_4$ has a layered crystal structure (also referred to as a layered structure) and includes one layer that contains indium and oxygen (hereinafter, referred to as an In layer) for every two (M,Zn) layers that contain the element M, zinc, and oxygen, as illustrated in FIG. 29.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide semiconductor whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have plural kinds of layered structures where the number of (M,Zn) layers with respect to one In layer is an integer. For example, in the case of [In]:[M]:[Zn]=1:1:1.5, the oxide semiconductor might have the following layered structures: a layered structure of one In layer for every two (M,Zn) layers and a layered structure of one In layer for every three (M,Zn) layers.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; therefore, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 28C), insulation performance becomes better.

Accordingly, an oxide semiconductor of one embodiment of the present invention preferably has an atomic ratio represented by a region A in FIG. 28A. With the atomic ratio, a layered structure with high carrier mobility and a few grain boundaries is easily obtained.

A region B in FIG. 28B represents an atomic ratio of [In]:[M]:[Zn]=4:2:3 to 4.1 and the vicinity thereof. The vicinity includes an atomic ratio of [In]:[M]:[Zn]=5:3:4. An oxide semiconductor with an atomic ratio represented by the region B is an excellent oxide semiconductor that has particularly high crystallinity and high carrier mobility.

Note that conditions where a layered structure of an oxide semiconductor is formed are not uniquely determined by the atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8\times10^{11}/cm^3$, preferably lower than $1\times10^{11}/cm^3$, more preferably lower than $1\times10^{10}/cm^3$, and greater than or equal to $1\times10^{-9}/cm^3$ is used.

A highly purified intrinsic or substantially highly purified intrinsic oxide semiconductor has few carrier generation sources and thus can have a low carrier density. A highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, the transistor whose channel region is formed in the oxide semiconductor having a high density of trap states has unstable electrical characteristics in some cases.

In order to obtain stable electrical characteristics of the transistor, it is effective to reduce the concentration of impurities in the oxide semiconductor. In order to reduce the concentration of impurities in the oxide semiconductor, the concentration of impurities in a film which is adjacent to the oxide semiconductor is preferably reduced. As examples of the impurities, hydrogen, nitrogen, alkali metal, alkaline earth metal, iron, nickel, silicon, and the like are given.

Here, the influence of impurities in the oxide semiconductor will be described.

When silicon or carbon that is one of Group 14 elements is contained in the oxide semiconductor, defect states are formed. Thus, the oxide semiconductor is formed to have a region where the concentration of silicon or carbon (measured by secondary ion mass spectrometry (SIMS)) is controlled to be lower than or equal to $2\times10^{18}$ atoms/cm$^3$, preferably lower than or equal to $2\times10^{17}$ atoms/cm$^3$ in the oxide semiconductor or the vicinity of an interface between the oxide semiconductor and a layer in contact therewith.

When the oxide semiconductor contains alkali metal or alkaline earth metal, defect states are formed and carriers are generated, in some cases. Thus, a transistor including an oxide semiconductor which contains alkali metal or alkaline earth metal is likely to be normally on. Therefore, it is preferable to reduce the concentration of alkali metal or alkaline earth metal of the oxide semiconductor. Specifically, the oxide semiconductor is formed to have a region where the concentration of alkali metal or alkaline earth metal measured by SIMS is controlled to be lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the oxide semiconductor is formed to have a region where the concentration of nitrogen measured by SIMS is controlled to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still more preferably lower than or equal to $5\times10^{17}$ atoms/cm$^3$, specifically.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on. Accordingly, it is preferable that hydrogen in the oxide semiconductor be reduced as much as possible. Specifically, the oxide semiconductor is formed to have a region where the concentration of hydrogen measured by SIMS is controlled to be lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity concentration is used for a channel formation region in a transistor, the transistor can have stable electrical characteristics. A transistor in which the above highly purified oxide semiconductor is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

Next, the case where the oxide semiconductor has a two-layer structure or a three-layer structure will be described. A band diagram of a stacked structure of an oxide semiconductor S1, an oxide semiconductor S2, and an oxide semiconductor S3 and insulators that are in contact with the stacked structure and a band diagram of a stacked structure of the oxide semiconductor S2 and the oxide semiconductor S3 and insulators that are in contact with the stacked structure are described with reference to FIGS. 30A and 30B. Note that the oxide semiconductor S1, the oxide semiconductor S2, and the oxide semiconductor S3 correspond to the oxide semiconductor layer 130a, the oxide semiconductor layer 130b, and the oxide semiconductor layer 130c, respectively.

Figure 30A:
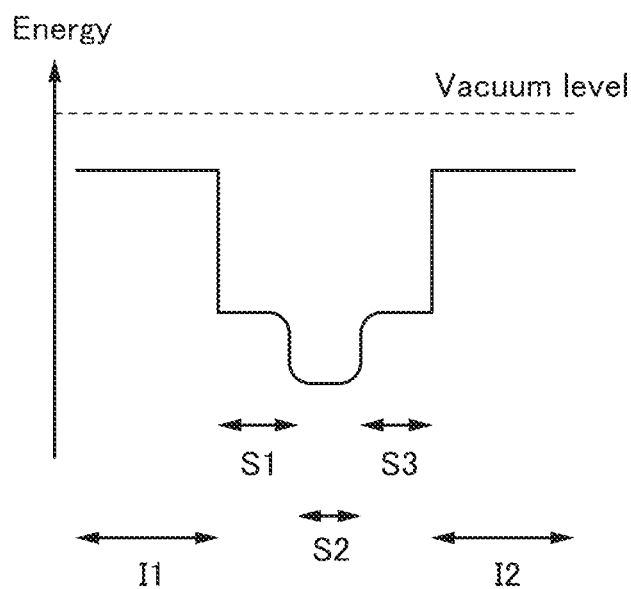
FIGS. 30A and 30B are band diagrams of stacked structures of oxide semiconductors.
Figure 30B:
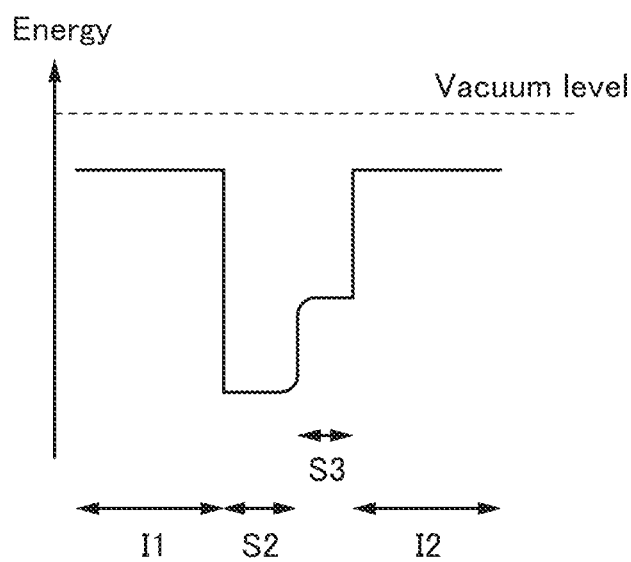

FIG. 30A is an example of a band diagram of a stacked structure of an insulator I1, the oxide semiconductor S1, the oxide semiconductor S2, the oxide semiconductor S3, and an insulator I2 in a film thickness direction. FIG. 30B is an example of a band diagram of a stacked structure of the insulator I1, the oxide semiconductor S2, the oxide semiconductor S3, and the insulator I2 in a film thickness direction. Note that for easy understanding, the band diagrams show the energy level of the conduction band minimum (Ec) of each of the insulator I1, the oxide semiconductor S1, the oxide semiconductor S2, the oxide semiconductor S3, and the insulator I2.

The energy level of the conduction band minimum of each of the oxide semiconductors S1 and S3 is closer to the vacuum level than that of the oxide semiconductor S2. Typically, a difference in energy level between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, it is preferable that the electron affinity of the oxide semiconductor S2 be higher than the electron affinity of each of the oxide semiconductors S1 and S3, and the difference between the electron affinity of each of the oxide semiconductors S1 and S3 and the electron affinity of the oxide semiconductor S2 be greater than or equal to 0.15 eV or greater than or equal to 0.5 eV, and less than or equal to 2 eV or less than or equal to 1 eV.

As illustrated in FIGS. 30A and 30B, the conduction band minimum of each of the oxide semiconductors S1 to S3 is gradually varied. In other words, the energy level of the conduction band minimum is continuously varied or continuously connected. In order to obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 28C can be used as the oxide semiconductors S1 and S3.

In the case where an oxide semiconductor with the atomic ratio represented by the region A is used as the oxide semiconductor S2, it is particularly preferable to use an oxide semiconductor with an atomic ratio where [M]/[In] is greater than or equal to 1, preferably greater than or equal to 2 as each of the oxide semiconductors S1 and S3. In addition, it is suitable to use an oxide semiconductor with sufficiently high insulation performance and an atomic ratio where [M]/([Zn]+[In]) is greater than or equal to 1 as the oxide semiconductor S3.

The structure described in this embodiment can be used in appropriate combination with the structure described in any of the other embodiments.

Embodiment 6

The structure of an oxide semiconductor that can be used for one embodiment of the present invention will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle formed between two straight lines is greater than or equal to 85° and less than or equal to 95°.

In this specification, trigonal and rhombohedral crystal systems are included in a hexagonal crystal system.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 31A:
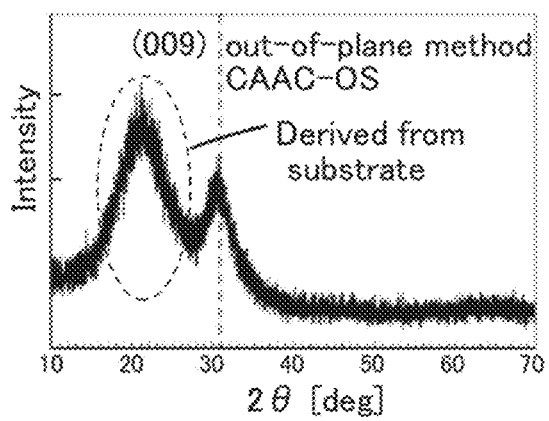
FIGS. 31A to 31E show structural analysis of a CAAC-OS and a single crystal oxide semiconductor by XRD and selected-area electron diffraction patterns of a CAAC-OS.

Analysis of a CAAC-OS by X-ray diffraction (XRD) will be described. For example, when the structure of a CAAC-OS including an $InGaZnO_4$ crystal that is classified into the space group R-3m is analyzed by an out-of-plane method, a peak appears at a diffraction angle (2θ) of around 31° as illustrated in FIG. 31A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

Figure 31B:
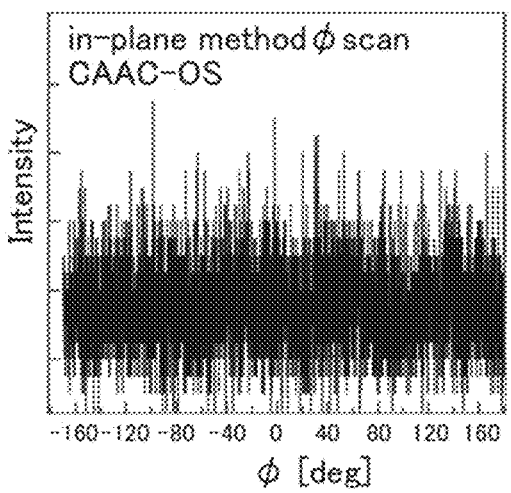
Figure 31C:
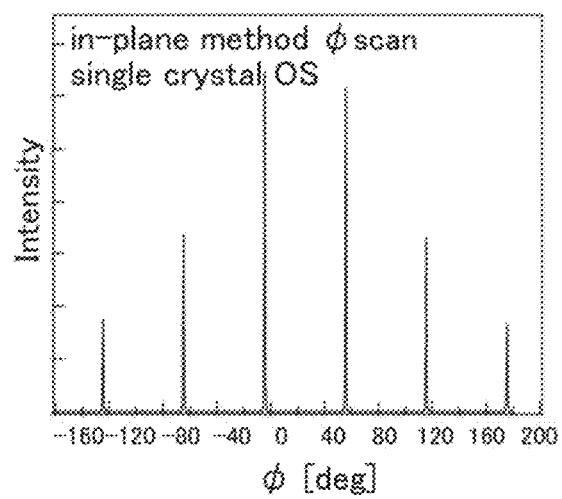

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (ϕ scan) is performed with 2θ fixed at around 56° and with the sample rotated using a normal vector to the sample surface as an axis (ϕ axis), as illustrated in FIG. 31B, a peak is not clearly observed. In contrast, in the case where single crystal $InGaZnO_4$ is subjected to ϕ scan with 2θ fixed at around 56°, as illustrated in FIG. 31C, six peaks which are derived from crystal planes equivalent to the (110) plane are observed. Accordingly, the structural analysis using XRD shows that the directions of a-axes and b-axes are irregularly oriented in the CAAC-OS.

Figure 31D:
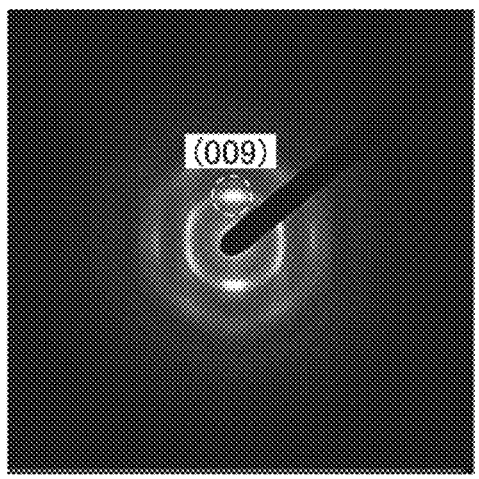
Figure 31E:
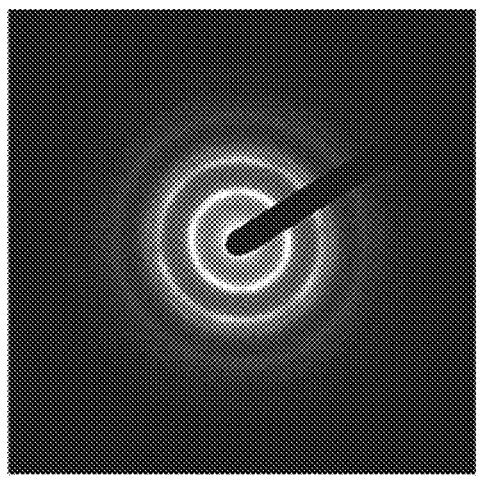

Next, a CAAC-OS analyzed by electron diffraction will be described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) illustrated in FIG. 31D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 31E shows a diffraction pattern obtained in such a manner that an electron beam with a probe diameter of 300 nm is incident on the same sample in a direction perpendicular to the sample surface. As illustrated in FIG. 31E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 31E is considered to be derived from the (010) plane, the (100) plane, and the like of the InGaZnO$_4$ crystal. The second ring in FIG. 31E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

Figure 32A:
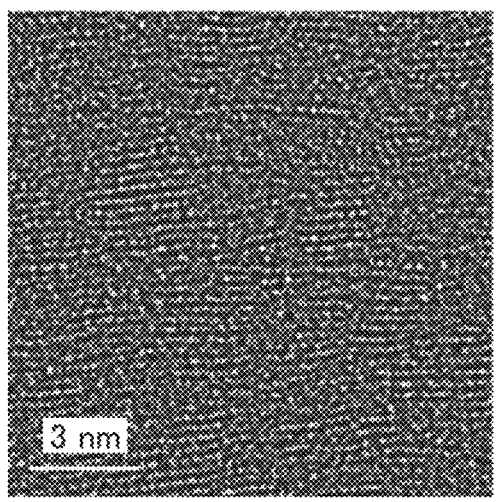
FIGS. 32A to 32E are a cross-sectional TEM image and plan-view TEM images of a CAAC-OS and images obtained through analysis thereof.

FIG. 32A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 32A shows pellets in which metal atoms are arranged in a layered manner. FIG. 32A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 32B:
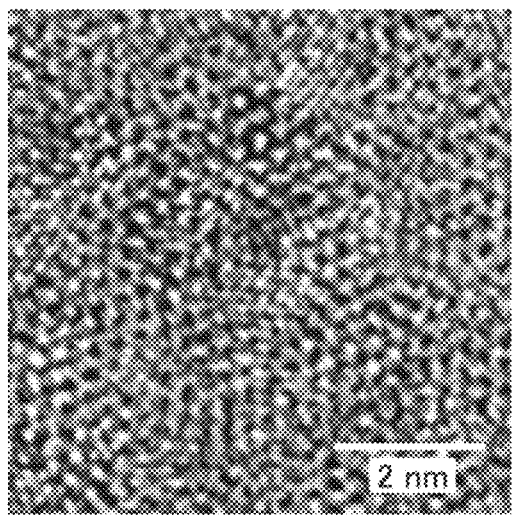
Figure 32C:
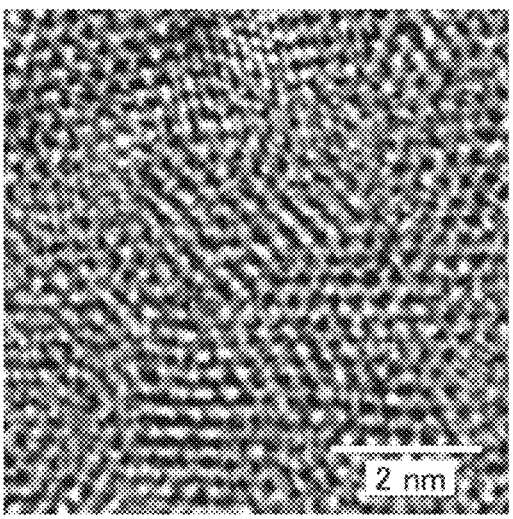
Figure 32D:
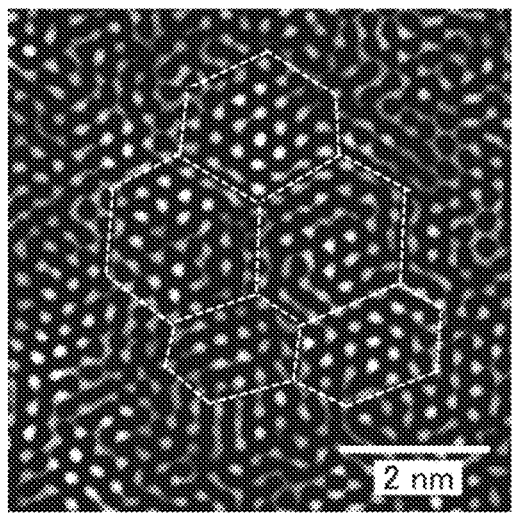
Figure 32E:
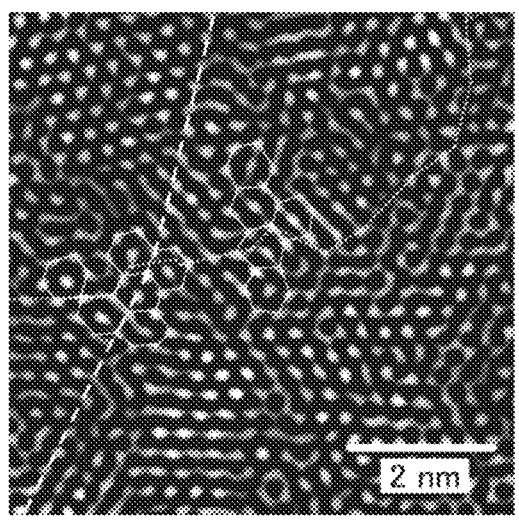

FIGS. 32B and 32C show Cs-corrected high-resolution TEM images of a plane of the CAAC-OS observed from a direction substantially perpendicular to the sample surface. FIGS. 32D and 32E are images obtained through image processing of FIGS. 32B and 32C. The method of image processing is as follows. The image in FIG. 32B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 32D, a portion where a lattice arrangement is broken is shown by a dashed lines. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 32E, a dotted line denotes a boundary between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of arrangement of oxygen atoms in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 33A:
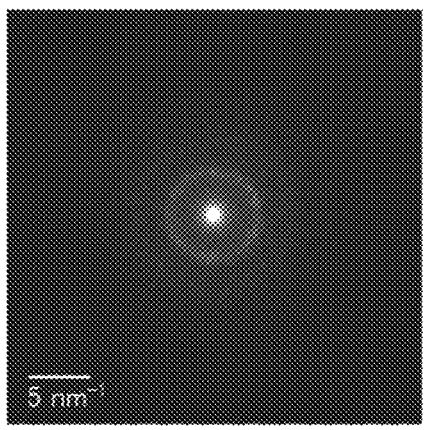
FIGS. 33A to 33D show electron diffraction patterns and a cross-sectional TEM image of an nc-OS.
Figure 33B:
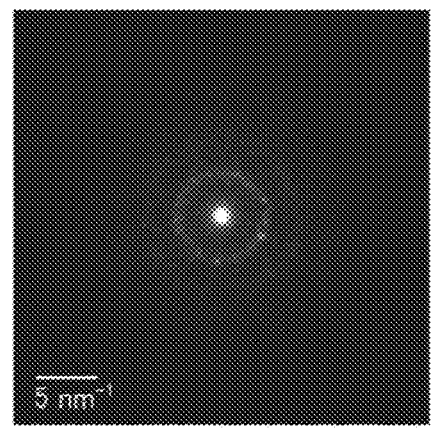

For example, when an electron beam with a probe diameter of 50 nm is incident on a 34-nm-thick region of a thinned nc-OS including an InGaZnO$_4$ crystal in a direction parallel to the formation surface, a ring-shaped diffraction pattern (nanobeam electron diffraction pattern) illustrated in FIG. 33A is observed. FIG. 33B shows a diffraction pattern obtained when an electron beam with a probe diameter of 1 nm is incident on the same sample. As illustrated in FIG. 33B, a plurality of spots are observed in a ring-like region. In other words, ordering in an nc-OS is not observed with an electron beam with a probe diameter of 50 nm but is observed with an electron beam with a probe diameter of 1 nm.

Figure 33C:
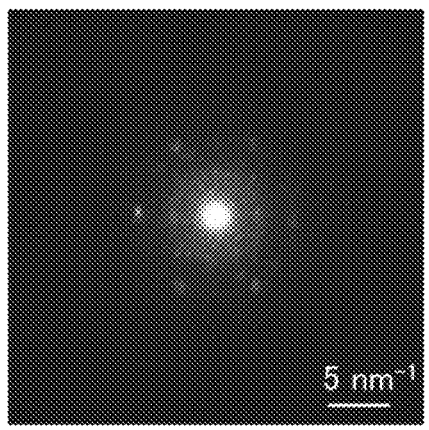

Furthermore, an electron diffraction pattern in which spots are arranged in an approximately regular hexagonal shape is observed in some cases as illustrated in FIG. 33C when an electron beam with a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 33D:
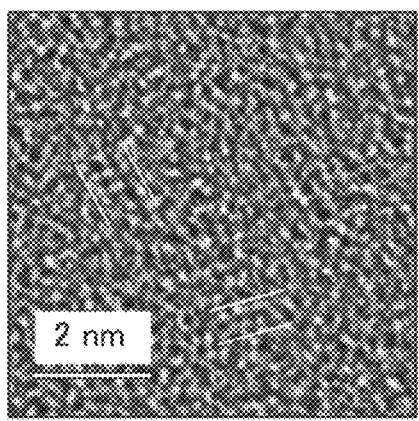

FIG. 33D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary cannot be clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS is an oxide semiconductor having a structure intermediate between those of the nc-OS and the amorphous oxide semiconductor.

FIGS. 34A and 34B are high-resolution cross-sectional TEM images of an a-like OS. FIG. 34A is the high-resolution cross-sectional TEM image of the a-like OS at the start of electron irradiation. FIG. 34B is the high-resolution cross-sectional TEM image of a-like OS after electron (e⁻) irradiation at $4.3 \times 10^8$ e⁻/nm². FIGS. 34A and 34B show that stripe-like bright regions extending vertically are observed in the a-like OS from the start of electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO₄ crystal has a structure in which nine layers including three In—O layers and six Ga—Zn—O layers are stacked in the c-axis direction. The spacing between these adjacent layers is equivalent to the lattice spacing on the (009) plane (also referred to as d value). The value is calculated to 0.29 nm from crystal structure analysis. Accordingly, a portion where the spacing between lattice fringes is greater than or equal to 0.28 nm and less than or equal to 0.30 nm is regarded as a crystal part of InGaZnO₄ in the following description. Each of lattice fringes corresponds to the a-b plane of the InGaZnO₄ crystal.

Figure 35:
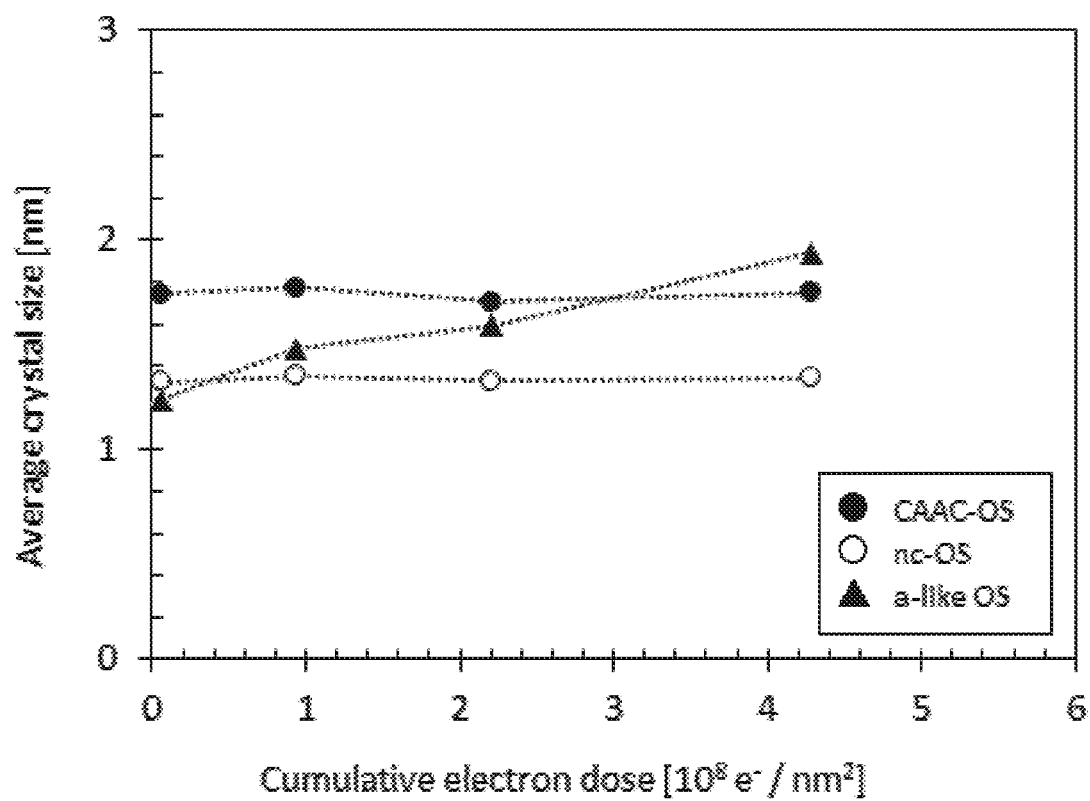
FIG. 35 shows a change in crystal part of an In—Ga—Zn oxide induced by electron irradiation.

FIG. 35 shows a change in the average size of crystal parts (at 22 to 30 points) in each sample. Note that the crystal part size corresponds to the length of a lattice fringe. FIGS. 34A and 34B indicate that the crystal part size in the a-like OS increases with an increase in the cumulative electron dose in obtaining TEM images, for example. As illustrated in FIGS. 34A and 34B, a crystal part of approximately 1.2 nm (also referred to as an initial nucleus) at the start of TEM observation grows to a size of approximately 1.9 nm at a cumulative electron (e⁻) dose of $4.2 \times 10^8$ e⁻/nm². In contrast, the crystal part size in the nc-OS and the CAAC-OS shows little change from the start of electron irradiation to a cumulative electron dose of $4.2 \times 10^8$ e⁻/nm². As illustrated in FIGS. 34A and 34B, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e⁻/(nm²·s); and the diameter of the irradiation region was 230 nm.

In this manner, growth of the crystal part in the a-like OS is induced by electron irradiation in some cases. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor having an atomic ratio of In:Ga:Zn=1:1:1, the density of single crystal InGaZnO₄ with a rhombohedral crystal structure is 6.357 g/cm³. Accordingly, in the case of the oxide semiconductor having an atomic ratio of In:Ga:Zn=1:1:1, the density of the a-like OS is higher than or equal to 5.0 g/cm³ and lower than 5.9 g/cm³. For example, in the case of the oxide semiconductor having an atomic ratio of In:Ga:Zn=1:1:1, the density of each of the nc-OS and the CAAC-OS is higher than or equal to 5.9 g/cm³ and lower than 6.3 g/cm³.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

Here, a transistor using the oxide semiconductor in a channel region will be considered.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm$^{-3}$, preferably lower than $1 \times 10^{11}$ cm$^{-3}$, and further preferably lower than $1 \times 10^{10}$ cm$^{-3}$ and is higher than or equal to $1 \times 10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

The structure described in this embodiment can be used in appropriate combination with the structure described in any of the other embodiments.

Embodiment 7

In this embodiment, examples of a package and a camera module each including an image sensor chip are described. For the image sensor chip, the structure of an imaging element of one embodiment of the present invention can be used.

Figure 36A:
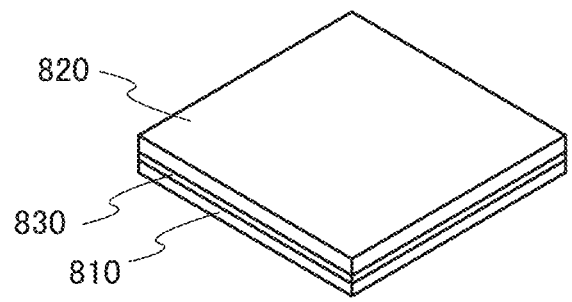
FIGS. 36A to 36D are perspective views and a cross-sectional view of a package including an imaging element.

FIG. 36A is an external perspective view showing the top surface side of a package including an image sensor chip. The package includes a package substrate 810, a cover glass 820, an adhesive 830 for bonding the package substrate 810 and the cover glass 820 to each other, and the like.

Figure 36B:
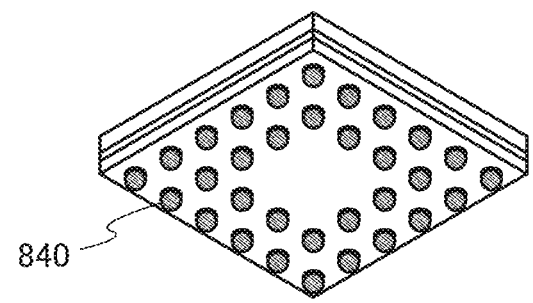

FIG. 36B is an external perspective view showing the bottom surface side of the package. On the bottom surface of the package, a ball grid array (BGA) including solder balls as bumps 840 is formed. Although the BGA is employed here, a land grid array (LGA), a pin grid array (PGA), or the like may be alternatively employed.

Figure 36C:
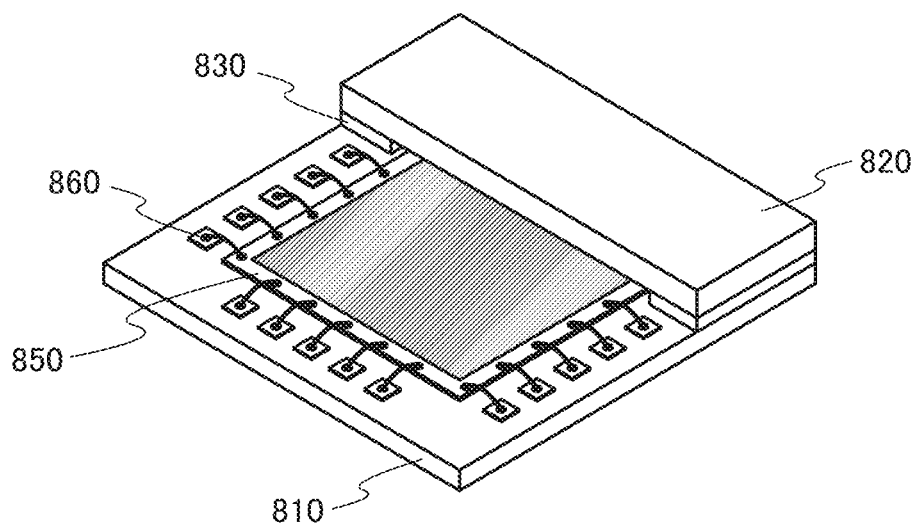
Figure 36D:
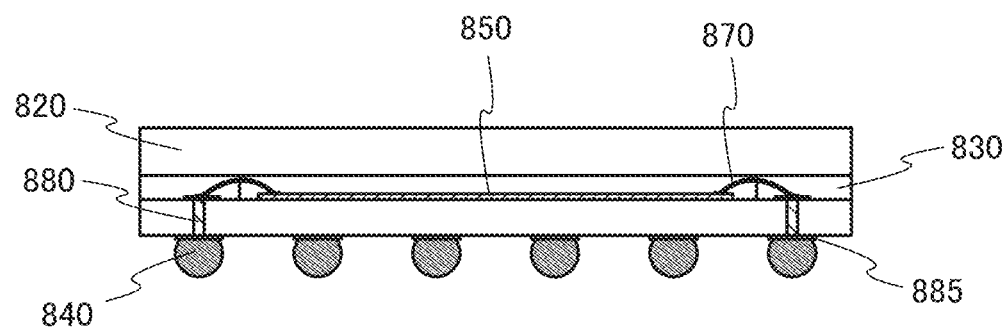

FIG. 36C is a perspective view of the package, in which the cover glass 820 and the adhesive 830 are partly illustrated. FIG. 36D is a cross-sectional view of the package. An image sensor chip 850 and electrode pads 860 are formed over the package substrate 810, and the electrode pads 860 are electrically connected to the bumps 840 through through-holes 880 and lands 885. Moreover, the electrode pads 860 are electrically connected to electrodes of the image sensor chip 850 through wires 870.

Figure 37A:
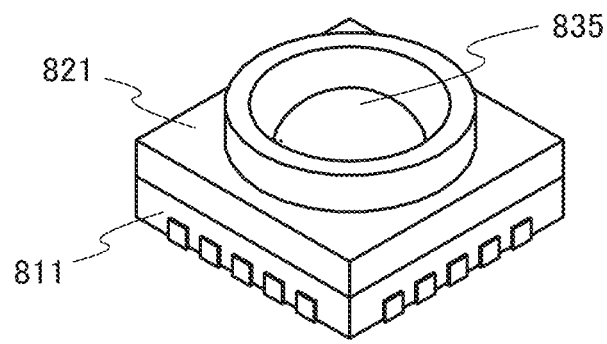
FIGS. 37A to 37D are perspective views and a cross-sectional view of a package including an imaging element.

FIG. 37A is an external perspective view showing the top surface side of a camera module in which an image sensor chip is mounted on a package with a built-in lens. The camera module includes a package substrate 811, a lens cover 821, a lens 835, and the like.

Figure 37B:
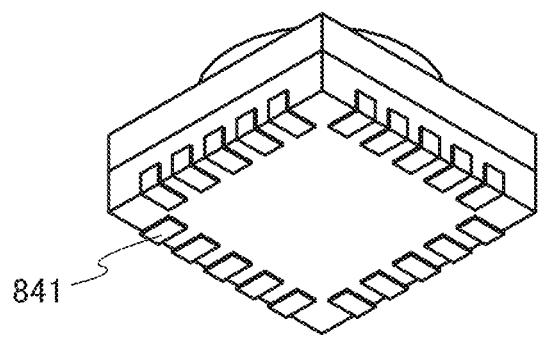

FIG. 37B is an external perspective view showing the bottom surface side of the camera module. On the bottom surface and four side surfaces of the package substrate 811, mounting lands 841 are provided; this structure can be called a quad flat no-lead package (QFN). Although QFN is employed here, a quad flat package (QFP), the above BGA, or the like may be alternatively employed.

Figure 37C:
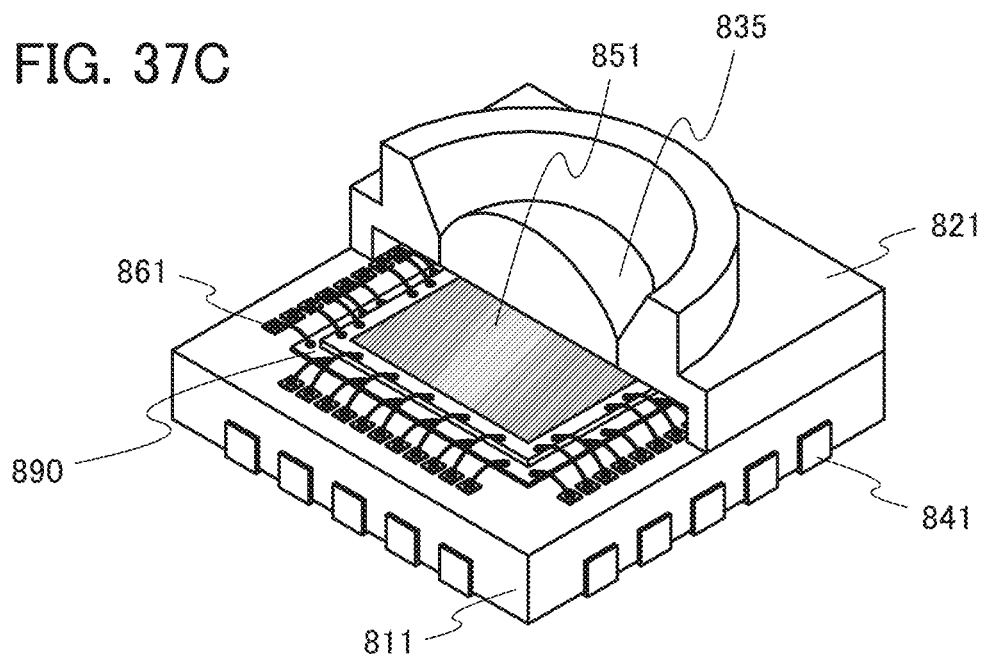
Figure 37D:
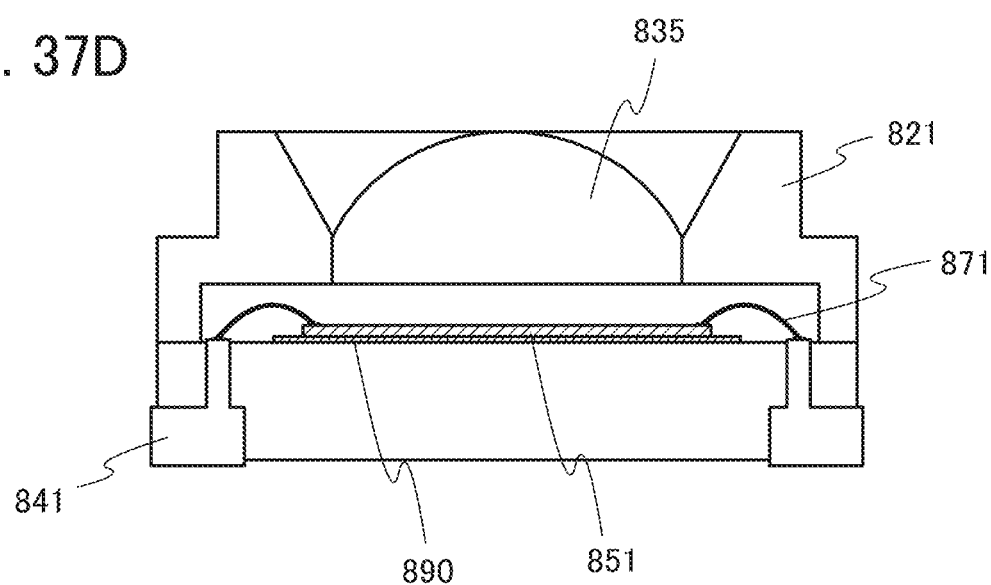

FIG. 37C is a perspective view of the module, in which the lens cover 821 and the lens 835 are partly illustrated. FIG. 37D is a cross-sectional view of the camera module. An image sensor chip 851 is fixed to a top surface of the package substrate 811. Furthermore, an IC chip 890 having functions of a driver circuit, a signal conversion circuit, and the like of an imaging device is provided between the package substrate 811 and the image sensor chip 851. Thus, a system in package (SiP) is formed. Moreover, the lands 841 are partly used as electrode pads 861. The electrode pads 861 are electrically connected to electrodes of the image sensor chip 851 and the IC chip 890 through wires 871.

The image sensor chip can be easily mounted on the package having the above structure, and can be incorporated into a variety of electronic devices.

The structures described in this embodiment can be used in appropriate combination with any of the structures described in the other embodiments.

This application is based on Japanese Patent Application serial no. 2016-034259 filed with Japan Patent Office on Feb. 25, 2016, the entire contents of which are hereby incorporated by reference.

What is claimed is:
1. An imaging system comprising:
an imaging element comprising a pixel; and
a light source configured to emit ultraviolet light to an object, wherein the pixel comprises a photoelectric conversion element and a charge holding part, wherein the photoelectric conversion element is configured to change a potential of the charge holding part when the photoelectric conversion element is irradiated with the ultraviolet light reflected or transmitted by the object, wherein the photoelectric conversion element is configured to retain the potential of the charge holding part when the photoelectric conversion element is not irradiated with the ultraviolet light, wherein the pixel comprises a first transistor, a second transistor, a third transistor, and a fourth transistor, wherein the photoelectric conversion element comprises the first transistor, wherein one of a source and a drain of the first transistor is electrically connected to one of a source and a drain of the second transistor and a gate of the third transistor, and wherein one of a source and a drain of the third transistor is electrically connected to one of a source and a drain of the fourth transistor.

2. The imaging system according to claim 1,
wherein the first to fourth transistors each comprise an oxide semiconductor, and
wherein the oxide semiconductor comprises In, Zn, and one of Al, Ga, Y, and Sn.

3. The imaging system according to claim 1, further comprising:
an optical system configured to form an image of the object on a light-receiving portion of the imaging element;
a first circuit configured to control the imaging element and the light source; and
a second circuit electrically connected to the imaging element, the second circuit including an A/D converter,
wherein the second circuit is provided apart from the imaging element.

4. A manufacturing apparatus comprising:
the imaging system according to claim 1;
a stage movable in an X-axis direction, a Y-axis direction, and a θ-axis direction; and
a thermocompression head movable in a Z-axis direction.

5. The manufacturing apparatus according to claim 4,
wherein the imaging element and the light source are stored in a housing, and
wherein the housing is fixed to the thermocompression head.

6. The manufacturing apparatus according to claim 4,
wherein the imaging element is stored in a housing,
wherein the light source is stored in the stage, and
wherein the housing is fixed to the thermocompression head.

7. An imaging system comprising:
an imaging element comprising a pixel; and
a light source configured to emit first ultraviolet light to an object,
wherein the pixel comprises a first transistor, a second transistor, a third transistor, and a fourth transistor,
wherein one of a source and a drain of the first transistor, one of a source and a drain of the second transistor, and a gate of the third transistor are electrically connected to a node,
wherein one of a source and a drain of the third transistor is electrically connected to one of a source and a drain of the fourth transistor,
wherein the first transistor is configured to change a potential of the node when the first transistor is irradiated with second ultraviolet light reflected or transmitted by the object, and
wherein the first transistor is configured to retain the potential of the node when the first transistor is not irradiated with the second ultraviolet light.

8. The imaging system according to claim 7, wherein the other of the source and the drain of the fourth transistor is electrically connected to a wiring.

9. The imaging system according to claim 7,
wherein the first to fourth transistors each comprise an oxide semiconductor, and
wherein the oxide semiconductor comprises In, Zn, and one of Al, Ga, Y, and Sn.

10. The imaging system according to claim 7, further comprising:
an optical system configured to form an image of the object on a light-receiving portion of the imaging element;
a first circuit configured to control the imaging element and the light source; and
a second circuit electrically connected to the imaging element, the second circuit including an A/D converter,
wherein the second circuit is provided apart from the imaging element.

11. A manufacturing apparatus comprising:
the imaging system according to claim 7;
a stage movable in an X-axis direction, a Y-axis direction, and a θ-axis direction; and
a thermocompression head movable in a Z-axis direction.

12. The manufacturing apparatus according to claim 11,
wherein the imaging element and the light source are stored in a housing, and
wherein the housing is fixed to the thermocompression head.

13. The manufacturing apparatus according to claim 11,
wherein the imaging element is stored in a housing,
wherein the light source is stored in the stage, and
wherein the housing is fixed to the thermocompression head.

* * * * *